United States Patent
Best et al.

(10) Patent No.: US 8,499,270 B1
(45) Date of Patent: *Jul. 30, 2013

(54) CONFIGURATION OF PROGRAMMABLE IC DESIGN ELEMENTS

(75) Inventors: Andrew Best, Stanford, CA (US); Kenneth Ogami, Bothell, WA (US); Marat Zhaksilikov, Snohomish, WA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/171,061

(22) Filed: Jun. 28, 2011

Related U.S. Application Data

(63) Continuation of application No. 12/058,569, filed on Mar. 28, 2008, now Pat. No. 8,065,653, which is a continuation-in-part of application No. 12/004,833, filed on Dec. 21, 2007, now Pat. No. 8,266,675.

(60) Provisional application No. 60/926,096, filed on Apr. 25, 2007.

(51) Int. Cl.
*G06F 17/50* (2006.01)

(52) U.S. Cl.
USPC ............ 716/117; 716/116; 716/128; 716/139

(58) Field of Classification Search
USPC .................................. 716/116, 117, 128, 139
See application file for complete search history.

(56) References Cited

U.S. PATENT DOCUMENTS

| | | |
|---|---|---|
| 3,600,690 A | 8/1971 | Graham |
| 3,725,804 A | 4/1973 | Langan |
| 3,740,588 A | 6/1973 | Stratton et al. |
| 3,810,036 A | 5/1974 | Bloedom |
| 3,831,113 A | 8/1974 | Ahmed |
| 3,845,328 A | 10/1974 | Hollingsworth |
| 3,940,760 A | 2/1976 | Brokaw |
| 4,061,987 A | 12/1977 | Nagahama |
| 4,134,073 A | 1/1979 | MacGregor |
| 4,138,671 A | 2/1979 | Comer et al. |

(Continued)

FOREIGN PATENT DOCUMENTS

| | | |
|---|---|---|
| DE | 19710829 A1 | 9/1998 |
| EP | 0308583 A | 3/1989 |

(Continued)

OTHER PUBLICATIONS

USPTO U.S. Appl. No. 10/001,477: "Breakpoint Control in an In-Circuit Emulation System," Roe et al., filed Nov. 1, 2001; 43 pages.

(Continued)

*Primary Examiner* — Sun Lin

(57) ABSTRACT

A system and method are provided for configuring a programmable integrated circuit including a number of function blocks. In one embodiment, the system includes a programmable integrated circuit including a number of function blocks, and a host computing device to configure the number of function blocks to perform a number of functions. The host computing device utilizes a graphical user interface to provide specification of configuration parameters of the function blocks, and the graphical user interface updates a given configuration parameter if a value of the given configuration parameter is affected by a value specified for another configuration parameter. Other embodiments are also provided.

20 Claims, 4 Drawing Sheets

U.S. PATENT DOCUMENTS

| | | |
|---|---|---|
| 4,176,258 A | 11/1979 | Jackson |
| 4,250,464 A | 2/1981 | Schade, Jr. |
| 4,272,760 A | 6/1981 | Prazak et al. |
| 4,283,713 A | 8/1981 | Philipp |
| 4,326,135 A | 4/1982 | Jarrett et al. |
| 4,344,067 A | 8/1982 | Lee |
| 4,380,083 A | 4/1983 | Andersson et al. |
| 4,438,404 A | 3/1984 | Philipp |
| 4,475,151 A | 10/1984 | Philipp |
| 4,497,575 A | 2/1985 | Philipp |
| 4,604,363 A | 8/1986 | Newhouse et al. |
| 4,608,502 A | 8/1986 | Dijkmans et al. |
| 4,656,603 A | 4/1987 | Dunn |
| 4,670,838 A | 6/1987 | Kawata |
| 4,689,740 A | 8/1987 | Moelands et al. |
| 4,692,718 A | 9/1987 | Roza et al. |
| 4,701,907 A | 10/1987 | Collins |
| 4,727,541 A | 2/1988 | Mori et al. |
| 4,736,097 A | 4/1988 | Philipp |
| 4,740,966 A | 4/1988 | Goad |
| 4,755,766 A | 7/1988 | Metz |
| 4,773,024 A | 9/1988 | Faggin et al. |
| 4,794,558 A | 12/1988 | Thompson |
| 4,802,103 A | 1/1989 | Faggin et al. |
| 4,802,119 A | 1/1989 | Heene et al. |
| 4,809,345 A | 2/1989 | Tabata et al. |
| 4,812,684 A | 3/1989 | Yamagiwa et al. |
| 4,813,013 A | 3/1989 | Dunn |
| 4,827,401 A | 5/1989 | Hrustich et al. |
| 4,831,546 A | 5/1989 | Mitsuta et al. |
| 4,833,418 A | 5/1989 | Quintus et al. |
| 4,868,525 A | 9/1989 | Dias |
| 4,876,466 A | 10/1989 | Kondou et al. |
| 4,876,534 A | 10/1989 | Mead et al. |
| 4,878,200 A | 10/1989 | Asghar et al. |
| 4,879,461 A | 11/1989 | Philipp |
| 4,879,688 A | 11/1989 | Turner et al. |
| 4,885,484 A | 12/1989 | Gray |
| 4,907,121 A | 3/1990 | Hrassky |
| 4,935,702 A | 6/1990 | Mead et al. |
| 4,939,637 A | 7/1990 | Pawloski |
| 4,942,540 A | 7/1990 | Black et al. |
| 4,947,169 A | 8/1990 | Smith et al. |
| 4,953,928 A | 9/1990 | Anderson et al. |
| 4,962,342 A | 10/1990 | Mead et al. |
| 4,964,074 A | 10/1990 | Suzuki et al. |
| 4,969,087 A | 11/1990 | Tanagawa et al. |
| 4,970,408 A | 11/1990 | Hanke et al. |
| 4,972,372 A | 11/1990 | Ueno |
| 4,977,381 A | 12/1990 | Main |
| 4,980,652 A | 12/1990 | Tarusawa et al. |
| 4,999,519 A | 3/1991 | Kitsukawa et al. |
| 5,043,674 A | 8/1991 | Bonaccio et al. |
| 5,049,758 A | 9/1991 | Mead et al. |
| 5,050,168 A | 9/1991 | Paterson |
| 5,053,949 A | 10/1991 | Allison et al. |
| 5,055,827 A | 10/1991 | Philipp |
| 5,059,920 A | 10/1991 | Anderson et al. |
| 5,068,622 A | 11/1991 | Mead et al. |
| 5,073,759 A | 12/1991 | Mead et al. |
| 5,083,044 A | 1/1992 | Mead et al. |
| 5,088,822 A | 2/1992 | Warren |
| 5,095,284 A | 3/1992 | Mead |
| 5,097,305 A | 3/1992 | Mead et al. |
| 5,107,146 A | 4/1992 | El-Ayat |
| 5,107,149 A | 4/1992 | Platt et al. |
| 5,109,261 A | 4/1992 | Mead et al. |
| 5,119,038 A | 6/1992 | Anderson et al. |
| 5,120,996 A | 6/1992 | Mead et al. |
| 5,122,800 A | 6/1992 | Philipp |
| 5,126,685 A | 6/1992 | Platt et al. |
| 5,127,103 A | 6/1992 | Hill et al. |
| 5,128,871 A | 7/1992 | Schmitz |
| 5,136,188 A | 8/1992 | Ha et al. |
| 5,140,197 A | 8/1992 | Grider |
| 5,142,247 A | 8/1992 | Lada, Jr. et al. |
| 5,144,582 A | 9/1992 | Steele |
| 5,146,106 A | 9/1992 | Anderson et al. |
| 5,150,079 A | 9/1992 | Williams et al. |
| 5,155,836 A | 10/1992 | Jordan et al. |
| 5,159,292 A | 10/1992 | Canfield et al. |
| 5,159,335 A | 10/1992 | Veneruso |
| 5,160,899 A | 11/1992 | Anderson et al. |
| 5,161,124 A | 11/1992 | Love |
| 5,165,054 A | 11/1992 | Platt et al. |
| 5,166,562 A | 11/1992 | Allen et al. |
| 5,175,884 A | 12/1992 | Suarez |
| 5,179,531 A | 1/1993 | Yamaki |
| 5,198,817 A | 3/1993 | Walden et al. |
| 5,200,751 A | 4/1993 | Smith |
| 5,202,687 A | 4/1993 | Distinti |
| 5,204,549 A | 4/1993 | Platt et al. |
| 5,206,582 A | 4/1993 | Ekstedt et al. |
| 5,220,512 A | 6/1993 | Watkins et al. |
| 5,225,991 A | 7/1993 | Dougherty |
| 5,230,000 A | 7/1993 | Mozingo et al. |
| 5,235,617 A | 8/1993 | Mallard, Jr. |
| 5,241,492 A | 8/1993 | Girardeau, Jr. |
| 5,243,554 A | 9/1993 | Allen et al. |
| 5,245,262 A | 9/1993 | Moody et al. |
| 5,248,843 A | 9/1993 | Billings |
| 5,248,873 A | 9/1993 | Allen et al. |
| 5,258,760 A | 11/1993 | Moody et al. |
| 5,260,592 A | 11/1993 | Mead et al. |
| 5,260,979 A | 11/1993 | Parker et al. |
| 5,270,963 A | 12/1993 | Allen et al. |
| 5,276,407 A | 1/1994 | Mead et al. |
| 5,276,739 A | 1/1994 | Krokstad et al. |
| 5,276,890 A | 1/1994 | Arai |
| 5,280,199 A | 1/1994 | Itakura |
| 5,280,202 A | 1/1994 | Chan et al. |
| 5,289,023 A | 2/1994 | Mead |
| 5,303,329 A | 4/1994 | Mead et al. |
| 5,304,955 A | 4/1994 | Atriss et al. |
| 5,305,017 A | 4/1994 | Gerpheide |
| 5,305,312 A | 4/1994 | Fornek et al. |
| 5,307,381 A | 4/1994 | Ahuja |
| 5,313,618 A | 5/1994 | Pawloski |
| 5,317,202 A | 5/1994 | Waizman |
| 5,319,370 A | 6/1994 | Del Signore et al. |
| 5,319,771 A | 6/1994 | Takeda |
| 5,321,828 A | 6/1994 | Phillips et al. |
| 5,324,958 A | 6/1994 | Mead et al. |
| 5,325,512 A | 6/1994 | Takahashi |
| 5,329,471 A | 7/1994 | Swoboda et al. |
| 5,331,215 A | 7/1994 | Allen et al. |
| 5,331,315 A | 7/1994 | Crosette |
| 5,331,571 A | 7/1994 | Aronoff et al. |
| 5,334,952 A | 8/1994 | Maddy et al. |
| 5,335,342 A | 8/1994 | Pope et al. |
| 5,336,936 A | 8/1994 | Allen et al. |
| 5,339,213 A | 8/1994 | O'Callaghan |
| 5,339,262 A | 8/1994 | Rostoker et al. |
| 5,341,044 A | 8/1994 | Ahanin et al. |
| 5,341,267 A | 8/1994 | Whitten et al. |
| 5,345,195 A | 9/1994 | Cordoba et al. |
| 5,349,303 A | 9/1994 | Gerpheide |
| 5,355,097 A | 10/1994 | Scott et al. |
| 5,357,626 A | 10/1994 | Johnson et al. |
| 5,361,290 A | 11/1994 | Akiyama |
| 5,371,524 A | 12/1994 | Herczeg et al. |
| 5,371,860 A | 12/1994 | Mura et al. |
| 5,371,878 A | 12/1994 | Coker |
| 5,371,883 A | 12/1994 | Gross et al. |
| 5,374,787 A | 12/1994 | Miller et al. |
| 5,378,935 A | 1/1995 | Korhonen et al. |
| 5,381,515 A | 1/1995 | Platt et al. |
| 5,384,467 A | 1/1995 | Plimon et al. |
| 5,384,745 A | 1/1995 | Konishi et al. |
| 5,384,910 A | 1/1995 | Torres |
| 5,392,784 A | 2/1995 | Gudaitis |
| 5,394,522 A | 2/1995 | Sanchez-Frank et al. |
| 5,396,245 A | 3/1995 | Rempfer |
| 5,398,261 A | 3/1995 | Marbot |
| 5,399,922 A | 3/1995 | Kiani et al. |
| 5,408,194 A | 4/1995 | Steinbach et al. |
| 5,408,235 A | 4/1995 | Doyle et al. |

| | | | | | | |
|---|---|---|---|---|---|---|
| 5,414,308 A | 5/1995 | Lee et al. | | 5,608,892 A | 3/1997 | Wakerly |
| 5,414,380 A | 5/1995 | Floyd et al. | | 5,614,861 A | 3/1997 | Harada |
| 5,416,895 A | 5/1995 | Anderson et al. | | 5,625,316 A | 4/1997 | Chambers et al. |
| 5,422,823 A | 6/1995 | Agrawal et al. | | 5,625,583 A | 4/1997 | Hyatt |
| 5,424,689 A | 6/1995 | Gillig et al. | | 5,629,857 A | 5/1997 | Brennan |
| 5,426,378 A | 6/1995 | Ong | | 5,629,891 A | 5/1997 | Lemoncheck et al. |
| 5,426,384 A | 6/1995 | May | | 5,630,052 A | 5/1997 | Shah |
| 5,428,319 A | 6/1995 | Marvin et al. | | 5,630,057 A | 5/1997 | Hait |
| 5,430,395 A | 7/1995 | Ichimaru | | 5,630,102 A | 5/1997 | Johnson et al. |
| 5,430,687 A | 7/1995 | Hung et al. | | 5,631,577 A | 5/1997 | Freidin et al. |
| 5,430,734 A | 7/1995 | Gilson | | 5,633,766 A | 5/1997 | Hase et al. |
| 5,432,476 A | 7/1995 | Tran | | 5,642,295 A | 6/1997 | Smayling |
| 5,438,672 A | 8/1995 | Dey | | 5,646,544 A | 7/1997 | Iadanza |
| 5,440,305 A | 8/1995 | Signore et al. | | 5,646,901 A | 7/1997 | Sharpe-Geisler et al. |
| 5,451,887 A | 9/1995 | El-Avat et al. | | 5,648,642 A | 7/1997 | Miller et al. |
| 5,453,904 A | 9/1995 | Higashiyama et al. | | 5,651,035 A | 7/1997 | Tozun et al. |
| 5,455,525 A | 10/1995 | Ho et al. | | 5,652,893 A | 7/1997 | Ben-Meir et al. |
| 5,455,731 A | 10/1995 | Parkinson | | 5,661,433 A | 8/1997 | LaRosa et al. |
| 5,455,927 A | 10/1995 | Huang | | 5,663,900 A | 9/1997 | Bhandari et al. |
| 5,457,410 A | 10/1995 | Ting | | 5,663,965 A | 9/1997 | Seymour |
| 5,457,479 A | 10/1995 | Cheng | | 5,664,199 A | 9/1997 | Kuwahara |
| 5,463,591 A | 10/1995 | Aimoto et al. | | 5,670,915 A | 9/1997 | Cooper et al. |
| 5,479,603 A | 12/1995 | Stone et al. | | 5,673,198 A | 9/1997 | Lawman et al. |
| 5,479,643 A | 12/1995 | Bhaskar et al. | | 5,675,825 A | 10/1997 | Dreyer et al. |
| 5,479,652 A | 12/1995 | Dreyer et al. | | 5,677,691 A | 10/1997 | Hosticka et al. |
| 5,481,471 A | 1/1996 | Naglestad et al. | | 5,680,070 A | 10/1997 | Anderson et al. |
| 5,488,204 A | 1/1996 | Mead et al. | | 5,682,032 A | 10/1997 | Philipp |
| 5,491,458 A | 2/1996 | Mccune, Jr. et al. | | 5,684,434 A | 11/1997 | Mann et al. |
| 5,493,246 A | 2/1996 | Anderson | | 5,684,952 A | 11/1997 | Stein |
| 5,493,723 A | 2/1996 | Beck et al. | | 5,686,844 A | 11/1997 | Hull et al. |
| 5,495,077 A | 2/1996 | Miller et al. | | 5,687,325 A | 11/1997 | Chang |
| 5,495,593 A | 2/1996 | Elmer et al. | | 5,689,195 A | 11/1997 | Cliff et al. |
| 5,495,594 A | 2/1996 | Mackenna et al. | | 5,689,196 A | 11/1997 | Schutte |
| 5,499,192 A | 3/1996 | Knapp et al. | | 5,691,664 A | 11/1997 | Anderson et al. |
| 5,517,198 A | 5/1996 | Mcewan | | 5,691,898 A | 11/1997 | Rosenberg et al. |
| 5,519,854 A | 5/1996 | Watt | | 5,694,063 A | 12/1997 | Burlison et al. |
| 5,521,529 A | 5/1996 | Agrawal et al. | | 5,696,952 A | 12/1997 | Pontarelli |
| 5,530,444 A | 6/1996 | Tice et al. | | 5,699,024 A | 12/1997 | Manlove et al. |
| 5,530,673 A | 6/1996 | Tobita et al. | | 5,703,871 A | 12/1997 | Pope et al. |
| 5,530,813 A | 6/1996 | Paulsen et al. | | 5,706,453 A | 1/1998 | Cheng et al. |
| 5,537,057 A | 7/1996 | Leong et al. | | 5,708,798 A | 1/1998 | Lynch et al. |
| 5,541,878 A | 7/1996 | Lemoncheck et al. | | 5,710,906 A | 1/1998 | Ghosh et al. |
| 5,542,055 A | 7/1996 | Amini et al. | | 5,712,969 A | 1/1998 | Zimmermann et al. |
| 5,543,588 A | 8/1996 | Bisset et al. | | 5,721,931 A | 2/1998 | Gephardt et al. |
| 5,543,590 A | 8/1996 | Gillespie et al. | | 5,724,009 A | 3/1998 | Collins et al. |
| 5,543,591 A | 8/1996 | Gillespie et al. | | 5,727,170 A | 3/1998 | Mitchell et al. |
| 5,544,067 A | 8/1996 | Rostoker et al. | | 5,728,933 A | 3/1998 | Schultz et al. |
| 5,544,311 A | 8/1996 | Harenberg et al. | | 5,729,704 A | 3/1998 | Stone et al. |
| 5,546,433 A | 8/1996 | Tran et al. | | 5,730,165 A | 3/1998 | Philipp |
| 5,546,562 A | 8/1996 | Patel | | 5,732,277 A | 3/1998 | Kodosky et al. |
| 5,552,725 A | 9/1996 | Ray et al. | | 5,734,272 A | 3/1998 | Belot et al. |
| 5,552,748 A | 9/1996 | O'Shaughnessy | | 5,734,334 A | 3/1998 | Hsieh et al. |
| 5,554,951 A | 9/1996 | Gough | | 5,737,557 A | 4/1998 | Sullivan |
| 5,555,452 A | 9/1996 | Callaway et al. | | 5,737,760 A | 4/1998 | Grimmer et al. |
| 5,555,907 A | 9/1996 | Philipp | | 5,745,011 A | 4/1998 | Scott |
| 5,557,762 A | 9/1996 | Okuaki et al. | | 5,748,048 A | 5/1998 | Moyal |
| 5,559,502 A | 9/1996 | Schutte | | 5,748,875 A | 5/1998 | Tzori |
| 5,559,996 A | 9/1996 | Fujioka | | 5,752,013 A | 5/1998 | Christensen et al. |
| 5,563,526 A | 10/1996 | Hastings et al. | | 5,754,552 A | 5/1998 | Allmond et al. |
| 5,563,529 A | 10/1996 | Seltzer et al. | | 5,754,826 A | 5/1998 | Gamal et al. |
| 5,564,010 A | 10/1996 | Henry et al. | | 5,757,368 A | 5/1998 | Gerpheide et al. |
| 5,564,108 A | 10/1996 | Hunsaker et al. | | 5,758,058 A | 5/1998 | Milburn |
| 5,565,658 A | 10/1996 | Gerpheide et al. | | 5,761,128 A | 6/1998 | Watanabe |
| 5,566,702 A | 10/1996 | Philipp | | 5,763,909 A | 6/1998 | Mead et al. |
| 5,572,665 A | 11/1996 | Nakabayashi | | 5,764,714 A | 6/1998 | Stansell et al. |
| 5,572,719 A | 11/1996 | Biesterfeldt | | 5,767,457 A | 6/1998 | Gerpheide et al. |
| 5,574,678 A | 11/1996 | Gorecki | | 5,774,704 A | 6/1998 | Williams |
| 5,574,852 A | 11/1996 | Bakker et al. | | 5,777,399 A | 7/1998 | Shibuya |
| 5,574,892 A | 11/1996 | Christensen | | 5,781,030 A | 7/1998 | Agrawal et al. |
| 5,579,353 A | 11/1996 | Parmenter et al. | | 5,781,747 A | 7/1998 | Smith et al. |
| 5,587,945 A | 12/1996 | Lin et al. | | 5,784,545 A | 7/1998 | Anderson et al. |
| 5,587,957 A | 12/1996 | Kowalczyk et al. | | 5,790,957 A | 8/1998 | Heidari |
| 5,590,354 A | 12/1996 | Klapproth et al. | | 5,796,183 A | 8/1998 | Hourmand et al. |
| 5,594,388 A | 1/1997 | O'Shaughnessy et al. | | 5,799,176 A | 8/1998 | Kapusta et al. |
| 5,594,734 A | 1/1997 | Worsley et al. | | 5,801,958 A | 9/1998 | Dangelo et al. |
| 5,594,876 A | 1/1997 | Getzlaff et al. | | 5,802,073 A | 9/1998 | Platt |
| 5,594,890 A | 1/1997 | Yamaura et al. | | 5,802,290 A | 9/1998 | Casselman |
| 5,600,262 A | 2/1997 | Kolze | | 5,805,792 A | 9/1998 | Swoboda et al. |
| 5,604,466 A | 2/1997 | Dreps et al. | | 5,805,897 A | 9/1998 | Glowny |

| Patent | Date | Inventor(s) | Patent | Date | Inventor(s) |
|---|---|---|---|---|---|
| 5,808,883 A | 9/1998 | Hawkes | 5,959,871 A | 9/1999 | Pierzchala et al. |
| 5,811,987 A | 9/1998 | Ashmore, Jr. et al. | 5,963,075 A | 10/1999 | Hiiragizawa |
| 5,812,698 A | 9/1998 | Platt et al. | 5,963,105 A | 10/1999 | Nguyen |
| 5,818,254 A | 10/1998 | Agrawal et al. | 5,963,503 A | 10/1999 | Lee |
| 5,818,444 A | 10/1998 | Alimpich et al. | 5,964,893 A | 10/1999 | Circello et al. |
| 5,818,736 A | 10/1998 | Leibold | 5,966,027 A | 10/1999 | Kapusta et al. |
| 5,819,028 A | 10/1998 | Manghirmalani et al. | 5,966,532 A | 10/1999 | Mcdonald et al. |
| 5,822,387 A | 10/1998 | Mar | 5,968,135 A | 10/1999 | Teramoto et al. |
| 5,822,531 A | 10/1998 | Gorczyca et al. | 5,969,513 A | 10/1999 | Clark |
| 5,828,693 A | 10/1998 | Mays et al. | 5,969,632 A | 10/1999 | Diamant et al. |
| 5,838,583 A | 11/1998 | Varadarajan et al. | 5,973,368 A | 10/1999 | Pearce et al. |
| 5,841,078 A | 11/1998 | Miller et al. | 5,974,235 A | 10/1999 | Nunally et al. |
| 5,841,996 A | 11/1998 | Nolan et al. | 5,977,791 A | 11/1999 | Veenstra |
| 5,844,265 A | 12/1998 | Mead et al. | 5,978,584 A | 11/1999 | Nishibata et al. |
| 5,848,285 A | 12/1998 | Kapusta et al. | 5,978,937 A | 11/1999 | Miyamori et al. |
| 5,850,156 A | 12/1998 | Wittman | 5,982,105 A | 11/1999 | Masters |
| 5,852,733 A | 12/1998 | Chien et al. | 5,982,229 A | 11/1999 | Wong et al. |
| 5,854,625 A | 12/1998 | Frisch et al. | 5,982,241 A | 11/1999 | Nguyen et al. |
| 5,857,109 A | 1/1999 | Taylor | 5,983,277 A | 11/1999 | Heile et al. |
| 5,861,583 A | 1/1999 | Schediwy et al. | 5,986,479 A | 11/1999 | Mohan |
| 5,861,875 A | 1/1999 | Gerpheide | 5,987,246 A | 11/1999 | Thomsen et al. |
| 5,864,242 A | 1/1999 | Allen et al. | 5,988,902 A | 11/1999 | Holehan |
| 5,864,392 A | 1/1999 | Winklhofer et al. | 5,994,939 A | 11/1999 | Johnson et al. |
| 5,867,046 A | 2/1999 | Sugasawa | 5,996,032 A | 11/1999 | Baker |
| 5,867,399 A | 2/1999 | Rostoker et al. | 5,999,725 A | 12/1999 | Barbier et al. |
| 5,869,979 A | 2/1999 | Bocchino | 6,002,268 A | 12/1999 | Sasaki et al. |
| 5,870,004 A | 2/1999 | Lu | 6,002,398 A | 12/1999 | Wilson |
| 5,870,309 A | 2/1999 | Lawman | 6,003,054 A | 12/1999 | Oshima et al. |
| 5,870,345 A | 2/1999 | Stecker | 6,003,107 A | 12/1999 | Ranson et al. |
| 5,872,464 A | 2/1999 | Gradinariu | 6,003,133 A | 12/1999 | Moughanni et al. |
| 5,874,958 A | 2/1999 | Ludolph | 6,005,814 A | 12/1999 | Mulholland et al. |
| 5,875,293 A | 2/1999 | Bell et al. | 6,005,904 A | 12/1999 | Knapp et al. |
| 5,877,656 A | 3/1999 | Mann et al. | 6,008,685 A | 12/1999 | Kunst |
| 5,878,425 A | 3/1999 | Redpath | 6,008,703 A | 12/1999 | Perrott et al. |
| 5,880,411 A | 3/1999 | Gillespie et al. | 6,009,270 A | 12/1999 | Mann |
| 5,880,598 A | 3/1999 | Duong | 6,009,496 A | 12/1999 | Tsai |
| 5,883,623 A | 3/1999 | Cseri | 6,011,407 A | 1/2000 | New |
| 5,886,582 A | 3/1999 | Stansell | 6,012,835 A | 1/2000 | Thompson et al. |
| 5,887,189 A | 3/1999 | Birns et al. | 6,014,135 A | 1/2000 | Fernandes |
| 5,889,236 A | 3/1999 | Gillespie et al. | 6,014,509 A | 1/2000 | Furtek et al. |
| 5,889,723 A | 3/1999 | Pascucci | 6,016,554 A | 1/2000 | Skrovan et al. |
| 5,889,936 A | 3/1999 | Chan | 6,016,563 A | 1/2000 | Fleisher |
| 5,889,988 A | 3/1999 | Held | 6,018,559 A | 1/2000 | Azegami et al. |
| 5,894,226 A | 4/1999 | Koyama | 6,023,422 A | 2/2000 | Allen et al. |
| 5,894,243 A | 4/1999 | Hwang | 6,023,565 A | 2/2000 | Lawman et al. |
| 5,894,565 A | 4/1999 | Furtek et al. | 6,026,134 A | 2/2000 | Duffy et al. |
| 5,895,494 A | 4/1999 | Scalzi et al. | 6,026,501 A | 2/2000 | Hohl et al. |
| 5,896,068 A | 4/1999 | Moyal | 6,028,271 A | 2/2000 | Gillespie et al. |
| 5,896,330 A | 4/1999 | Gibson | 6,028,959 A | 2/2000 | Wang et al. |
| 5,898,345 A | 4/1999 | Namura et al. | 6,031,365 A | 2/2000 | Sharpe-Geisler |
| 5,900,780 A | 5/1999 | Hirose et al. | 6,032,268 A | 2/2000 | Swoboda et al. |
| 5,901,062 A | 5/1999 | Burch et al. | 6,034,538 A | 3/2000 | Abramovici |
| 5,903,718 A | 5/1999 | Marik | 6,035,320 A | 3/2000 | Kiriaki et al. |
| 5,905,398 A | 5/1999 | Todsen et al. | 6,037,807 A | 3/2000 | Wu et al. |
| 5,909,544 A | 6/1999 | Anderson et al. | 6,038,551 A | 3/2000 | Barlow et al. |
| 5,911,059 A | 6/1999 | Profit, Jr. | 6,041,406 A | 3/2000 | Mann |
| 5,914,465 A | 6/1999 | Allen et al. | 6,043,695 A | 3/2000 | O'Sullivan |
| 5,914,633 A | 6/1999 | Comino et al. | 6,043,719 A | 3/2000 | Lin et al. |
| 5,914,708 A | 6/1999 | Lagrange et al. | 6,049,223 A | 4/2000 | Lytle et al. |
| 5,917,356 A | 6/1999 | Casal et al. | 6,049,225 A | 4/2000 | Huang et al. |
| 5,920,310 A | 7/1999 | Faggin et al. | 6,051,772 A | 4/2000 | Cameron et al. |
| 5,923,264 A | 7/1999 | Lavelle et al. | 6,052,035 A | 4/2000 | Nolan et al. |
| 5,926,566 A | 7/1999 | Wang et al. | 6,052,524 A | 4/2000 | Pauna |
| 5,929,710 A | 7/1999 | Bien | 6,055,584 A | 4/2000 | Bridges et al. |
| 5,930,148 A | 7/1999 | Bjorksten et al. | 6,057,705 A | 5/2000 | Wojewoda et al. |
| 5,930,150 A | 7/1999 | Cohen et al. | 6,058,263 A | 5/2000 | Voth |
| 5,931,959 A | 8/1999 | Kwiat | 6,058,452 A | 5/2000 | Rangasayee et al. |
| 5,933,023 A | 8/1999 | Young | 6,061,511 A | 5/2000 | Marantz et al. |
| 5,933,356 A | 8/1999 | Rostoker et al. | 6,066,961 A | 5/2000 | Lee et al. |
| 5,933,816 A | 8/1999 | Zeanah et al. | 6,070,003 A | 5/2000 | Gove et al. |
| 5,935,266 A | 8/1999 | Thurnhofer et al. | 6,072,803 A | 6/2000 | Allmond et al. |
| 5,939,904 A | 8/1999 | Fetterman et al. | 6,075,941 A | 6/2000 | Itoh et al. |
| 5,939,949 A | 8/1999 | Olgaard et al. | 6,078,741 A | 6/2000 | Ma et al. |
| 5,941,991 A | 8/1999 | Kageshima | 6,079,985 A | 6/2000 | Wohl et al. |
| 5,942,733 A | 8/1999 | Allen et al. | 6,081,140 A | 6/2000 | King |
| 5,943,052 A | 8/1999 | Allen et al. | 6,094,730 A | 7/2000 | Lopez et al. |
| 5,945,878 A | 8/1999 | Westwick et al. | 6,097,211 A | 8/2000 | Couts-Martin et al. |
| 5,949,632 A | 9/1999 | Barreras, Sr. et al. | 6,097,432 A | 8/2000 | Mead et al. |
| 5,952,888 A | 9/1999 | Scott | 6,101,457 A | 8/2000 | Barch et al. |

| | | | | | | |
|---|---|---|---|---|---|---|
| 6,101,617 | A | 8/2000 | Burckhartt et al. | 6,239,389 B1 | 5/2001 | Allen et al. |
| 6,104,217 | A | 8/2000 | Magana | 6,239,798 B1 | 5/2001 | Ludolph et al. |
| 6,104,325 | A | 8/2000 | Liaw et al. | 6,240,375 B1 | 5/2001 | Sonoda |
| 6,107,769 | A | 8/2000 | Saylor et al. | 6,246,258 B1 | 6/2001 | Lesea |
| 6,107,826 | A | 8/2000 | Young et al. | 6,246,410 B1 | 6/2001 | Bergeron et al. |
| 6,107,882 | A | 8/2000 | Gabara et al. | 6,249,167 B1 | 6/2001 | Oguchi et al. |
| 6,110,223 | A | 8/2000 | Southgate et al. | 6,249,447 B1 | 6/2001 | Boylan et al. |
| 6,111,431 | A | 8/2000 | Estrada | 6,253,250 B1 | 6/2001 | Evans et al. |
| 6,112,264 | A | 8/2000 | Beasley et al. | 6,256,754 B1 | 7/2001 | Roohparvar |
| 6,121,791 | A | 9/2000 | Abbott | 6,262,717 B1 | 7/2001 | Donohue et al. |
| 6,121,805 | A | 9/2000 | Thamsirianunt et al. | 6,263,302 B1 | 7/2001 | Hellestrand et al. |
| 6,121,965 | A | 9/2000 | Kenney et al. | 6,263,339 B1 | 7/2001 | Hirsch |
| 6,125,416 | A | 9/2000 | Warren | 6,263,484 B1 | 7/2001 | Yang |
| 6,130,548 | A | 10/2000 | Koifman | 6,269,383 B1 | 7/2001 | Sabin et al. |
| 6,130,551 | A | 10/2000 | Agrawal et al. | 6,271,679 B1 | 8/2001 | McClintock et al. |
| 6,130,552 | A | 10/2000 | Jefferson et al. | 6,272,646 B1 | 8/2001 | Rangasayee et al. |
| 6,133,773 | A | 10/2000 | Garlepp et al. | 6,275,117 B1 | 8/2001 | Abugharbieh et al. |
| 6,134,181 | A | 10/2000 | Landry | 6,278,568 B1 | 8/2001 | Cloke et al. |
| 6,134,516 | A | 10/2000 | Wang et al. | 6,280,391 B1 | 8/2001 | Olson et al. |
| 6,137,308 | A | 10/2000 | Nayak | 6,281,753 B1 | 8/2001 | Corsi et al. |
| 6,140,853 | A | 10/2000 | Lo | 6,282,547 B1 | 8/2001 | Hirsch |
| 6,141,376 | A | 10/2000 | Shaw | 6,282,551 B1 | 8/2001 | Anderson et al. |
| 6,141,764 | A | 10/2000 | Ezell | 6,286,127 B1 | 9/2001 | King et al. |
| 6,148,104 | A | 11/2000 | Wang et al. | 6,288,707 B1 | 9/2001 | Philipp |
| 6,148,441 | A | 11/2000 | Woodward | 6,289,300 B1 | 9/2001 | Brannick et al. |
| 6,149,299 | A | 11/2000 | Aslan et al. | 6,289,478 B1 | 9/2001 | Kitagaki |
| 6,150,866 | A | 11/2000 | Eto et al. | 6,289,489 B1 | 9/2001 | Bold et al. |
| 6,154,064 | A | 11/2000 | Proebsting | 6,292,028 B1 | 9/2001 | Tomita |
| 6,157,024 | A | 12/2000 | Chapdelaine et al. | 6,294,932 B1 | 9/2001 | Watarai |
| 6,157,270 | A | 12/2000 | Tso | 6,294,962 B1 | 9/2001 | Mar |
| 6,161,199 | A | 12/2000 | Szeto et al. | 6,298,320 B1 | 10/2001 | Buckmaster et al. |
| 6,166,367 | A | 12/2000 | Cho | 6,304,014 B1 | 10/2001 | England et al. |
| 6,166,960 | A | 12/2000 | Marneweck et al. | 6,304,101 B1 | 10/2001 | Nishihara |
| 6,167,077 | A | 12/2000 | Ducaroir et al. | 6,304,790 B1 | 10/2001 | Nakamura et al. |
| 6,167,364 | A | 12/2000 | Stellenberg et al. | 6,307,413 B1 | 10/2001 | Dalmia et al. |
| 6,167,559 | A | 12/2000 | Furtek et al. | 6,310,521 B1 | 10/2001 | Dalmia |
| 6,172,428 | B1 | 1/2001 | Jordan | 6,310,611 B1 | 10/2001 | Caldwell |
| 6,172,571 | B1 | 1/2001 | Moyal et al. | 6,311,149 B1 | 10/2001 | Ryan et al. |
| 6,173,419 | B1 | 1/2001 | Barnett | 6,314,530 B1 | 11/2001 | Mann |
| 6,175,914 | B1 | 1/2001 | Mann | 6,320,184 B1 | 11/2001 | Winklhofer et al. |
| 6,175,949 | B1 | 1/2001 | Gristede et al. | 6,320,282 B1 | 11/2001 | Caldwell |
| 6,181,163 | B1 | 1/2001 | Agrawal et al. | 6,321,369 B1 | 11/2001 | Heile et al. |
| 6,183,131 | B1 | 2/2001 | Holloway et al. | 6,323,846 B1 | 11/2001 | Westerman et al. |
| 6,185,127 | B1 | 2/2001 | Myers et al. | 6,324,628 B1 | 11/2001 | Chan |
| 6,185,522 | B1 | 2/2001 | Bakker | 6,326,859 B1 | 12/2001 | Goldman et al. |
| 6,185,703 | B1 | 2/2001 | Guddat et al. | 6,332,137 B1 | 12/2001 | Hori et al. |
| 6,185,732 | B1 | 2/2001 | Mann et al. | 6,332,201 B1 | 12/2001 | Chin et al. |
| 6,188,228 | B1 | 2/2001 | Philipp | 6,337,579 B1 | 1/2002 | Mochida |
| 6,188,241 | B1 | 2/2001 | Gauthier et al. | 6,338,109 B1 | 1/2002 | Snyder et al. |
| 6,188,381 | B1 | 2/2001 | van der Wal et al. | 6,339,815 B1 | 1/2002 | Feng et al. |
| 6,188,391 | B1 | 2/2001 | Seely et al. | 6,342,907 B1 | 1/2002 | Petty et al. |
| 6,188,975 | B1 | 2/2001 | Gay | 6,345,383 B1 | 2/2002 | Ueki |
| 6,191,603 | B1 | 2/2001 | Muradali et al. | 6,347,395 B1 | 2/2002 | Payne et al. |
| 6,191,660 | B1 | 2/2001 | Mar et al. | 6,351,789 B1 | 2/2002 | Green |
| 6,191,998 | B1 | 2/2001 | Reddy et al. | 6,353,452 B1 | 3/2002 | Hamada et al. |
| 6,192,431 | B1 | 2/2001 | Dabral et al. | 6,355,980 B1 | 3/2002 | Callahan |
| 6,198,303 | B1 | 3/2001 | Rangasayee | 6,356,862 B2 | 3/2002 | Bailey |
| 6,201,407 | B1 | 3/2001 | Kapusta et al. | 6,356,958 B1 | 3/2002 | Lin |
| 6,201,829 | B1 | 3/2001 | Schneider | 6,356,960 B1 | 3/2002 | Jones et al. |
| 6,202,044 | B1 | 3/2001 | Tzori | 6,359,950 B2 | 3/2002 | Gossmann et al. |
| 6,204,687 | B1 | 3/2001 | Schultz et al. | 6,362,697 B1 | 3/2002 | Pulvirenti |
| 6,205,574 | B1 | 3/2001 | Dellinger et al. | 6,366,174 B1 | 4/2002 | Berry et al. |
| 6,208,572 | B1 | 3/2001 | Adams et al. | 6,366,300 B1 | 4/2002 | Ohara et al. |
| 6,211,708 | B1 | 4/2001 | Klemmer | 6,366,874 B1 | 4/2002 | Lee et al. |
| 6,211,715 | B1 | 4/2001 | Terauchi | 6,366,878 B1 | 4/2002 | Grunert |
| 6,211,741 | B1 | 4/2001 | Dalmia | 6,369,660 B1 | 4/2002 | Wei et al. |
| 6,215,352 | B1 | 4/2001 | Sudo | 6,371,878 B1 | 4/2002 | Bowen |
| 6,216,254 | B1 | 4/2001 | Pesce et al. | 6,373,954 B1 | 4/2002 | Malcolm, Jr. et al. |
| 6,219,729 | B1 | 4/2001 | Keats et al. | 6,374,370 B1 | 4/2002 | Bockhaus et al. |
| 6,222,528 | B1 | 4/2001 | Gerpheide et al. | 6,377,009 B1 | 4/2002 | Philipp |
| 6,223,144 | B1 | 4/2001 | Barnett et al. | 6,377,575 B1 | 4/2002 | Mullaney et al. |
| 6,223,147 | B1 | 4/2001 | Bowers | 6,377,646 B1 | 4/2002 | Sha |
| 6,223,272 | B1 | 4/2001 | Coehlo et al. | 6,380,811 B1 | 4/2002 | Zarubinsky et al. |
| RE37,195 | E | 5/2001 | Kean | 6,380,929 B1 | 4/2002 | Platt |
| 6,225,866 | B1 | 5/2001 | Kubota et al. | 6,380,931 B1 | 4/2002 | Gillespie et al. |
| 6,236,242 | B1 | 5/2001 | Hedberg | 6,384,947 B1 | 5/2002 | Ackerman et al. |
| 6,236,275 | B1 | 5/2001 | Dent | 6,385,742 B1 | 5/2002 | Kirsch et al. |
| 6,236,278 | B1 | 5/2001 | Olgaard | 6,388,109 B1 | 5/2002 | Schwarz et al. |
| 6,236,593 | B1 | 5/2001 | Hong et al. | 6,388,464 B1 | 5/2002 | Lacey et al. |

| | | |
|---|---|---|
| 6,396,302 B2 | 5/2002 | New et al. |
| 6,396,357 B1 | 5/2002 | Sun et al. |
| 6,397,232 B1 | 5/2002 | Cheng-Hung et al. |
| 6,401,230 B1 | 6/2002 | Ahanessians et al. |
| 6,404,204 B1 | 6/2002 | Farruggia et al. |
| 6,404,445 B1 | 6/2002 | Galea et al. |
| 6,407,953 B1 | 6/2002 | Cleeves |
| 6,408,432 B1 | 6/2002 | Herrmann et al. |
| 6,411,665 B1 | 6/2002 | Chan et al. |
| 6,411,974 B1 | 6/2002 | Graham et al. |
| 6,414,671 B1 | 7/2002 | Gillespie et al. |
| 6,421,698 B1 | 7/2002 | Hong |
| 6,421,817 B1 | 7/2002 | Mohan et al. |
| 6,425,109 B1 | 7/2002 | Choukalos et al. |
| 6,429,882 B1 | 8/2002 | Abdelnur et al. |
| 6,430,305 B1 | 8/2002 | Decker |
| 6,433,645 B1 | 8/2002 | Mann et al. |
| 6,434,187 B1 | 8/2002 | Beard et al. |
| 6,437,805 B1 | 8/2002 | Sojoodi et al. |
| 6,438,565 B1 | 8/2002 | Ammirato et al. |
| 6,438,735 B1 | 8/2002 | McElvain et al. |
| 6,438,738 B1 | 8/2002 | Elayda |
| 6,441,073 B1 | 8/2002 | Tanaka et al. |
| 6,445,211 B1 | 9/2002 | Saripella |
| 6,449,628 B1 | 9/2002 | Wasson |
| 6,449,755 B1 | 9/2002 | Beausang et al. |
| 6,449,761 B1 | 9/2002 | Greidinger et al. |
| 6,452,437 B1 | 9/2002 | Takeuchi et al. |
| 6,452,514 B1 | 9/2002 | Philipp |
| 6,453,175 B2 | 9/2002 | Mizell et al. |
| 6,453,461 B1 | 9/2002 | Chaiken |
| 6,456,304 B1 | 9/2002 | Angiulo et al. |
| 6,457,355 B1 | 10/2002 | Philipp |
| 6,457,479 B1 | 10/2002 | Zhuang et al. |
| 6,460,172 B1 | 10/2002 | Insenser Farre et al. |
| 6,463,488 B1 | 10/2002 | San Juan |
| 6,466,036 B1 | 10/2002 | Philipp |
| 6,466,078 B1 | 10/2002 | Stiff |
| 6,466,898 B1 | 10/2002 | Chan |
| 6,473,069 B1 | 10/2002 | Gerpheide |
| 6,473,825 B1 | 10/2002 | Worley et al. |
| 6,477,691 B1 | 11/2002 | Bergamashi et al. |
| 6,480,921 B1 | 11/2002 | Mansoorian et al. |
| 6,483,343 B1 | 11/2002 | Faith et al. |
| 6,487,700 B1 | 11/2002 | Fukushima |
| 6,489,899 B1 | 12/2002 | Ely et al. |
| 6,490,213 B1 | 12/2002 | Mu et al. |
| 6,492,834 B1 | 12/2002 | Lytle et al. |
| 6,496,969 B2 | 12/2002 | Feng et al. |
| 6,498,720 B2 | 12/2002 | Glad |
| 6,499,134 B1 | 12/2002 | Buffet et al. |
| 6,499,359 B1 | 12/2002 | Washeleski et al. |
| 6,504,403 B2 | 1/2003 | Bangs et al. |
| 6,507,214 B1 | 1/2003 | Snyder |
| 6,507,215 B1 | 1/2003 | Piasecki et al. |
| 6,507,857 B1 | 1/2003 | Yalcinalp |
| 6,509,758 B2 | 1/2003 | Piasecki et al. |
| 6,512,395 B1 | 1/2003 | Lacey et al. |
| 6,516,428 B2 | 2/2003 | Wenzel et al. |
| 6,522,128 B1 | 2/2003 | Ely et al. |
| 6,523,416 B2 | 2/2003 | Takagi et al. |
| 6,525,593 B1 | 2/2003 | Mar |
| 6,526,556 B1 | 2/2003 | Stoica et al. |
| 6,529,791 B1 | 3/2003 | Takagi |
| 6,530,065 B1 | 3/2003 | Mcdonald et al. |
| 6,534,970 B1 | 3/2003 | Ely et al. |
| 6,535,061 B2 | 3/2003 | Darmawaskita et al. |
| 6,535,200 B2 | 3/2003 | Philipp |
| 6,535,946 B1 | 3/2003 | Bryant et al. |
| 6,536,028 B1 | 3/2003 | Katsioulas et al. |
| 6,539,534 B1 | 3/2003 | Bennett |
| 6,542,025 B1 | 4/2003 | Kutz et al. |
| 6,542,844 B1 | 4/2003 | Hanna |
| 6,542,845 B1 | 4/2003 | Grucci et al. |
| 6,546,297 B1 | 4/2003 | Gaston et al. |
| 6,553,057 B1 | 4/2003 | Sha et al. |
| 6,554,469 B1 | 4/2003 | Thomson et al. |
| 6,556,044 B2 | 4/2003 | Langhammer et al. |
| 6,557,164 B1 | 4/2003 | Faustini |
| 6,559,685 B2 | 5/2003 | Green |
| 6,560,306 B1 | 5/2003 | Duffy et al. |
| 6,560,699 B1 | 5/2003 | Konkle |
| 6,563,391 B1 | 5/2003 | Mar |
| 6,564,179 B1 | 5/2003 | Belhaj |
| 6,566,961 B2 | 5/2003 | Dasgupta et al. |
| 6,567,426 B1 | 5/2003 | van Hook et al. |
| 6,567,932 B2 | 5/2003 | Edwards et al. |
| 6,570,557 B1 | 5/2003 | Westerman et al. |
| 6,571,331 B2 | 5/2003 | Henry et al. |
| 6,571,373 B1 | 5/2003 | Devins et al. |
| 6,574,590 B1 | 6/2003 | Kershaw et al. |
| 6,574,739 B1 | 6/2003 | Kung et al. |
| 6,575,373 B1 | 6/2003 | Nakano |
| 6,577,258 B2 | 6/2003 | Ruha et al. |
| 6,578,174 B2 | 6/2003 | Zizzo |
| 6,580,329 B2 | 6/2003 | Sander |
| 6,581,191 B1 | 6/2003 | Schubert et al. |
| 6,587,093 B1 | 7/2003 | Shaw et al. |
| 6,587,995 B1 | 7/2003 | Duboc et al. |
| 6,588,004 B1 | 7/2003 | Southgate et al. |
| 6,590,422 B1 | 7/2003 | Dillon |
| 6,590,517 B1 | 7/2003 | Swanson |
| 6,590,589 B1 | 7/2003 | Sluiman et al. |
| 6,591,369 B1 | 7/2003 | Edwards et al. |
| 6,592,626 B1 | 7/2003 | Bauchot et al. |
| 6,594,796 B1 | 7/2003 | Chiang |
| 6,597,212 B1 | 7/2003 | Wang et al. |
| 6,597,824 B2 | 7/2003 | Newberg et al. |
| 6,598,178 B1 | 7/2003 | Yee et al. |
| 6,600,346 B1 | 7/2003 | Macaluso |
| 6,600,351 B2 | 7/2003 | Bisanti et al. |
| 6,600,575 B1 | 7/2003 | Kohara |
| 6,601,189 B1 | 7/2003 | Edwards et al. |
| 6,601,236 B1 | 7/2003 | Curtis |
| 6,603,330 B1 | 8/2003 | Snyder |
| 6,603,348 B1 | 8/2003 | Preuss et al. |
| 6,604,179 B2 | 8/2003 | Volk et al. |
| 6,606,731 B1 | 8/2003 | Baum et al. |
| 6,608,472 B1 | 8/2003 | Kutz et al. |
| 6,610,936 B2 | 8/2003 | Gillespie et al. |
| 6,611,220 B1 | 8/2003 | Snyder |
| 6,611,276 B1 | 8/2003 | Muratori et al. |
| 6,611,856 B1 | 8/2003 | Liao et al. |
| 6,611,952 B1 | 8/2003 | Prakash et al. |
| 6,613,098 B1 | 9/2003 | Sorge et al. |
| 6,614,260 B1 | 9/2003 | Welch et al. |
| 6,614,320 B1 | 9/2003 | Sullam et al. |
| 6,614,374 B1 | 9/2003 | Gustavsson et al. |
| 6,614,458 B1 | 9/2003 | Lambert et al. |
| 6,615,167 B1 | 9/2003 | Devins et al. |
| 6,617,888 B2 | 9/2003 | Volk |
| 6,618,854 B1 | 9/2003 | Mann |
| 6,621,356 B2 | 9/2003 | Gotz et al. |
| 6,624,640 B2 | 9/2003 | Lund et al. |
| 6,625,765 B1 | 9/2003 | Krishnan |
| 6,628,163 B2 | 9/2003 | Dathe et al. |
| 6,628,311 B1 | 9/2003 | Fang |
| 6,631,508 B1 | 10/2003 | Williams |
| 6,634,008 B1 | 10/2003 | Dole |
| 6,634,009 B1 | 10/2003 | Molson et al. |
| 6,636,096 B2 | 10/2003 | Schaffer et al. |
| 6,636,169 B1 | 10/2003 | Distinti et al. |
| 6,637,015 B1 | 10/2003 | Ogami et al. |
| 6,639,586 B2 | 10/2003 | Gerpheide |
| 6,642,857 B1 | 11/2003 | Schediwy et al. |
| 6,643,151 B1 | 11/2003 | Nebrigic et al. |
| 6,643,810 B2 | 11/2003 | Whetsel |
| 6,649,924 B1 | 11/2003 | Philipp et al. |
| 6,650,581 B2 | 11/2003 | Hong et al. |
| 6,658,498 B1 | 12/2003 | Carney et al. |
| 6,658,633 B1 | 12/2003 | Devins et al. |
| 6,661,288 B2 | 12/2003 | Morgan et al. |
| 6,661,410 B2 | 12/2003 | Casebolt et al. |
| 6,661,724 B1 | 12/2003 | Snyder et al. |
| 6,664,978 B1 | 12/2003 | Kekic et al. |
| 6,664,991 B1 | 12/2003 | Chew et al. |
| 6,667,642 B1 | 12/2003 | Moyal |
| 6,667,740 B2 | 12/2003 | Ely et al. |

| | | |
|---|---|---|
| 6,670,852 B1 | 12/2003 | Hauck |
| 6,671,869 B2 * | 12/2003 | Davidson et al. .............. 716/117 |
| 6,673,308 B2 | 1/2004 | Hino et al. |
| 6,677,814 B2 | 1/2004 | Low et al. |
| 6,677,932 B1 | 1/2004 | Westerman |
| 6,678,645 B1 | 1/2004 | Rajsuman et al. |
| 6,678,877 B1 | 1/2004 | Perry et al. |
| 6,680,632 B1 | 1/2004 | Meyers et al. |
| 6,680,731 B2 | 1/2004 | Gerpheide et al. |
| 6,681,280 B1 | 1/2004 | Miyake et al. |
| 6,681,359 B1 | 1/2004 | Au et al. |
| 6,683,462 B2 | 1/2004 | Shimizu |
| 6,683,930 B1 | 1/2004 | Dalmia |
| 6,686,787 B2 | 2/2004 | Ling |
| 6,686,860 B2 | 2/2004 | Gulati et al. |
| 6,690,224 B1 | 2/2004 | Moore |
| 6,691,193 B1 | 2/2004 | Wang et al. |
| 6,691,301 B2 | 2/2004 | Bowen |
| 6,697,754 B1 | 2/2004 | Alexander |
| 6,701,340 B1 | 3/2004 | Gorecki et al. |
| 6,701,487 B1 | 3/2004 | Ogami et al. |
| 6,701,508 B1 | 3/2004 | Bartz et al. |
| 6,703,961 B2 | 3/2004 | Mueck et al. |
| 6,704,381 B1 | 3/2004 | Moyal et al. |
| 6,704,879 B1 | 3/2004 | Parrish |
| 6,704,889 B2 | 3/2004 | Veenstra et al. |
| 6,704,893 B1 | 3/2004 | Bauwens et al. |
| 6,705,511 B1 | 3/2004 | Dames et al. |
| 6,711,226 B1 | 3/2004 | Williams et al. |
| 6,711,731 B2 | 3/2004 | Weiss |
| 6,713,897 B2 | 3/2004 | Caldwell |
| 6,714,066 B2 | 3/2004 | Gorecki et al. |
| 6,714,817 B2 | 3/2004 | Daynes et al. |
| 6,715,132 B1 | 3/2004 | Bartz et al. |
| 6,717,474 B2 | 4/2004 | Chen et al. |
| 6,718,294 B1 | 4/2004 | Bortfeld |
| 6,718,520 B1 | 4/2004 | Merryman et al. |
| 6,718,533 B1 | 4/2004 | Schneider et al. |
| 6,724,220 B1 | 4/2004 | Snyder et al. |
| 6,725,441 B1 | 4/2004 | Keller et al. |
| 6,728,900 B1 | 4/2004 | Meli |
| 6,728,902 B2 | 4/2004 | Kaiser et al. |
| 6,730,863 B1 | 5/2004 | Gerpheide et al. |
| 6,731,552 B2 | 5/2004 | Perner |
| 6,732,068 B2 | 5/2004 | Sample et al. |
| 6,732,347 B1 | 5/2004 | Camilleri et al. |
| 6,738,858 B1 | 5/2004 | Fernald et al. |
| 6,744,323 B1 | 6/2004 | Moyal et al. |
| 6,745,369 B1 | 6/2004 | May et al. |
| 6,748,569 B1 | 6/2004 | Brooke et al. |
| 6,750,852 B2 | 6/2004 | Gillespie et al. |
| 6,750,876 B1 | 6/2004 | Atsatt et al. |
| 6,750,889 B1 | 6/2004 | Livingston |
| 6,754,723 B2 | 6/2004 | Kato |
| 6,754,765 B1 | 6/2004 | Chang et al. |
| 6,754,849 B2 | 6/2004 | Tamura |
| 6,757,882 B2 | 6/2004 | Chen et al. |
| 6,765,407 B1 | 7/2004 | Snyder |
| 6,768,337 B2 | 7/2004 | Kohno et al. |
| 6,768,352 B1 | 7/2004 | Maher et al. |
| 6,769,622 B1 | 8/2004 | Tournemille et al. |
| 6,771,552 B2 | 8/2004 | Fujisawa |
| 6,781,456 B2 | 8/2004 | Pradhan |
| 6,782,068 B1 | 8/2004 | Wilson et al. |
| 6,784,821 B1 | 8/2004 | Lee |
| 6,785,881 B1 | 8/2004 | Bartz et al. |
| 6,786,221 B2 | 9/2004 | Lane |
| 6,788,116 B1 | 9/2004 | Cook et al. |
| 6,791,377 B2 | 9/2004 | Ilchmann et al. |
| 6,792,584 B1 | 9/2004 | Eneboe et al. |
| 6,798,218 B2 | 9/2004 | Kasperkovitz |
| 6,798,299 B1 | 9/2004 | Mar et al. |
| 6,799,198 B1 | 9/2004 | Huboi et al. |
| 6,806,771 B1 | 10/2004 | Hildebrant et al. |
| 6,806,782 B2 | 10/2004 | Motoyoshi et al. |
| 6,809,275 B1 | 10/2004 | Cheng et al. |
| 6,809,566 B1 | 10/2004 | Xin-LeBlanc |
| 6,810,442 B1 | 10/2004 | Lin et al. |
| 6,815,979 B2 | 11/2004 | Ooshita |
| 6,816,544 B1 | 11/2004 | Bailey et al. |
| 6,817,005 B2 | 11/2004 | Mason et al. |
| 6,819,142 B2 | 11/2004 | Viehmann et al. |
| 6,823,282 B1 | 11/2004 | Snyder |
| 6,823,497 B2 | 11/2004 | Schubert et al. |
| 6,825,689 B1 | 11/2004 | Snyder |
| 6,825,869 B2 | 11/2004 | Bang |
| 6,828,824 B2 | 12/2004 | Betz et al. |
| 6,829,727 B1 | 12/2004 | Pawloski |
| 6,834,384 B2 | 12/2004 | Fiorella, II et al. |
| 6,836,169 B2 | 12/2004 | Richmond et al. |
| 6,839,774 B1 | 1/2005 | Ahn et al. |
| 6,842,710 B1 | 1/2005 | Gehring et al. |
| 6,847,203 B1 | 1/2005 | Conti et al. |
| 6,850,117 B2 | 2/2005 | Weber et al. |
| 6,850,554 B1 | 2/2005 | Sha et al. |
| 6,853,598 B2 | 2/2005 | Chevallier |
| 6,854,067 B1 | 2/2005 | Kutz et al. |
| 6,856,433 B2 | 2/2005 | Hatano et al. |
| 6,859,884 B1 | 2/2005 | Sullam |
| 6,862,240 B2 | 3/2005 | Burgan |
| 6,864,710 B1 | 3/2005 | Lacey et al. |
| 6,865,429 B1 | 3/2005 | Schneider et al. |
| 6,865,504 B2 | 3/2005 | Larson et al. |
| 6,868,500 B1 | 3/2005 | Kutz et al. |
| 6,871,253 B2 | 3/2005 | Greeff et al. |
| 6,871,331 B1 | 3/2005 | Bloom et al. |
| 6,873,203 B1 | 3/2005 | Latham, II et al. |
| 6,873,210 B2 | 3/2005 | Mulder et al. |
| 6,876,941 B2 | 4/2005 | Nightingale |
| 6,880,086 B2 | 4/2005 | Kidder et al. |
| 6,888,453 B2 | 5/2005 | Lutz et al. |
| 6,888,538 B2 | 5/2005 | Ely et al. |
| 6,892,310 B1 | 5/2005 | Kutz et al. |
| 6,892,322 B1 | 5/2005 | Snyder |
| 6,893,724 B2 | 5/2005 | Lin et al. |
| 6,894,928 B2 | 5/2005 | Owen |
| 6,897,390 B2 | 5/2005 | Caldwell et al. |
| 6,898,703 B1 | 5/2005 | Ogami et al. |
| 6,900,663 B1 | 5/2005 | Roper et al. |
| 6,901,014 B2 | 5/2005 | Son et al. |
| 6,901,563 B1 | 5/2005 | Ogami et al. |
| 6,903,613 B1 | 6/2005 | Mitchell et al. |
| 6,910,126 B1 | 6/2005 | Mar et al. |
| 6,911,857 B1 | 6/2005 | Stiff |
| 6,917,661 B1 | 7/2005 | Scott et al. |
| 6,922,821 B1 | 7/2005 | Nemecek |
| 6,924,668 B2 | 8/2005 | Muller et al. |
| 6,934,674 B1 | 8/2005 | Douezy et al. |
| 6,937,075 B2 | 8/2005 | Lim et al. |
| 6,940,356 B2 | 9/2005 | Mcdonald, II et al. |
| 6,941,336 B1 | 9/2005 | Mar |
| 6,941,356 B2 | 9/2005 | Meyerson |
| 6,941,538 B2 | 9/2005 | Hwang et al. |
| 6,944,018 B2 | 9/2005 | Caldwell |
| 6,949,984 B2 | 9/2005 | Siniscalchi |
| 6,950,954 B1 | 9/2005 | Sullam et al. |
| 6,950,990 B2 | 9/2005 | Rajarajan et al. |
| 6,952,778 B1 | 10/2005 | Snyder |
| 6,954,511 B2 | 10/2005 | Tachimori |
| 6,954,904 B2 | 10/2005 | White |
| 6,956,419 B1 | 10/2005 | Mann et al. |
| 6,957,180 B1 | 10/2005 | Nemecek |
| 6,957,242 B1 | 10/2005 | Snyder |
| 6,961,686 B2 | 11/2005 | Kodosky et al. |
| 6,963,233 B2 | 11/2005 | Puccio et al. |
| 6,963,908 B1 | 11/2005 | Lynch et al. |
| 6,966,039 B1 | 11/2005 | Bartz et al. |
| 6,967,511 B1 | 11/2005 | Sullam |
| 6,967,960 B1 | 11/2005 | Bross et al. |
| 6,968,346 B2 | 11/2005 | Hekmatpour |
| 6,970,844 B1 | 11/2005 | Bierenbaum |
| 6,971,004 B1 | 11/2005 | Pleis et al. |
| 6,973,400 B2 | 12/2005 | Cahill-O'Brien et al. |
| 6,980,060 B2 | 12/2005 | Boerstler et al. |
| 6,981,090 B1 | 12/2005 | Kutz et al. |
| 6,988,192 B2 | 1/2006 | Snider |
| 6,996,799 B1 | 2/2006 | Cismas et al. |
| 7,003,732 B1 | 2/2006 | Zhaksilikov |

| | | | | | | |
|---|---|---|---|---|---|---|
| 7,005,933 B1 | 2/2006 | Shutt | 7,323,879 B2 | 1/2008 | Kuo et al. | |
| 7,009,444 B1 | 3/2006 | Scott | 7,324,380 B1 | 1/2008 | Negut et al. | |
| 7,010,773 B1 | 3/2006 | Bartz et al. | 7,337,407 B1 | 2/2008 | Ogami et al. | |
| 7,015,735 B2 | 3/2006 | Kimura et al. | 7,342,405 B2 | 3/2008 | Eldridge et al. | |
| 7,017,145 B2 | 3/2006 | Taylor | 7,358,714 B2 | 4/2008 | Watanabe et al. | |
| 7,020,854 B2 | 3/2006 | Killian et al. | 7,367,017 B2 | 4/2008 | Maddocks et al. | |
| 7,023,257 B1 | 4/2006 | Sullam | 7,373,437 B2 | 5/2008 | Seigneret et al. | |
| 7,024,636 B2 | 4/2006 | Weed | 7,376,001 B2 | 5/2008 | Joshi et al. | |
| 7,024,654 B2 | 4/2006 | Bersch et al. | 7,376,904 B2 | 5/2008 | Cifra et al. | |
| 7,030,656 B2 | 4/2006 | Lo et al. | 7,386,740 B2 | 6/2008 | Kutz et al. | |
| 7,030,688 B2 | 4/2006 | Dosho et al. | 7,392,011 B1 | 6/2008 | Jacomb-Hood | |
| 7,034,603 B2 | 4/2006 | Brady et al. | 7,400,183 B1 | 7/2008 | Sivadasan et al. | |
| 7,042,301 B2 | 5/2006 | Sutardja | 7,406,674 B1 | 7/2008 | Ogami et al. | |
| 7,047,166 B2 | 5/2006 | Dancea | 7,418,608 B2 | 8/2008 | Kumar et al. | |
| 7,055,035 B2 | 5/2006 | Allison et al. | 7,421,251 B2 | 9/2008 | Westwick et al. | |
| 7,058,921 B1 | 6/2006 | Hwang et al. | 7,437,692 B2 | 10/2008 | Oberlaender | |
| 7,073,158 B2 | 7/2006 | Mccubbrey | 7,461,274 B2 | 12/2008 | Merkin | |
| 7,076,420 B1 | 7/2006 | Snyder et al. | 7,542,533 B2 | 6/2009 | Jasa et al. | |
| 7,079,166 B1 | 7/2006 | Hong | 7,554,847 B2 | 6/2009 | Lee | |
| 7,082,584 B2 | 7/2006 | Lahner et al. | 7,809,545 B2 | 10/2010 | Ciolfi et al. | |
| 7,086,014 B1 | 8/2006 | Bartz et al. | 8,065,653 B1 * | 11/2011 | Best et al. | 716/139 |
| 7,088,166 B1 | 8/2006 | Reinschmidt et al. | 8,078,894 B1 | 12/2011 | Ogami | |
| 7,089,175 B1 | 8/2006 | Nemecek et al. | 8,266,575 B1 | 9/2012 | Ogami et al. | |
| 7,091,713 B2 | 8/2006 | Erdelyi et al. | 2001/0002129 A1 | 5/2001 | Zimmerman et al. | |
| 7,092,980 B1 | 8/2006 | Mar et al. | 2001/0010083 A1 | 7/2001 | Satoh | |
| 7,099,818 B1 | 8/2006 | Nemecek et al. | 2001/0038392 A1 | 11/2001 | Humpleman et al. | |
| 7,100,133 B1 | 8/2006 | Meiyappan et al. | 2001/0043081 A1 | 11/2001 | Rees | |
| 7,100,139 B1 * | 8/2006 | Anderson et al. ............ 716/117 | 2001/0044927 A1 | 11/2001 | Karniewicz | |
| 7,103,108 B1 | 9/2006 | Beard | 2001/0045861 A1 | 11/2001 | Bloodworth et al. | |
| 7,113,090 B1 | 9/2006 | Saylor et al. | 2001/0047509 A1 | 11/2001 | Mason et al. | |
| 7,117,485 B2 | 10/2006 | Wilkinson et al. | 2002/0010716 A1 | 1/2002 | Mccartney et al. | |
| 7,119,550 B2 | 10/2006 | Kitano et al. | 2002/0016706 A1 | 2/2002 | Cooke et al. | |
| 7,119,602 B2 | 10/2006 | Davis | 2002/0023110 A1 | 2/2002 | Fortin et al. | |
| 7,124,376 B2 | 10/2006 | Zaidi et al. | 2002/0042696 A1 | 4/2002 | Garcia et al. | |
| 7,127,630 B1 | 10/2006 | Snyder | 2002/0052729 A1 | 5/2002 | Kyung et al. | |
| 7,129,793 B2 | 10/2006 | Gramegna | 2002/0059543 A1 | 5/2002 | Cheng et al. | |
| 7,129,873 B2 | 10/2006 | Kawamura | 2002/0065646 A1 | 5/2002 | Waldie et al. | |
| 7,132,835 B1 | 11/2006 | Arcus | 2002/0068989 A1 | 6/2002 | Ebisawa et al. | |
| 7,138,841 B1 | 11/2006 | Li et al. | 2002/0073119 A1 | 6/2002 | Richard | |
| 7,138,868 B2 | 11/2006 | Sanchez et al. | 2002/0073380 A1 | 6/2002 | Cooke | |
| 7,139,530 B2 | 11/2006 | Kusbel | 2002/0080186 A1 | 6/2002 | Frederiksen | |
| 7,143,360 B1 | 11/2006 | Ogami et al. | 2002/0085020 A1 | 7/2002 | Carroll | |
| 7,149,316 B1 | 12/2006 | Kutz et al. | 2002/0099863 A1 | 7/2002 | Comeau et al. | |
| 7,150,002 B1 | 12/2006 | Anderson et al. | 2002/0109722 A1 | 8/2002 | Rogers et al. | |
| 7,152,027 B2 | 12/2006 | Andreade et al. | 2002/0116168 A1 | 8/2002 | Kim | |
| 7,154,294 B2 | 12/2006 | Liu et al. | 2002/0121679 A1 | 9/2002 | Bazarjani et al. | |
| 7,161,936 B1 | 1/2007 | Barrass et al. | 2002/0122060 A1 | 9/2002 | Markel | |
| 7,162,410 B1 | 1/2007 | Nemecek et al. | 2002/0129334 A1 | 9/2002 | Dane et al. | |
| 7,171,455 B1 | 1/2007 | Gupta et al. | 2002/0133771 A1 | 9/2002 | Barnett | |
| 7,176,701 B2 | 2/2007 | Wachi et al. | 2002/0133794 A1 | 9/2002 | Kanapathippillai et al. | |
| 7,178,096 B2 | 2/2007 | Rangan et al. | 2002/0138516 A1 | 9/2002 | Igra | |
| 7,180,342 B1 | 2/2007 | Shutt et al. | 2002/0144099 A1 | 10/2002 | Muro et al. | |
| 7,185,162 B1 | 2/2007 | Snyder | 2002/0145433 A1 | 10/2002 | Morrise et al. | |
| 7,185,321 B1 | 2/2007 | Roe et al. | 2002/0152234 A1 | 10/2002 | Estrada et al. | |
| 7,188,063 B1 | 3/2007 | Snyder | 2002/0152449 A1 | 10/2002 | Lin | |
| 7,193,901 B2 | 3/2007 | Ruby et al. | 2002/0156885 A1 | 10/2002 | Thakkar | |
| 7,199,783 B2 | 4/2007 | Wenstrand et al. | 2002/0156998 A1 | 10/2002 | Casselman | |
| 7,200,507 B2 | 4/2007 | Chen et al. | 2002/0161802 A1 | 10/2002 | Gabrick et al. | |
| 7,206,733 B1 | 4/2007 | Nemecek | 2002/0166100 A1 | 11/2002 | Meding | |
| 7,221,187 B1 | 5/2007 | Snyder et al. | 2002/0174134 A1 | 11/2002 | Goykhman | |
| 7,227,389 B2 | 6/2007 | Gong et al. | 2002/0174411 A1 | 11/2002 | Feng et al. | |
| 7,236,921 B1 | 6/2007 | Nemecek et al. | 2003/0011639 A1 | 1/2003 | Webb | |
| 7,250,825 B2 | 7/2007 | Wilson et al. | 2003/0014447 A1 | 1/2003 | White | |
| 7,256,588 B2 | 8/2007 | Howard et al. | 2003/0025734 A1 | 2/2003 | Boose et al. | |
| 7,265,633 B1 | 9/2007 | Stiff | 2003/0033586 A1 | 2/2003 | Alexander | |
| 7,266,768 B2 | 9/2007 | Ferlitsch et al. | 2003/0041235 A1 | 2/2003 | Meyer | |
| 7,281,846 B2 | 10/2007 | Mcleod | 2003/0056071 A1 | 3/2003 | Triece et al. | |
| 7,282,905 B2 | 10/2007 | Chen et al. | 2003/0058469 A1 | 3/2003 | Buis et al. | |
| 7,283,151 B2 | 10/2007 | Nihei et al. | 2003/0061572 A1 | 3/2003 | McClannahan et al. | |
| 7,283,410 B2 | 10/2007 | Hsu et al. | 2003/0066057 A1 | 4/2003 | Rudusky | |
| 7,287,112 B1 | 10/2007 | Pleis et al. | 2003/0086300 A1 | 5/2003 | Noyes et al. | |
| 7,290,244 B2 | 10/2007 | Peck et al. | 2003/0097640 A1 | 5/2003 | Abrams et al. | |
| 7,295,049 B1 | 11/2007 | Moyal et al. | 2003/0105620 A1 | 6/2003 | Bowen | |
| 7,299,307 B1 * | 11/2007 | Early et al. .................... 710/33 | 2003/0110464 A1 | 6/2003 | Davidson et al. | |
| 7,301,835 B2 | 11/2007 | Joshi et al. | 2003/0126947 A1 | 7/2003 | Margaria | |
| 7,305,510 B2 | 12/2007 | Miller | 2003/0135842 A1 | 7/2003 | Frey et al. | |
| 7,307,485 B1 | 12/2007 | Snyder et al. | 2003/0149961 A1 | 8/2003 | Kawai et al. | |
| 7,308,608 B1 | 12/2007 | Pleis et al. | 2003/0229482 A1 | 12/2003 | Cook et al. | |
| 7,312,616 B2 | 12/2007 | Snyder | 2004/0018711 A1 | 1/2004 | Madurawe | |

| | | | |
|---|---|---|---|
| 2004/0054821 A1 | 3/2004 | Warren et al. | |
| 2004/0153802 A1 | 8/2004 | Kudo et al. | |
| 2004/0205553 A1 | 10/2004 | Hall et al. | |
| 2004/0205617 A1 | 10/2004 | Light | |
| 2004/0205695 A1 | 10/2004 | Fletcher | |
| 2004/0221249 A1 | 11/2004 | Lahner et al. | |
| 2005/0143968 A9 | 6/2005 | Odom et al. | |
| 2005/0240917 A1 | 10/2005 | Wu | |
| 2005/0248534 A1 | 11/2005 | Kehlstadt | |
| 2005/0280453 A1 | 12/2005 | Hsieh | |
| 2006/0015862 A1 | 1/2006 | Odom et al. | |
| 2006/0031768 A1 | 2/2006 | Shah et al. | |
| 2007/0050644 A1 | 3/2007 | Merkin | |
| 2007/0139074 A1 | 6/2007 | Reblewski | |
| 2008/0086668 A1 | 4/2008 | Jefferson et al. | |
| 2008/0095213 A1 | 4/2008 | Lin et al. | |
| 2008/0178143 A1 | 7/2008 | Dougan et al. | |
| 2008/0186052 A1 | 8/2008 | Needham et al. | |
| 2008/0259996 A1 | 10/2008 | Venkataraman et al. | |
| 2008/0294806 A1 | 11/2008 | Swindle et al. | |
| 2010/0023865 A1 | 1/2010 | Fulker et al. | |

FOREIGN PATENT DOCUMENTS

| | | | |
|---|---|---|---|
| EP | 368398 A1 | 5/1990 | |
| EP | 0450863 A | 10/1991 | |
| EP | 0499383 A | 8/1992 | |
| EP | 0639816 A1 | 2/1995 | |
| EP | 0639816 A2 | 2/1995 | |
| EP | 1170671 A | 1/2002 | |
| EP | 1191423 A | 3/2002 | |
| EP | 1205848 A1 | 5/2002 | |
| JP | 4083405 A | 3/1992 | |
| JP | 4095408 A | 3/1992 | |
| JP | 5055842 A | 3/1993 | |
| JP | 6021732 A | 1/1994 | |
| WO | 9532478 A1 | 11/1995 | |
| WO | PCTUS9617305 A1 | 6/1996 | |
| WO | PCTUS9834376 A1 | 8/1998 | |
| WO | PCTUS9909712 A1 | 2/1999 | |

OTHER PUBLICATIONS

USPTO U.S. Appl. No. 10/001,478: "In-Circuit Emulator and POD Synchronized Boot," Nemecek et al., filed Nov. 1, 2001; 44 pages.

USPTO U.S. Appl. No. 10/001,568:"Combined In-Circuit Emulator and Programmer," Nemecek et al., filed Nov. 1, 2001; 47 pages.

USPTO U.S. Appl. No. 10/002,217: "Conditional Branching in an In-Circuit Emulation System," Craig Nemecek, filed Nov. 1, 2001, 43 pages.

USPTO U.S. Appl. No. 10/004,039: "In-Circuit Emulator with Gatekeeper for Watchdog Timer," Nemecek et al., filed Nov. 14, 2001; 46 pages.

USPTO U.S. Appl. No. 10/004,197: "In-Circuit Emulator with Gatekeeper Based Halt Control," Nemecek et al., filed Nov. 14, 2001; 47 pages.

USPTO U.S. Appl. No. 10/011,214: "Method and Circuit for Synchronizing a Write Operation between an On-Chip Microprocessor and an On-Chip Programmable Analog Device Operating at Different Frequencies," Sullam et al., filed Oct. 25, 2001; 49 pages.

USPTO U.S. Appl. No. 10/083,442: "Method/Architecture for a Low Gain PLL with Wide Frequency Range," Meyers et al., filed Feb. 26, 2002; 28 pages.

USPTO U.S. Appl. No. 10/109,979: "Graphical user interface with logic unifying functions." Anderson et al., filed Mar. 29, 2002; 100 pages.

USPTO U.S. Appl. No. 10/113,064: "Method and System for Debugging through Supervisory Operating Codes and Self Modifying Codes," Roe et al., filed Mar. 29, 2002; 36 pages.

USPTO U.S. Appl. No. 10/113,065: "System and Mehod for Automatically matching Components in a Debugging System," Nemecek et al., filed Mar. 29, 2002; 32 pages.

USPTO U.S. Appl. No. 10/226,911: "Calibration of Integrated Circuit Time Constants," Gehring et al.; filed Aug. 22, 2002: 32 pages.

USPTO U.S. Appl. No. 10/272,231, "Digital Configurable Macro Architecture," Warren Snyder. filed Oct. 15, 2002; 36 pages.

USPTO U.S. Appl. No. 10/288,003: "Low Voltage Differential Signal Driver Circuit and Method," Roper et al., filed Nov. 4, 2002; 30 pages.

USPTO U.S. Appl. No. 10/293,392: "Low Voltage Receiver Circuit and Method for Shifting the Differential Input Signals of the Receiver Depending on a Common Mode Voltage of the Input Signals," Maher et al., filed Nov. 13, 2002; 23 pages.

USPTO U.S. Appl. No. 10/305,589: "Current Controlled Delay Circuit," Jonathon Stiff, filed Nov. 26, 2002; 24 pages.

USPTO U.S. Appl. No. 10/324,455: "Programmable Oscillator Scheme," Mar et al., filed Dec. 20, 2002; 23 pages.

USPTO U.S. Appl. No. 10/327,217: "Single Ended Clock Signal Generator Having a Differential Output," Richmond et al., filed Dec. 20, 2002; 27 pages.

USPTO U.S. Appl. No. 10/803,030: "Programmable Microcontrollable Architecture (Mixed Analog/Digital)," Snyder et al., filed Mar. 16, 2004; 40 pages.

USPTO U.S. Appl. No. 10/871,582: "LVD Input Circuit with Extended Common Mode Range," Reinschmidt et al., filed Jun. 17, 2004; 25 pages.

USPTO U.S. Appl. No. 11/125,554: "A Method for a Efficient Supply to a Microcontroller," Kutz et al., filed May 9, 2005; 41 pages.

USPTO U.S. Appl. No. 11/132,894: "Open Loop Bandwidth Test Architecture and Method for Phase Locked Loop (PLL)," Jonathon Stiff, filed May 19, 2005; 38 pages.

USPTO U.S. Appl. No. 11/201,922: "Design model for a hardware device-independent method of defining embedded firmware for programmable systems," McDonald et al., filed Aug. 10, 2005 31 pages.

USPTO U.S. Appl. No. 11/273,708: "Capacitance Sensor Using Relaxation Oscillators," Snyder et al., filed Nov. 14, 2005; 33 pages.

USPTO U.S. Appl. No. 11/322,044: "Split charge pump PLL architecture," Jonathon Stiff, filed Dec. 28, 2005; 19 pages.

USPTO U.S. Appl. No. 11/337,272: "Successive Approximate Capacitance Measurement Circuit," Warren Snyder, filed Jan. 20, 2006 29 pages.

USPTO U.S. Appl. No. 11/415,588: "Voltage Controlled Oscillator Delay Cell and Method," Sivadasan et al., filed May 1, 2006; 24 pages.

USPTO U.S. Appl. No. 11/644,100: "Differential-to-single ended signal converter circuit and method:" Jonathon Stiff, filed Dec. 21, 2006: 33 pages.

USPTO U.S. Appl. No. 11/698,660: "Configurable Bus," Kutz et al., filed Jan. 25, 2007; 35 pages.

USPTO U.S. Appl. No. 11/709,866: "Input/Output. Multiplexer Bus," Dennis Sequine, filed Feb. 21, 2007; 33 pages.

USPTO U.S. Appl. No. 11/850,260: "Circuit and Method for Improving the Accuracy of a Crystal-less Oscillator Having Dual-Frequency Modes," Wright et al., filed Sep. 5, 2007; 33 pages.

USPTO U.S. Appl. No. 11/983,291: "Successive Approximate Capacitance Measurement Circuit," Warren Snyder, filed Nov. 7, 2007; 26 pages.

USPTO U.S. Appl. No. 12/132,527: "System and Method for Performing Next Placements and Pruning of Disallowed Placements for Programming an Integrated Circuit;" Ogami et al., filed Jun. 3, 2008; 44 pages.

USPTO U.S. Appl. No. 12/218,404: "Voltage Controlled Oscillator Delay Cell and Method," Sivadasan et al., filed Jul. 14, 2008; 23 pages.

USPTO *Ex Parte Qualyle* Action for U.S. Appl. No. 09/992,076 dated Jun. 18, 2007; 6 pages.

USPTO *Ex Parte Quayle* Action for U.S. Appl. No. 09/975,115 dated Aug. 20, 2009; 7 pages.

USPTO Final Rejection for U.S. Appl. No. 09/975,105 dated Jul. 13, 2006; 7 pages.

USPTO Final Rejection for U.S. Appl. No. 09/975,115 dated Feb. 21, 2007, 25 pages.

USPTO Final Rejection for U.S. Appl. No. 09/975,115 dated May 12, 2008; 33 pages.

USPTO Final Rejection for U.S. Appl. No. 09/975,115 dated Jun. 23, 2006; 20 pages.

USPTO Final Rejection for U.S. Appl. No. 09/989,765 dated Mar. 31, 2009; 18 pages.

USPTO Final Rejection for U.S. Appl. No. 09/989,765 dated Apr. 3, 2007; 12 pages.
USPTO Final Rejection for U.S. Appl. No. 09/989,765 dated Apr. 4, 2008; 16 pages.
USPTO Final Rejection for U.S. Appl. No. 09/989,765 dated Apr. 17, 2006; 12 pages.
USPTO Final Rejection for U.S. Appl. No. 09/989,767 dated Jan. 11, 2007; 12 pages.
USPTO Final Rejection for U.S. Appl. No. 09/989,767 dated Jan. 15, 2009; 21 pages.
USPTO Final Rejection for U.S. Appl. No. 09/989,767 dated Apr. 6, 2005; 13 pages.
USPTO Final Rejection for U.S. Appl. No. 09/989,767 dated Dec. 27, 2007; 21 pages.
USPTO Final Rejection for U.S. Appl. No. 09/989,771 dated Feb. 27, 2007, 8 pages.
USPTO Final Rejection for 09/989,771 dated Mar. 28, 2006, 9 pages.
USPTO Notice of Allowance for U.S. Appl. No. 09/989,762 dated Jul. 16, 2009; 6 pages.
USPTO Notice of Allowance for U.S. Appl. No. 09/989,762 dated Oct. 30, 2009; 6 pages.
USPTO Notice of Allowance for U.S. Appl. No. 09/989,765 dated Mar. 31, 2010; 8 pages.
USPTO Notice of Allowance for U.S. Appl. No. 09/989.765 dated Sep. 3, 2009; 7 pages.
USPTO Notice of Allowance for U.S. Appl. No. 09/989,765 dated Dec. 22, 2009; 8 pages.
USPTO Notice of Allowance for U.S. Appl. No. 09/989,777 dated Jan. 15, 2010; 8 pages.
USPTO Notice of Allowance for U.S. Appl. No. 09/989,777 dated Aug. 6, 2009; 8 pages.
USPTO Notice of Allowance for U.S. Appl. No. 09/989,777 dated Mar. 9, 2009; 7 pages.
USPTO Notice of Allowance for U.S. Appl. No. 09/989,808 dated Feb. 13, 2006; 4 pages.
USPTO Notice of Allowance for U.S. Appl. No. 09/989,817 dated May 9, 2005; 6 pages.
USPTO Notice of Allowance for U.S. Appl. No. 09/989,819 dated Jan. 11, 2005; 7 pages.
USPTO Notice of Allowance for U.S. Appl. No. 09/992,076 dated Feb. 27, 2009; 6 pages.
USPTO Notice of Allowance for U.S. Appl. No. 09/994,600 dated Jan. 4, 2010; 4 pages.
USPTO Notice of Allowance for U.S. Appl. No. 09/994,600 dated Apr. 3, 2009: 5 pages.
USPTO Notice of Allowance for U.S. Appl. No. 09/994,600 dated Aug. 25, 2009; 4 pages.
USPTO Notice of Allowance for U.S. Appl. No. 09/998,848 dated Oct. 13, 2010; 4 pages.
USPTO Notice of Allowance for U.S. Appl. No. 10/001,477 dated Mar. 23, 2010; 6 pages.
USPTO Notice of Allowance for U.S. Appl. No. 10/001,477 dated Aug. 26, 2009; 6 pages.
USPTO Notice of Allowance for U.S. Appl. No. 10/001,477 dated Dec. 4, 2009; 7 pages.
USPTO Notice of Allowance for U.S. Appl. No. 10/001,477 dated May 8, 2009; 6 pages.
USPTO Notice of Allowance for U.S. Appl. No. 10/001,478 dated Jun. 2, 2010; 11 pages.
USPTO Notice of Allowance for U.S. Appl. No. 10/001,568 dated Mar. 17, 2006; 9 pages.
USPTO Notice of Allowance for U.S. Appl. No. 10/002,217 dated Oct. 14, 2008.
USPTO Notice of Allowance for U.S. Appl. No. 10/002,217 dated Jan. 11, 2010; 7 pages.
USPTO Notice of Allowance for U.S. Appl. No. 10/002,217 dated Jun. 8, 2009; 8 pages.
USPTO Notice of Allowance for U.S. Appl. No. 10/002,217 dated Sep. 17, 2009; 6 pages.
USPTO Notice of Allowance for U.S. Appl. No. 10/002,726 dated Feb. 6, 2007; 7 pages.
USPTO Notice of Allowance for U.S. Appl. No. 10/004,039 dated Aug. 15, 2006; 7 pages.
USPTO Notice of Allowance for U.S. Appl. No. 10/004,197 dated Feb. 9, 2007; 7 pages.
USPTO Notice of Allowance for U.S. Appl. No. 10/004,197 dated Oct. 6, 2006; 7 pages.
USPTO Notice of Allowance for U.S. Appl. No. 10/008,096 dated Feb. 1, 2010; 6 pages.
USPTO Notice of Allowance for U.S. Appl. No. 10/008,096 dated Jun. 5, 2009; 12 pages.
USPTO Notice of Allowance for U.S. Appl. No. 10/008,096 dated Oct. 21, 2009; 6 pages.
USPTO Notice of Allowance for U.S. Appl. No. 10/011,214 dated Apr. 11, 2005; 4 pages.
USPTO Notice of Allowance for U.S. Appl. No. 10/024,093 dated Sep. 10, 2002; 3 pages.
USPTO Notice of Allowance for U.S. Appl. No. 10/033,027 dated Feb. 18, 2010; 4 pages.
USPTO Notice of Allowance for U.S. Appl. No. 10/033,027 dated Sep. 2, 2009; 4 pages.
USPTO Notice of Allowance for U.S. Appl. No. 10/109,979 dated Mar. 14, 2006; 6 pages.
USPTO Notice of Allowance for U.S. Appl. No. 10/113,064 dated Sep. 21, 2006; 7 pages.
USPTO Notice of Allowance for U.S. Appl. No. 10/113,581 dated Mar. 5, 2010; 9 pages.
USPTO Notice of Allowance for U.S. Appl. No. 10/113,581 dated Sep. 3, 2010; 11 pages.
USPTO Notice of Allowance for U.S. Appl. No. 10/118,682 dated Apr. 3, 2006; 4 pages.
USPTO Notice of Allowance for U.S. Appl. No. 10/137,497 dated Jan. 24, 2007; 12 pages.
USPTO Notice of Allowance for U.S. Appl. No. 10/137,497 dated Jul. 20, 2007; 4 pages.
USPTO Notice of Allowance for U.S. Appl. No. 10/226,911 dated Aug. 20, 2004; 4 pages.
USPTO Notice of Allowance for U.S. Appl. No. 10/238,966 dated Feb. 1, 2010; 4 pages.
USPTO Notice of Allowance for U.S. Appl. No. 10/238,966 dated Aug. 5, 2009; 5 pages.
USPTO Notice of Allowance for U.S. Appl. No. 10/256,829 dated May 10, 2010; 4 pages.
USPTO Notice of Allowance for U.S. Appl. No. 10/256,829 dated Oct. 29, 2007; 6 pages.
USPTO Notice of Allowance for U.S. Appl. No. 10/272,231 dated Mar. 8, 2004: 6 pages.
USPTO Notice of Allowance for U.S. Appl. No. 12/058,569 dated Aug. 3, 2011; 7 pages.
USPTO Notice of Allowance for U.S. Appl. No. 12/058,569 dated Dec. 13, 2010; 6 pages.
USPTO Notice of Allowance for U.S. Appl. No. 12/060,128 dated Oct. 19, 2009; 8 pages.
USPTO Notice of Allowance for U.S. Appl. No. 12/070,547 dated Feb. 24, 2010; 4 pages.
USPTO Notice of Allowance for U.S. Appl. No. 12/104,672 dated Jan. 11, 2010; 7 pages.
USPTO Notice of Allowance for U.S. Appl. No. 12/218,404 dated Feb. 16, 2010; 7 pages.
USPTO Notice of Allowance for Appl. No. 12/218,404 dated Mar. 19, 2009; 7 pages.
USPTO Notice of Allowance for U.S. Appl. No. 12/218,404 dated Jul. 10, 2009; 7 pages.
USPTO Notice of Allowance for U.S. Appl. No. 12/218,404 dated Nov. 3, 2009, 8 pages.
USPTO Notice of Allowance for U.S. Appl. No. 13/171,061 dated Nov. 29, 2012; 7 pages.
USPTO Requirement for Restriction for U.S. Appl. No. 11/985,340 dated Mar. 16, 2009; 7 pages.
USPTO Requirement for Restriction/Election for U.S. Appl. No. 09/969,313 dated Mar. 18, 2005; 6 pages.
USPTO Requirement for Restriction/Election for U.S. Appl. No. 09/972,003 dated May 6, 2004; 4 pages.
USPTO Requirement for Restriction/Election for U.S. Appl. No. 11/337,272 dated Sep. 11, 2006; 5 pages.

USPTO Requirement for Restriction/Election for U.S. Appl. No. 11/818,005 dated Jul. 14, 2009; 5 pages.
USPTO Requirement for Restrictions for U.S. Appl. No. 12/004,833 dated Sep. 22, 2010; 6 pages.
USPTO Requirement Restriction for U.S. Appl. No. 10/118,682 dated Apr. 28, 2005; 4 pages.
USPTO Requirement Restriction for U.S. Appl. No. 12/004,833 dated Sep. 22, 2010; 6 pages.
Van Ess, David; "Simulating a 555 Timer with PSoC," Cypress Semiconductor Corporation, Application Note AN2286, May 19, 2005; 10 pages.
Varma et al., "A Structured Test Re-Use Methodology for Core-Based System Chips," IEEE, 1998; 9 pages.
Vixel, "InSpeed SOC 320 Embedded Storage Switch," 2003, Vixel, pp. 1-5; 5 pages.
Wang, et al. "Synthesizing Operating System Based Device Drivers in Embedded Systems," Oct. 1-3, 2003; ACM, pp, 37-44; 8 pages.
Wikipedia—Main Page, retrieved on Mar. 8. 2006 from http://en.wikipedia.org/wiki/Main_Page and http://en.wikipedia.org/wiki/Wikipedi:Introduction; 5 pages.
Wikipedia—Processor register. retrieved on Mar. 7, 2006 from http://en.wikipedia.org/wiki/Processor_register; 4 pages.
Wikipedia "XML" retrieved on Jan. 29, 2007 from http://en.wikipedia.org/wiki/XML; 16 pages.
Wikipedia.org; "Von Neumann architecture"; retrieved from http://en.wikipedia.org/wiki/Von_Neumann_architecture on Jan. 22, 2007; 4 pages.
Written Opinion of the International Search Authority for International Application No. PCT/US08/60680 dated Aug. 15, 2008; 4 pages.
Written Opinion of the International Searching Authority for International Application No. PCT/US08/60681 dated Sep. 12, 2008; 4 pages.
Written Opinion of the International Searching Authority for International Application No. PCT/US08/60695 mailed Jul. 22, 2009; 6 pages.
Written Opinion of the International Searching Authority for International Application No. PCT/US08/60696 mailed Sep. 22, 2008; 4 pages.
Xerox, "Mesa Debugger Documentation," Apr. 1979; Xerox Systems Development Department; Version 5.0, pp. 1-30; 33 pages.
Xilinx, Virtex-II Pro Platform FPGA Developer's Kit, "How Data2BRAM Fits in with Hardware and Software Flows," Chapter 2: Using Data2BRAM; Jan. 2003 Release; 2 pages.
Yoo et al "Fast Hardware-Software Coverification by Optimistic Execution of Real Processor, Proceedings of Design, Automation and Test in Europe Conference and Exhibition," Mar. 2000, pp. 663-668; 6 pages.
York et al., "On-chip Support Needed for SOC Debug," Electronic Engineering Times, Jun. 1999, pp. 104, 110; 2 pages.
Zorian et al., "Testing Embedded-Core Based System Chips," IEEE, 1998; 14 pages.
Zorian, "Test Requirements for Embedded Core-based Systems and IEEE P1500," IEEE, 1997; 9 pages.
U.S. Appl. No. 13/178,504 "Power Management Architecture, Method and Configuration System," Kenneth Y. Ogami et al., filed Jul. 8, 2011; 41 pages.
U.S. Appl. No. 13/586:648 "Systems and methods for dynamically reconfiguring a programmable system on a chip," Kenneth Y. Ogami et al., filed Aug. 15, 2012; 49 pages.
U.S. Appl. No. 60/926,096 "Novel features for PSOC design tool," Andrew Best et al., filed Apr. 25, 2007; 58 pages.
Ashok Bindra, "Programmable SoC Delivers a New Level of System Flexibilty"; Electronic Design; Nov. 6, 2000; 11 pages.
Atmel Corporation: AT90SC Summary: "Secure Microcontrollers for Smart Cards," Oct. 1999; 7 pages.
Azim et at: "A Custom DSP Chip to Implement a Robot Motion Controller Proceedings of the IEEE Custom Integrated Circuits Conference," May 1988, pp, 8.7.1-8.7.5; 6 pages.
Bakker et al., Micropower CMOS Temperature Sensor with Digital Output,' IEEE Journai of Solid-State Circuits, Jul. 1996; 3 pages.
Balough et al., "White Paper: Comparing IP Integration Approaches for FPGA Implementation," Feb. 2007, Version 1.1, Altera, pp. 1-7; 7 pages.
Bauer et al.; "A Reconfigurable Logic Machine for Fast Event-Driven Simulation"; Jun. 1998; Design Automation Conference Proceedings; 8 pages.
Burogs et al., "Power Converter Analysis and Design using Matlab: A Transfer Function Approach," Proceedings of IEEE International Symposium on Industrial Electronics 1998, vol. 2, pp. 552-557; 6 pages.
Bursky "FPGA Combines Multiple Interfaces and Logic," Electronic Design, vol. 48 No. 20, Oct. 2, 2000, pp. 74-78; 5 pages.
Catthoor et al., "Architectural Strategies for an Application-Specific Synchronous Multiprocessor Environment," IEEE transactions on Acoustics, Speech, and Signal Processing; vol. 36, No. 2, Feb. 1988, pp. 265-284; 20 pages.
Chapweske, Adam; "The PS/2 Mouse Interface," PS/2 Mouse Interfacing, 2001, retrieved on May 18, 2006; 11 pages.
Charles Melear. "Using Background Modes for Testing, Debugging and Emulation of Microcontrollers," IEEE, 1997, pp. 90-97, 8 pages.
Charles, Jr. et al., "Wirebonding: Reinventing the Process for MCMs," Apr. 1998, IEEE 7th International Conference on Multichip Modules and High Density Packaging, pp. 300-302; 3 pages.
Ching et al., "An In-Circuit-Emulator for TMS320C25," IEEE, 1994, pp. 51-56; 6 pages.
Cover Pages Technology Reports; XML and Electronic Design Automation (EDA), Aug. 2000, retrieved from http://xml.coverpages.org on Mar. 23, 2005; 5 pages.
Cypress MicroSystem, Inc. "Cypress Customer Forums" retrieved from <http://www.cypress.com/forums/messageview>; Nov. 30, 2004; 1 page.
Cypress MicroSystem, Inc. "PsoC Designer: Integrated Development Environment User Guide"; Rev. 1.18; Sep. 8, 2003; 193 pages.
Cypress MicroSystems, Inc, "Cypress MicroSystems Unveils Programmable System-On-A-Chip For Embedded Internet, Communications, and Consumer Systems" Nov. 13, 2000; 3 pages.
Cypress Semiconductor Corporation, "CY8C21x34 Data Sheet," CSR User Module, CSR V.1,0; Oct. 6, 2005; 36 pages.
Cypress Semiconductor Corporation, "Cypress Introduces PSoC(TM)-Based Capacitive Touch Sensor Solution," Cypress Press Release; May 31, 2005; <http://www.cypress.com/portal/server>; retrieved on Feb. 5, 2007; 4 pages.
Cypress Semiconductor Corporation, "FAN Controller CG6457AM and CG6462AM," PSoC Mixed Signal Array Preliminary Data Sheet; May 24, 2005; 25 pages.
Cypress Semiconductor Corporation, "PSoC CY8C20x34 Technical Reference Manual (TRM)," PSoC CY8C20x34 TRM, Version 1.0, 2006; 218 pages.
Cypress Semiconductor Corporation, "PSoC Mixed-Signal Controllers," Production Description; <http://www.cypress.com/portal/server>; retrieved on Sep. 27, 2005; 2 pages.
Cypress Semiconductor Corporation, "Release Notes srn017," Jan. 24, 2007; 3 pages.
Dahl et al., "Emulaion of the Spade Micropocessor with the MIT Virual Wires Emulation System," 1994, IEEE, pp, 14-22; 9 pages.
Daniel B. Sedory, "A Guide to DEBUG," 2004, retrieved on May 20, 2005 from http://www.geocites.com/thestarman3/asm/debug/debug2.htm, pp. 1-11; 7 pages.
Dirk Killat, "A One-Chip Solution for Electronic Ballasts in Fluorescent Lamps," Power Electronics, http://powerelectronics.com/mag/power_onechip_solution_electronic/, dated Mar. 1, 2004, accessed Sep. 13, 2005; 4 pages.
Durham et al., "Circuit Architectures for High Linearity Monolithic Continuous-Time Filtering," IEEE. 1992; 7 pages.
Durham et al., "High-Linearity Conitnuous-Time Filter in 5-V VLSI CMOS," IEEE, 1992, 8 pages.
Durham et al, "Integrated Continuous-Time Balanced Fiiters for 16-bit DSP Interfaces," IEEE, 1993; 6 pages.
Duvvuru et al, "Evaluation of a Branch Target Address Cache," 1995. IEEE, pp. 173-180; 8 pages.

Ebeling et al., "Validating VLSI Circuit Layout by Wirelist Comparison," Sep. 1983, In the Proceedings of the IEEE International Conference on Computer Aided Design (ICCAD-83), pp. 172-173; 2 pages.

Ebling, "Gemini II: A Second Generation Layout Validation Program;" 1988; in proceedings of the IEEE International Conference on Computer Aided Design (ICCAD-88); 4 pages.

Efstathiou. "Analog Electronics: Basic Circuits of Operational Amplifiers," <http://web.archive.org/web/20021231045232> Dec. 31, 2002, version, retrieved from the Internet Archives; 10 pages.

Electronic Tools Company; E-Studio User Manuel; 2000; retrieved from http://web.archive.org for site http://e-tools.com on Mar. 23, 2005; 77 pages.

Frank Goodenough, "Analog Counterparts of FPGAS Ease System Design," Electronic Design, Penton Publishing, Cleveland. OH, Oct. 14, 1994: vol. 42, No. 21, pp. 63-66, 68; 10 pages.

Fred Eady, "PSoC 101," Circuit Cellar, Aug. 2004, accessed Sep. 13, 2005, http://www.circuitcellar.com/library/print/0804/eady169/2.htm: 4 pages.

Ganapathy et al., "Hardware Emulation for Functional Verification of K5", Jun. 1996, 33rd Design Automation Conference Proceedings, Jun. 3-7, 1996, pp. 315-318; 4 pages.

Ghosh et al., "A Low Overhead Design for Testability and Test Generation Techique for Core-based Systems, " IEEE, 1997; 10 pages.

Haberl et al., "Self Testable Boards with Standard IEEE 1149.5 Module Test and Maintenance (MTM) Bus Interface," IEEE, 1994; 6 pages.

Hamblen, "Rapid Prototyping Using Field-Programmable Logic Devices" Jun. 2000, IEEE; 9 pages.

Harbaum et al. "Design of a Flexible Coprocessor Unit" Proceedings of the Euromicro Conference, XX XX, Sep. 1999, pp. 335-342; 10 pages.

Harrison et al.; "Xilinx FPGA Design in a Group Environment Using VHDS and Synthesis Tools"; Colloquium on Digital System Design Using Synthesis Techniques; Feb. 15, 1996; 4 pages.

Hintz et al., "Microcontrollers," 1992, McGraw-Hill, pp. 29-37; 11 pages.

Hong et al., "An FPGA-Based Hardware Emulator for Fast Fault Emulation," IEEE, 1997, pp. 345-348; 4 pages.

Hong et al., "Hierarchial System Test by an IEEE 1149.5 MTM-Bus Slave-Module Interface Core," IEEE, 2000; 14 pages.

Hsieh et al., "Modeling Micro-Controller Peripherals for High-Level Co-Simulation and Synthesis," IEEE, 1997, pp. 127-130; 4 pages.

Huang et al., "Iceberg: An Embedded In-Circuit Emulator Synthesizer for Microcontrollers", Proceedings of the 36th Design Automation Conference, Jun. 1999, pp. 580-585; 6 pages.

Hwang et al., "Integrated circuit for automatically varying resistance in computer system, has pair of transistors connected in parallel with respective resistors such that resistors are bypassed when corresponding transistors are enabled," Derwent information Ltd; 2002; 2 pages.

International Search Report and Written Opinion of the International Searching Authority for PCT/US05/28898, filed Aug. 12, 2005; mailed Mar. 6, 2007; 6 pages.

International Search Report for International Application No. PCT/US2006/09572 dated Jan. 10, 2008; 2 pages.

International Search Report for International Application No. PCT/US05/28793 mailed Dec. 6, 2007; 8 pages.

International Search Report for International Application No. PCT/US08/60695 dated Jul. 22, 2009; 3 pages.

International Search Report for International Application No. PCT/US08/60696 dated Sep. 22, 2008; 5 pages.

International Search Report for International Application No. PCT/US10/33626 maiied Jun. 24, 2010; 3 pages.

International Search Report of the International Searching Authority for International Application No. PCT/US08/60681 dated Sep. 12, 2008; 2 pages.

International Search Report of the International Searching Authority for International Application No. PCT/US08/60698 dated Sep. 5, 2008, 2 pages.

International Written Opinion of the International Searching Authority for International Application No. PCT/US2008/09572 dated Jan. 10, 2008; 7 pages.

Ito et al "A Comparison of Microcontrollers Targeted to FPGA-Based Embedded Applications" Sep. 2000, Proceedings of 13th Symposium on Integrated Circuits and Systems Design, Sep. 18-24, 2000, pp. 397-402; 6 pages.

John Mangino, "Using DMA with High Performance Peripherals to Maximize System Performance," 2007, Texas Instruments, pp. 1-23; 23 pages.

Jonathan B. Rosenburg, "How Debuggers Work" John Wiley & Sons, Inc. 1998; 259 pages.

Julio Faura et al.; "A Novel Mixed Signal Programmable Device With On-Chip Microprocessor", 1997, IEEE 1997 Custom Integrated Circuits Conference, pp. 103-106; 4 pages.

Jung et al., "A Register File with Transposed Access Mode," 2000, IEEE; 2 pages.

Khan et al.; "FPGA Architectures for Asic Hardware Emulators"; IEEE 1993, pp. 338-340, 5 pages.

Kory Hopkins, "Definition:" Jan. 16, 1997, <http://www.cs.sfu.ca/cs/people/GradStudent.html>; 1 page.

Larsson, "A 2-1600-MHz CMOS Clock Recovery PLL With Low-V dd Capability," IEEE Journal of Solid-State Circuits, vol. 34, No. 12, Dec. 1999; 10 pages.

Lee, Mark, "EMC Design Considerations for PSoC CapSense Applications," Cypress Semiconductor Corporation, Application Note AN2318; Sep. 16, 2005; 6 pages.

Lutovac et al, "Symbolic Computation of Digital Filter Transfer Function Using MATLAB," Proceedings of 23rd International Conference on Microelectronics. vol. 2 NIS, Yugoslavia, May 2002, pp. 651-654; 4 pages.

M. Mooris Mano, "Computer System Architecture," 1982. Prentice-Hall, 2nd Edition, pp, 261-264 and 435-440; 14 pages.

Maneatis "Low-Jitter Process-Independent DLL and PLL Based on Self-Biased Techniques," IEEE Journal of Solid-State Circuits, vol. 31, No. 11, Nov. 1996, pp, 1723-1732; 10 pages.

Maroufi et al., "Solving the I/O Bandwidth Problem in System on a Chip Testing," IEEE, 2000; 6 pages.

Marsh, "Smart Tools Illuminate Deeply Embedded Systems," EDN, vol. 45 No. 3, Feb. 3, 2000, pp. 129-138; 7 pages.

Microsoft Computer Dictionary "ActiveX" 2002; Microsoft Press; 5th Edition; 3 pages.

Microsoft Press Computer User's Dictionary; 1998; 3 pages (including p. 18).

Monte Mar et al., "An architecture for a configurable Mixed-signal device", 2003, IEEE Journal of Solid-State Circuits, vol. 3, pp. 585-568; 4 pages.

Morrison, Gale, "IBM Eyes Merchant Packaging Services," Jul. 13, 2998, Electronic News, available at http://www.findarticles.com, 4 pages.

Nam et al., "Fast Development of Source-Level Debugging System Using Hardware Emulation," IEEE, 2000, pp. 400-404; 4 pages.

Nouta et al. "Design and FPGA-Implementation of Wave Digital Bandpass Filters with Arbitrary Amplitude Transfer Characteristics," Proceedings of IEEE International Symposium on Industrial Electronics; 1998. vol. 2; 5 pages.

Oh et al , "Emulator Environment Based on an FPGA Prototyping Board," IEEE, Jun. 21-23, 2000, pp. 72-77; 6 pages.

Ohlrich et al., "Sub-Gemini: Identfyng Subcircuits using a Fast Subgraph Isomorphism Algorithm;" Jun. 1993; in proceedings of the 30th IEEE/ACM Design Automation Conference; 7 pages.

Papachristou et al., "Microprocessor Based Testing for Core-Based System on a Chip," IEEE, 1999; 6 pages.

Pasternak, "In-Circuit-Emulation in ASIC Architecture Core Designs," IEEE, 1989, pp. P6-4.1-P6-4; 4 pages.

PCT International Search Report for PCT/US05/28791, filed Aug. 12, 2005, mailed Mar. 31, 2008; 4 pages.

PCT International Written Opinion for PCT/US05/28791, filed Aug. 12, 2005, mailed Mar. 31, 2008; 8 pages.

PCT Written Opinion of the International Searching Authority for PCT/US2005/028793, filed Aug. 12, 2005, mailed Nov. 19, 2007; 7 pages.

Robert A. Blauschild, "WP 3.5: An Integrated Time Reference," ISSCC94/Session 3, Analog Technology/Paper WP 3.5, Feb. 1994, pp. 56-58; 4 pages.

Robinson. Gordon D., "Why 1149.1 (JTAG) Really Works", May 1994, Conference Proceedings Electro/94 International, May 10-12, 1994, Combined Volumes, pp. 749-754; 6 pages.

Ryan Seguine et al, "Layout Guidelines for PSoC CapSense", Cypress Application Note AN2292, Revision B, Oct. 31, 2005, all pages.

Sedra, Adel S. et al., "Microelectronic Circuits," 3rd Edition, Oxford University Press, pp. xiii-xx and 861-883, 1991: 20 pages.

Seguine, Ryan; "Layout Guidelines for PSoC CapSense," Cypress Semiconductor Corporation, Application Note AN2292; Jul. 22, 2005; 13 pages.

Shatbahrami et al., "Matrix Register File and Exended Subwords: Two Techniques for Embedded Media Pocessors,"0 ACM, May 2005; 9 pages.

Snyder et al., "Xilinx's A-to-Z Systems Platform" Cahners Microprocessor, The Insider's Guide to Microprocessor Hardware, Feb. 6, 2001, 9 pages.

Song et al., "A 50% Power Reduction Scheme for CMOS Relaxation Oscillator," IEEE, 1999, pp. 154-157; 4 pages.

Specks et al., "A Mixed Digital-Analog 16B Microcontroller with 0.5MB Flash Memory, On-Chip Power Supply, Physical Nework Interface, and 40V I/O for Automotive Single-Chip Mechatronics," IEEE, Feb. 9, 2000; 1 page.

Stailman et al.; "Debugging with the GNU Source-Level Debugger"; Jan. 1994; retrieved on May 2, 2005 from http://www.cs.utah.edu; 4 pages.

Stan Augarten; "The Chip Collection—Introduction—Smithsonian Institute"; "State of the Art", "The First 256-Bit Static RAM"; retrieved on Nov. 14, 2005 from http://smithsonianchips.si.edu/augarten/p24.htm; 2 pages.

Stephen Walters, "Computer-Aided Prototyping for ASIC-Based Systems," 1991, IEEE Design & Test of Computers, vol. 8, issue 2, pp. 4-10; 8 pages.

The U.S. Appl. No. 60/243,708: "Advanced Programmable Microcontroller Device," Snyder et al., filed Oct. 28, 2000; 277 pages.

The Written Opinion of the International Search Report for International Application No. PCT/US10/33626 mailed Jun. 24, 2010; 5 pages.

Tran et al., "Fine Pitch and Wirebonding and Reliability of Aluminum Capped Copper Bond Pads," May 2000, IEEE Electronic Components and Technology Conference, pp. 1674-1680; 7 pages.

UPSTO Advisory Action for U.S. Appl. No. 09/969,778 dated May 15, 2006; 4 pages.

USPTO Advisory Action for U.S. Appl. No. 09/998,848 dated Sep. 7, 2005; 3 pages.

USPTO Advisory Action for U.S. Appl. No. 10/001,477 dated Oct. 10, 2008; 3 pages.

USPTO Advisory Action for U.S. Appl. No. 09/475,879 dated Mar. 4, 2002, 3 pages.

USPTO Advisory Action for U.S. Appl. No. 09/475,879 dated Dec. 31, 2001, 3 pages.

USPTO Advisory Action for U.S. Appl. No. 09/875,559 dated Jun. 8, 2005; 3 pages.

USPTO Advisory Action for U.S. Appl. No. 09/943,062 dated Mar. 27, 2008; 3 pages.

USPTO Advisory Action for U.S. Appl. No. 09/943,062 dated Sep. 25, 2003; 3 pages.

USPTO Advisory Action for U.S. Appl. No. 09/969,311 dated Jul. 21, 2003; 2 pages.

USPTO Advisory Action for U.S. Appl. No. 09/972,133 dated Aug. 31, 2005; 3 pages.

USPTO Advisory Action for U.S. Appl. No. 09/975,338 dated May 15, 2006; 4 pages.

USPTO Advisory Action for U.S. Appl. No. 09/989,570 dated Aug. 14, 2003; 3 pages.

USPTO Advisory Action for U.S. Appl. No. 09/989,771 dated Feb. 3, 2010; 3 pages.

USPTO Advisory Action for U.S. Appl. No. 09/989,778 dated Jun. 17, 2009; 3 pages.

USPTO Advisory Action for U.S. Appl. No. 09/994,601 dated Mar. 23, 2010; 2 pages.

USPTO Advisory Action for U.S. Appl. No. 09/998,848 dated Feb. 24, 2010; 3 pages.

USPTO Advisory Action for U.S. Appl. No. 10/001,478 dated Jun. 30, 2009; 3 pages.

USPTO Advisory Action for U.S. Appl. No. 10/329,162 dated Mar. 29, 2005; 2 pages.

USPTO Advisory Action for U.S. Appl. No. 11/166,622 dated May 27, 2009; 3 pages.

USPTO Advisory Action for U.S. Appl. No. 118/200,619 dated May 11, 2009; 3 pages.

USPTO Advisory Action for U.S. Appl. No. 11/201,627 dated Aug. 5, 2010; 3 pages.

USPTO Advisory Action for U.S. Appl. No. 11/201,627 dated Sep. 21, 2009; 3 pages.

USPTO Advisory Action for U.S. Appl. No. 11/322,044 dated Nov. 30, 2007; 2 pages.

USPTO Advisory Action for U.S. Appl. No. 11/337,272 dated Apr. 3, 2007; 3 pages.

USPTO Advisory Action for U.S. Appl. No. 11/415,588 dated Jan. 14, 2008; 3 pages.

USPTO Advisory Action for U.S. Appl. No. 11/644,100 dated Feb. 9, 2009; 3 pages.

USPTO Advisory Action for U.S. Appl. No. 11/644,100 dated Jul. 21, 2010; 3 pages.

USPTO Advisory Action for U.S. Appl. No. 11/698,660 dated Jul. 31, 2009; 3 pages.

USPTO Advisory Action for U.S. Appl. No. 11/698,660 dated Nov. 10, 2010; 3 pages.

USPTO Advisory Action for U.S. Appl. No. 11/799,439 dated Mar. 20, 2009; 3 pages.

USPTO Advisory Action for U.S. Appl. No. 11/818,005 dated Jul. 30, 2010; 3 pages.

USPTO Advisory Action for Application Number 11/850,260 dated Nov. 2, 2009; 3 pages.

USPTO Advisory Action for U.S. Appl. No. 12/004,833 dated Aug. 9, 2011; 3 pages.

USPTO Advisory Action for U.S. Appl. No. 12/058,534 dated Jul. 16, 2012; 3 pages.

USPTO Advisory Action for U.S. Appl. No. 12/058,534 dated Aug. 11, 2011; 3 pages.

USPTO Advisory Action for U.S. Appl. No. 12/058,586 dated Jan. 31, 2012; 3 pages.

USPTO Advisory Action for U.S. Appl. No. 12/136,577 dated Oct. 29, 2010; 3 pages.

USPTO U.S. Appl. No. 08/865,342: "Programmable Clock Generator," Mann et al., filed May 29, 1997, 41 pages.

USPTO U.S. Appl. No. 09/047,595: "Roving Range Control to Limit Receive PLL Frequency of Operation," Paul H. Scott, filed Mar. 29, 1998; 35 pages.

USPTO U.S. Appl. No. 09/048,905: "Programmable Clock Generator," Mann et al., filed Mar. 26, 1998; 42 pages.

USPTO U.S. Appl. No. 09/218,460: "Circuit and Method for Controlling an Output of a Ring Oscillator," Abugharbieh et al , filed Dec. 18, 1998; 21 pages.

USPTO U.S. Appl. No. 09/275,336: "Progammable Oscillator Scheme," Mar et al., filed Mar. 24, 1999, 25 pages.

USPTO U.S. Appl. No. 09/398,956: "Frequency Acquisition Rate Control in Phase Lock Loop Circuits," Moyal et al., filed Sep. 17, 1999; 35 pages.

USPTO U.S. Appl. No. 09/404,891: "Method, Architecture and Circuitry for Controlling Pulse Width in a Phase and/or Frequency Detector," Scott et al., filed Sep. 24, 1999; 17 pages.

USPTO U.S. Appl. No. 09/470,665: "Digital Phase/Frequency Detector, and Clock Generator and Data Recovery PLL Containing the Same," Kemal Dalmia, filed Dec. 23, 1999; 26 pages.

USPTO U.S. Appl. No. 09/471,576: "Reference-Free Clock Generation and Data Recovery PLL," Kemal Dalmia, filed Dec. 23, 1999; 30 pages.

USPTO U.S. Appl. No. 09/471,914: "Reference-Free Clock Generator and Data Recovery PLL," Dalmia et al., filed Dec. 23, 1999; 32 pages.

USPTO U.S. Appl. No. 09/475,808: "Configurable Memory for Programmable Logic Circuits," Lacey et al., filed Dec. 30, 1999; 24 pages.
USPTO Notice of Allowance for U.S. Appl. No. 09/994,601 dated Dec. 22, 2008; 15 pages.
USPTO Notice of Allowance for U.S. Appl. No. 09/998,834 dated May 19, 2005; 7 pages.
USPTO Notice of Allowance for U.S. Appl. No. 09/998,859 dated Mar. 14, 2005; 6 pages.
USPTO Notice of Allowance for U.S. Appl. No. 10/001,477 dated Nov. 10, 2008; 7 pages.
USPTO Notice of Allowance for U.S. Appl. No. 10/002,217 dated Jan. 28, 2009; 4 pages.
USPTO Notice of Allowance for U.S. Appl. No. 10/002,217 dated Jun. 6, 2008; 7 pages.
USPTO Notice of Allowance for U.S. Appl. No. 10/008,096 dated Dec. 22, 2008; 24 pages.
USPTO Notice of Allowance for U.S. Appl. No 10/033,027 dated Mar. 31, 2009; 7 pages.
USPTO Notice of Allowance for U.S. Appl. No 10/113,065 dated Apr. 6, 2006; 8 pages.
USPTO Notice of Allowance for U.S. Appl. No. 10/238,966 dated Jan. 27, 2009; 4 pages.
USPTO Notice of Allowance for U.S. Appl. No. 09/404,891 dated Mar. 4, 2005; 6 pages.
USPTO Notice of Allowance for U.S. Appl. No. 09/475,808 dated Nov. 6, 2001; 8 pages.
USPTO Notice of Allowance for U.S. Appl. No. 09/475,879 dated Oct. 22, 2004; 7 pages.
USPTO Notice of Allowance for U.S. Appl. No. 09/826,397 dated Oct. 7, 2004; 8 pages.
USPTO Notice of Allowance for U.S. Appl. No. 09/855,868 dated Apr. 25, 2005; 6 pages.
USPTO Notice of Allowance for U.S. Appl. No. 09/875,599 dated Oct. 17, 2006; 4 pages.
USPTO Notice of Allowance for U.S. Appl. No. 09/887,923 dated Sep. 27, 2004; 5 pages.
USPTO Notice of Allowance for U.S. Appl. No. 09/887,955 dated Oct. 12, 2004; 5 pages.
USPTO Notice of Allowance for U.S. Appl. No. 09/893,048 dated Jul. 25, 2006; 4 pages.
USPTO Notice of Allowance for U.S. Appl. No. 09/893,050 dated Jul. 5, 2005; 6 pages.
USPTO Notice of Allowance for U.S. Appl. No. 09/909,047 dated Feb. 15, 2005; 6 pages.
USPTO Notice of Allowance for U.S. Appl. No. 09/909,047 dated May 11, 2005; 25 pages.
USPTO Notice of Allowance for U.S. Appl. No. 09/912,768 dated Sep. 13, 2005; 5 pages.
USPTO Notice of Allowance for U.S. Appl. No. 09/922,579 dated Dec. 28, 2004; 6 pages.
USPTO Notice of Allowance for U.S. Appl. No. 09/923,461 dated May 12, 2005; 6 pages.
USPTO Notice of Allowance for U.S. Appl. No. 09/929,891 dated Jun. 15, 2005; 6 pages.
USPTO Notice of Allowance for U.S. Appl. No. 09/929,891 dated Dec. 23, 2005; 4 pages.
USPTO Notice of Allowance for U.S. Appl. No. 09/930,021 dated Nov. 26, 2004; 4 pages.
USPTO Notice of Allowance for U.S. Appl. No. 09/943,062 dated Jun. 29, 2010; 4 pages.
USPTO Notice of Allowance for U.S. Appl. No. 09/943,149 dated Jan. 12, 2004; 7 pages.
USPTO Notice of Allowance for U.S. Appl. No. 09/953,423 dated Jul. 12, 2004; 6 pages.
USPTO Notice of Allowance for U.S. Appl. No. 09/957,084 dated May 18, 2004; 5 pages.
USPTO Notice of Allowance for U.S. Appl. No. 09/969,311 dated Mar. 1, 2005; 4 pages.
USPTO Notice of Allowance for U.S. Appl. No. 09/969,313 dated Oct. 4, 2005; 6 pages.
USPTO Notice of Allowance for U.S. Appl. No. 09/972,003 dated Jul. 14, 2004; 4 pages.
USPTO Notice of Allowance for U.S. Appl. No. 09/972,133 date Jun. 9, 2006; 6 pages.
USPTO Notice of Allowance for U.S. Appl. No. 09/972,319 dated Dec. 30, 2004; 4 pages.
USPTO Notice of Allowance for U.S. Appl. No. 09/975,030 dated Feb. 6, 2006; 7 pages.
USPTO Notice of Allowance for U.S. Appl. No. 09/975,104 dated Oct. 19, 2006; 6 pages.
USPTO Notice of Allowance for U.S. Appl. No. 09/975,115 dated Jan. 29, 2010; 9 pages.
USPTO Notice of Allowance for U.S. Appl. No. 09/977,111 dated Sep. 28, 2006; 6 pages.
USPTO Notice of Allowance for U.S. Appl. No. 09/989,570 dated May 19, 2005; 4 pages.
USPTO Notice of Allowance for U.S. Appl. No. 09/989,570 dated Sep. 10, 2004; 8 pages.
USPTO Notice of Allowance for U.S. Appl. No. 09/989,571 dated Sep. 13, 2005; 6 pages.
USPTO Notice of Allowance for U.S. Appl. No. 09/989,761 dated Jan. 14, 2005; 6 pages.
USPTO Notice of Allowance for U.S. Appl. No. 09/989,762 dated Jan. 2, 2008; 6 pages.
USPTO Notice of Allowance for U.S. Appl. No. 09/989,762 dated Feb. 22, 2010; 7 pages.
USPTO Notice of Allowance for U.S. Appl. No. 09/989,762 dated Mar. 25, 2009; 7 pages.
USPTO Notice of Allowance for U.S. Appl. No. 09/989,762 dated Jun. 2, 2006; 6 pages.
USPTO Notice of Allowance for U.S. Appl. No. 09/989,762 dated Oct. 24, 2008; 7 pages.
USPTO U.S. Appl. No. 09/475,879: "Programmable Logic Device," Lacey et al., filed Dec. 30, 1999; 50 pages.
USPTO U.S. Appl. No. 09/538,989: "Memory Based Phase Locked Loop," Rengarajan S. Krishnan, filed Mar. 30, 2000; 27 pages.
USPTO U.S. Appl. No. 09/608,753: "PLL Lockout Watchdog," Wilson et al., filed Aug. 24, 2004; 24 pages.
USPTO U.S. Appl. No. 09/721,316: "Programmable Oscillator Scheme," Mar et al., filed Nov. 22, 2000; 26 pages.
USPTO U.S. Appl. No. 09/826,397: "Method and Circuit for Allowing a Microprocessor to Change its Operating Frequency on-the-Fly," Bert Sullam, filed Apr. 2, 2001; 24 pages.
USPTO U.S. Appl. No. 09/849,164: "Reduced Static Phase Error CMOS PLL Charge Pump," Jonathon Stiff, filed May 4, 2001, 30 pages.
USPTO U.S. Appl. No. 09/855,868: "Protecting Access to Microcontroller Memory Blocks," Warren Snyder, filed May 14, 2001; 28 pages.
USPTO U.S. Appl. No. 09/875,599: "Method and Apparatus for Programming a Flash Memory," Warren Snyder, filed Jun. 5, 2001; 23 pages.
USPTO U.S. Appl. No. 09/887,923: "Novel Method and System for Interacting between a Processor and a Power on Reset to Dynamically Control Power States in a Microcontroller," Kutz et al., filed Jun. 22, 2001, 44 pages.
USPTO U.S. Appl. No. 09/887,955: "Novel Power on Reset Circuit for Microcontroller," Kutz et al., filed Jun. 22, 2001; 42 pages.
USPTO U.S. Appl. No. 09/893,048: "A Microcontroller having an On-Chip High Gain Amplifier," Kutz et al., filed Jun. 26, 2001; 22 pages.
USPTO U.S. Appl. No. 09/893,050: "Multiple Use of Microcontroller Pad," Kutz et al., filed Jun. 26, 2001; 21 pages.
USPTO U.S. Appl. No. 09/893,161: "Architecture of a PLL with Dynamic Frequency Control on a PLD," Michael T. Moore, filed Jun. 27, 2001; 32 pages.
USPTO U.S. Appl. No. 09/909,045: "Digital Configurable Macro Architecture," Warren Snyder, filed Jul. 8, 2001; 37 pages.
USPTO U.S. Appl. No. 09/909,047: "A Programmable Analog System Architecture," Monte Mar, filed Jul. 18, 2001; 60 pages.
USPTO U.S. Appl. No. 09/909,109: "Configuring Digital Functions in a Digital Configurable Micro Architecture," Warren Snyder, filed Jul. 18, 2001; 38 pages.

USPTO U.S. Appl. No. 09/912,768: "A Microcontroller having a Dual Mode Relax Oscillator that is Trimmable," James Shutt; filed Jul. 24, 2001; 33 pages.
USPTO U.S. Appl. No. 09/922,419: "A Power Supply Pump Circuit for a Microcontroller," filed Aug. 3, 2001; 38 pages.
USPTO U.S. Appl. No. 09/922,579: "A Method for a Efficient Supply to a Microcontroller," Kutz et al., filed Aug. 3, 2001; 37 pages.
USPTO U.S. Appl. No. 09/923,461: "Non-Interfering Multiply-Mac (Multiply Accumulate) Circuit," Warren Snyder, filed Aug. 6, 2001; 25 pages.
USPTO U.S. Appl. No. 09/924,734: "Programmable Microcontroller (PSoC) Architecture (Mixed Analog/Digital)"; Snyder et al., filed Aug. 7, 2001, 28 pages.
USPTO U.S. Appl. No. 09/929,891: "Programming Architecture for a Programmable Analog System," Mar et al., filed Aug. 14, 2001; 82 pages.
USPTO U.S. Appl. No. 09/930,021: "Programmable Methodology and Architecture for a Programmable Analog System"; Mar et al., filed Aug. 14, 2001; 87 pages.
USPTO U.S. Appl. No. 09/935,454: "Method and Apparatus for Local and Global Power Management in a Programmable Analog Circuit," Monte Mar, filed Aug. 22, 2001; 56 pages.
USPTO U.S. Appl. No. 09/943,149: "Method for Phase Locking in a Phase Lock Loop," Moyal et al., filed Aug. 30, 2001; 25 pages.
USPTO U.S. Appl. No. 09/953,423: "A Configurable Input/Output Interface for a Microcontoller," Warren Snyder, filed Sep. 14, 2001; 28 pages.
USPTO U.S. Appl. No. 098/957,084: "A Crystal-Less Oscillator with Trimmable Analog Current Control for Increased Stability," Mar et al., filed Sep. 19, 2001; 28 pages.
USPTO U.S. Appl. No. 09/969,311: "Method for Synchronizing and Resetting Clock Signals Supplied to Multiple Programmable Analog Blocks," Bert Sulfam, filed Oct. 1, 2001; 57 pages.
USPTO U.S. Appl. No. 09/969,313, "Architecture for Synchronizing and Resetting Clock Signals Supplied to Multiple Analog Programmable Analog Blocks," Bert Sullam, filed Oct. 1, 2001, 50 pages.
USPTO U.S. Appl. No. 09/972,003: "Test Architecture for Microcontroller Providing for a Serial Communication Interface," Warren Snyder, filed Oct. 5, 2001; 32 pages.
USPTO U.S. Appl. No. 09/972,133: "Method for Entering Circuit Test Mode," Warren Snyder, filed Oct. 5, 2001; 30 pages.
USPTO U.S. Appl. No. 09/972,319: "Method for Applying Instructions to Microprocessor in Test Mode," Warren Snyder, filed Oct. 5, 2001; 31 pages.
USPTO U.S. Appl. No. 09/973,535: "Architecture for Decimation Algorithm," Warren Snyder, filed Oct. 9, 2001; 26 pages.
USPTO U.S. Appl. No. 09/975,030: "Emulator Chip-Board Architecture for Interface," Snyder el al., filed Oct. 10, 2001; 37 pages.
USPTO U.S. Appl. No. 09/975,104: "Capturing Test/Emulation and Enabling Real-Time Debugging Using FPGA for In-Circuit Emulation," Warren Snyder, filed Oct. 10, 2001; 35 pages.
USPTO U.S. Appl. No. 09/975,105: "Host to FPGA Interface in an In-Circuit Emulation System," Craig Nemecek, filed Oct. 10, 2001; 44 pages.
USPTO U.S. Appl. No. 09/975,115: "In-System Chip Emulator Architecture," Snyder et al., filed Oct. 10, 2001, 38 pages.
USPTO U.S. Appl. No. 09/975,338: "Method for Breaking Execution of a Test Code in DUT and Emulator Chip Essentially Simultaneously and Handling Complex Breakpoint Events," Nemecek et al., filed Oct. 10, 2001; 34 pages.
USPTO U.S. Appl. No. 09/977,111: "A Frequency Doubler Circuit with Trimmable Current Control," Shutt et al., filed Oct. 11, 2001; 35 pages.
USPTO U.S. Appl. No. 09/981,448: "Oscillator Tuning Method," Lane T. Hauck, filed Oct. 17, 2001; 28 pages.
USPTO U.S. Appl. No. 09/989,574: "Method and System for using a Graphics user Interface for Programming an Electronic Device," Bartz et al., filed Nov. 19, 2001; 43 pages.
USPTO U.S. Appl. No. 09/989,761: "Storing of global parameter defaults and using them over two or more design projects," Ogami et al., filed Nov. 19, 2001; 37 pages.
USPTO U.S. Appl. No. 09/989,781: "System and method for decoupling and iterating resources associated with a module," Ogami et al., filed Nov. 19, 2001; 40 pages.
USPTO U.S. Appl. No. 09/989,808: "Automatic generation of application program interfaces, source code, interrupts, and data sheets for microcontroller programming," Bartz et al., filed Nov. 19, 2001; 67 pages.
USPTO U.S. Appl. No. 09/989,815: "A Data Driven Method and System for Monitoring Hardware Resource Usage for Programming an Electric Device." Bartz et al., filed Nov. 19, 2001; 36 pages.
USPTO U.S. Appl. No. 09/989,816: "Datasheet Browsing and Creation with Data-Driven Datasheet Tabs within a Microcontroller Design Tool," Bartz et al., filed Nov. 19, 2001; 55 pages.
USPTO U.S. Appl. No. 09/989,819: "System and method for creating a boot file utilizing a boot template," Ogami et al., filed Nov. 19, 2001; 43 pages.
USPTO U.S. Appl. No. 09/998,834: "A System and a Method for Communication between and Ice and a Production Microcontroller while in a Halt State," Craig Nemecek, filed Nov. 15, 2001; 33 pages.
USPTO U.S. Appl. No. 09/998,859: "A System and a Method for Checking Lock Step Consistency between in Circuit Emulation and a Microcontroller while Debugging Process is in Progress," Craig Nemecek, filed Nov. 15, 2001, 33 pages.
USPTO U.S. Appl. No. 10/000,383: "System and Method of Providing a Programmable Clock Architecture for an Advanced Microcontroller," Sullam et al., filed Oct. 24, 2001; 34 pages.
USPTO Final Rejection for U.S. Appl. No. 10/118,682 dated May 3, 2004; 8 pages.
USPTO Final Rejection for U.S. Appl. No. 10/118,682 dated Oct. 12, 2005; 11 pages.
USPTO Final Rejection for U.S. Appl. No. 10/137,497 dated Mar. 13, 2006; 15 pages.
USPTO Final Rejection for U.S. Appl. No. 10/137,497 dated May 5, 2005; 13 pages.
USPTO Final Rejection for U.S. Appl. No. 10/256,829 dated Jan. 27, 2006; 24 pages.
USPTO Final Rejection for U.S. Appl. No. 10/256,829 dated Jun. 1, 2007; 16 pages.
USPTO Final Rejection for U.S. Appl. No. 10/256,829 dated Jun. 23, 2009; 8 pages.
USPTO Final Rejection for U.S. Appl. No. 10/272,231 dated Nov. 5, 2003; 5 pages.
USPTO Final Rejection for U.S. Appl. No. 10/288,003 dated Oct. 6, 2004; 6 pages.
USPTO Final Rejection for U.S. Appl. No. 10/305,569 dated Oct. 21, 2004; 7 pages.
USPTO Final Rejection for U.S. Appl. No. 10/327,207 dated Mar. 2, 2006; 13 pages.
USPTO Final Rejection for U.S. Appl. No. 10/329,162 dated Aug. 25, 2006; 12 pages.
USPTO Final Rejection for U.S. Appl. No. 10/329,162 dated Sep. 21, 2005; 12 pages.
USPTO Final Rejection for U.S. Appl. No. 10/329,162 dated Dec. 15, 2004; 10 pages.
USPTO Final Rejection for U.S. Appl. No. 10/871,582 dated Feb. 1, 2006; 5 pages.
USPTO Final Rejection for U.S. Appl. No. 11/166,622 dated Mar. 10, 2009; 11 pages.
USPTO Final Rejection for U.S. Appl. No. 11/166,622 dated Mar. 18, 2010; 12 pages.
USPTO Final Rejection for U.S. Appl. No. 11/166,622 dated Dec. 7, 2010; 12 pages.
USPTO Final Rejection for U.S. Appl. No. 11/200,619 dated Jan. 4, 2010; 18 pages.
USPTO Final Rejection for U.S. Appl. No. 11/200,619 dated Mar. 3, 2009; 14 pages.
USPTO Final Rejection for U.S. Appl. No. 11/201,627 dated Apr. 29, 2008; 21 pages.
USPTO Final Rejection for U.S. Appl. No. 11/201,627 dated May 24, 2010; 26 pages.
USPTO Final Rejection for U.S. Appl. No. 11/201,627 dated Jul. 7, 2009; 19 pages.

USPTO Final Rejection for U.S. Appl. No. 11/201,922 dated Apr. 30, 2008; 10 pages.
USPTO Final Rejection for U.S. Appl. No. 11/273,708 dated Jul. 5, 2007; 8 pages.
USPTO Final Rejection for U.S. Appl. No. 11/322,044 dated Sep. 21, 2007; 14 pages.
USPTO Final Rejection for U.S. Appl. No. 11/322,044 dated Oct. 19, 2009; 10 pages.
USPTO Final Rejection for U.S. Appl. No. 11/337,272 dated Feb. 2, 2007; 11 pages.
USPTO Final Rejection for U.S. Appl. No. 11/415,588 dated Oct. 19, 2007; 8 pages.
USPTO Final Rejection for U.S. Appl. No. 11/644,100 dated May 19, 2010; 13 pages.
USPTO Final Rejection for U.S. Appl. No. 11/644,100 dated Aug. 19, 2009; 12 pages.
USPTO Final Rejection for U.S. Appl. No. 11/644,100 dated Nov. 18, 2008; 12 pages.
USPTO Final Rejection for U.S. Appl. No. 11/698,660 dated Feb. 16, 2010; 14 pages.
USPTO Final Rejection for U.S. Appl. No. 11/698,660 dated May 28, 2009; 12 pages.
USPTO Final Rejection for U.S. Appl. No. 11/698,660 dated Sep. 3, 2010; 19 pages.
USPTO Final Rejection for U.S. Appl. No. 11/799,439 dated Dec. 18, 2008; 6 pages.
USPTO Final Rejection for U.S. Appl. No. 11/818,005 dated May 24, 2010; 8 pages.
USPTO Final Rejection for U.S. Appl. No. 11/850,260 dated Aug. 21, 2009; 9 pages.
USPTO Final Rejection for U.S. Appl. No. 11/857,947 dated Jan. 4, 2011; 14 pages.
USPTO U.S. Final Rejection for U.S. Appl. No. 11/857,947 dated Oct. 14, 2009; 22 pages.
USPTO Final Rejection for U.S. Appl. No. 11/865,672 dated Dec. 30, 2009; 6 pages.
USPTO Final Rejection for U.S. Appl. No. 11/983,291 dated Aug. 12, 2009; 10 pages.
USPTO Final Rejection for U.S. Appl. No. 12/004,833 dated May 25, 2011; 11 pages.
USPTO U.S. Final Rejection for U.S. Appl. No. 12/068,534 dated Jun. 2, 2011; 15 pages
USPTO Final Rejection for U.S. Appl. No. 12/058,586 dated Nov. 9, 2011; 14 pages.
USPTO Final Rejection for U.S. Appl. No. 12/060,176 dated Oct. 12, 2010; 22 pages.
USPTO Final Rejection for U.S. Appl. No. 12/070,547 dated Oct. 30, 2009; 5 pages.
USPTO Final Rejection for U.S. Appl. No. 12/104,678 dated Dec. 3, 2010; 9 pages.
USPTO Final Rejection for U.S. Appl. No. 12/132,527 dated Oct. 14, 2010; 8 pages.
USPTO Non-Final Rejection for U.S. Appl. No. 11/698,660 dated Dec. 2, 2008; 12 pages.
USPTO Non-Final Rejection for U.S. Appl. No. 11/698,660 dated Dec. 13, 2010; 20 pages.
USPTO Non-Final Rejection for U.S. Appl. No. 11/709,866 dated Nov. 7, 2008; 14 pages.
USPTO Non-Final Rejection for U.S. Appl. No. 11/799,439 dated May 29, 2008; 8 pages.
USPTO Non-Final Rejection for U.S. Appl. No. 11/799,439 dated Nov. 2, 2007; 7 pages.
USPTO Non-Final Rejection for U.S. Appl. No. 11/818,005 dated Oct. 26, 2010; 10 pages.
USPTO Non-Final Rejection for U.S. Appl. No. 11/818,005 dated Nov. 23, 2009; 8 pages.
USPTO Non-Final Rejection for U.S. Appl. No. 11/850,260 dated Jan. 14, 2010; 6 pages.
USPTO Non-Final Rejection for U.S. Appl. No. 11/850,260 dated Mar. 6, 2009; 7 pages.
USPTO Non-Final Rejection for U.S. Appl. No. 11/857,947 dated Feb. 3, 2010, 23 pages.
USPTO Non-Final Rejection for U.S. Appl. No. 11/857,947 dated Mar. 30, 2009; 18 pages.
USPTO Non-Final Rejection for U.S. Appl. No. 11/857,947 dated Jul. 21, 2010; 15 pages.
USPTO Non-Final Rejection for U.S. Appl. No. 11/859,547 dated Oct. 1, 2009; 9 pages.
USPTO Non-Final Rejection for U.S. Appl. No. 11/865,672 dated Jul. 17, 2009; 6 pages.
USPTO Non-Final Rejection for U.S. Appl. No. 11/965,291 dated Dec. 17, 2008, 8 pages.
USPTO Non-Final Rejection for U.S. Appl. No. 11/965,677 dated Mar. 10, 2009; 10 pages.
USPTO Non-Final Rejection for U.S. Appl. No. 11/967,240 dated Jun. 10, 2009; 7 pages.
USPTO Non-Final Rejection for U.S. Appl. No. 11/967,243 dated Sep. 17, 2009; 9 pages.
USPTO Non-Final Rejection for U.S. Appl. No. 11/968,145 dated Jan. 5, 2011; 8 pages.
USPTO Non-Final Rejection for U.S. Appl. No. 11/968,145 dated Mar. 4, 2010, 11 pages.
USPTO Non-Final Rejection for U.S. Appl. No. 11/983,291 dated Mar. 9, 2009; 9 pages.
USPTO Non-Final Rejection for U.S. Appl. No. 12/004,833 dated Nov. 9, 2011; 11 pages.
USPTO Non-Final Rejection for U.S. Appl. No. 12/004,833 dated Dec. 21, 2010; 8 pages.
USPTO Non-Final Rejection for U.S. Appl. No. 12/058,534 dated Jan. 11, 2011; 17 pages.
USPTO Non-Final Rejection for U.S. Appl. No. 12/058,534 dated Dec. 16, 2011; 11 pages.
USPTO Non-Final Rejection for U.S. Appl. No. 12/058,569 dated Aug. 2, 2010; 9 pages.
USPTO Non-Final Rejection for U.S. Appl. No. 12/058,586 dated May 24, 2011; 13 pages.
USPTO Non-Final Rejection for U.S. Appl. No. 12/058,586 dated Aug. 14, 2012; 13 pages.
USPTO Non-Final Rejection for U.S. Appl. No. 12/060,128 dated Apr. 29, 2009; 11 pages.
USPTO Non-Final Rejection for U.S. Appl. No. 12/060,176 dated Mar. 30, 2010, 22 pages.
USPTO Non-Final Rejection for U.S. Appl. No. 12/070,547 dated Jun. 3, 2009; 6 pages.
USPTO Non-Final Rejection for U.S. Appl. No. 12/104,672 dated Aug. 26, 2009; 11 pages.
USPTO Non-Final Rejection for U.S. Appl. No. 12/104,678 dated Jul. 2, 2010; 8 pages.
USPTO Non-Final Rejection for U.S. Appl. No. 12/132,527 dated Apr. 29, 2010; 7 pages.
USPTO Non-Final Rejection for U.S. Appl. No. 12/136,557 dated Mar. 15, 2010; 10 pages.
USPTO Non-Final Rejection for U.S. Appl. No. 12/218,404 dated Sep. 30, 2008; 8 pages.
USPTO Non-Final Rejection for U.S. Appl. No. 13/171,061 dated Oct. 2, 2012; 5 pages.
USPTO Non-Final Rejection for U.S. Appl. No. 09/975,338 dated Apr. 5, 2005; 13 pages.
USPTO Non-Final Rejection for U.S. Appl. No. 10/288,003 dated Apr. 7, 2004; 9 pages.
USPTO Notice of Allowance for U.S. Appl. No. 09/975,105 dated Dec. 4, 2006; 4 pages.
USPTO Notice of Allowance for U.S. Appl. No. 09/989,777 dated Jul. 7, 2008; 23 pages.
USPTO Notice of Allowance for U.S. Appl. No. 09/989,777 dated Sep. 15, 2008; 28 pages.
USPTO Notice of Allowance for U.S. Appl. No. 09/989,777 dated Nov. 4, 2008; 3 pages.
USPTO Notice of Allowance for U.S. Appl. No. 09/992,076 dated Nov. 13, 2008; 15 pages.
USPTO Notice of Allowance for U.S. Appl. No. 09/992,076 dated Nov. 29, 2007; 8 pages.
USPTO Notice of Allowance for U.S. Appl. No. 09/992,076 dated Mar. 26, 2008; 23 pages.

USPTO Notice of Allowance for U.S. Appl. No. 09/992,076 dated Jul. 29, 2008; 6 pages.
USPTO Notice of Allowance for U.S. Appl. No. 09/994,600 dated May 14, 2008; 22 pages.
USPTO Notice of Allowance for 09/994,600 dated Nov. 12, 2008; 35 pages.
USPTO Final Rejection for U.S. Appl. No. 09/475,879 dated Oct. 11, 2001; 10 pages.
USPTO Final Rejection for U.S. Appl. No. 09/875,599 dated Feb. 15, 2006; 18 pages.
USPTO Final Rejection for U.S. Appl. No. 09/875,599 dated Mar. 29, 2005; 20 pages.
USPTO Final Rejection for U.S. Appl. No. 09/875,599 dated Apr. 26, 2004; 15 pages.
USPTO Final Rejection for U.S. Appl. No. 09/875,599 dated Aug. 25, 2004; 17 pages.
USPTO Final Rejection for U.S. Appl. No. 09/875,599 dated Nov. 21, 2005; 16 pages.
USPTO Final Rejection for U.S. Appl. No. 09/893,050 dated Aug. 30, 2004; 13 pages.
USPTO Final Rejection for U.S. Appl. No. 09/912,768 dated Nov. 17, 2004; 13 pages.
USPTO Final Rejection for U.S. Appl. No. 09/930,021 dated Aug. 31, 2004; 8 pages.
USPTO Final Rejection for U.S. Appl. No. 09/943,062 dated Jan. 18, 2008; 8 pages.
USPTO Final Rejection for U.S. Appl. No. 09/943,062 dated Apr. 30, 2004; 9 pages.
USPTO Final Rejection for U.S. Appl. No. 09/943,062 dated Jun. 27, 2003; 8 pages.
USPTO Final Rejection for U.S. Appl. No. 09/943,149 dated May 7, 2003; 10 pages.
USPTO Final Rejection for U.S. Appl. No. 09/957,084 dated Jan. 29, 2004; 8 pages.
USPTO Final Rejection for U.S. Appl. No. 09/957,084 dated Apr. 23, 2003; 8 pages.
USPTO Final Rejection for U.S. Appl. No. 09/969,311 dated Apr. 7, 2003; 7 pages.
USPTO Final Rejection for U.S. Appl. No. 09/972,133 dated Mar. 30, 2006; 8 pages.
USPTO Final Rejection for U.S. Appl. No. 09/972,133 dated Jun. 29, 2005; 10 pages.
USPTO Final Rejection for U.S. Appl. No. 09/975,104 dated Feb. 15, 2006; 7 pages.
USPTO Final Rejection for U.S. Appl. No. 09/975,338 dated Jan. 18, 2006; 12 pages.
USPTO Final Rejection for U.S. Appl. No. 09/975,338 dated Jan. 31, 2008; 21 pages.
USPTO Final Rejection for U.S. Appl. No. 09/975,338 dated Feb. 27, 2007; 23 pages.
USPTO Final Rejection for U.S. Appl. No. 09/989,570 dated May 30, 2003; 9 pages.
USPTO Final Rejection for U.S. Appl. No. 09/989,571 dated Jan. 26, 2005; 11 pages.
USPTO Final Rejection for U.S. Appl. No. 09/989,761 dated Aug. 26, 2004; 7 pages.
USPTO Final Rejection for U.S. Appl. No. 09/989,761 dated Oct. 3, 2003; 7 pages.
USPTO Final Rejection for U.S. Appl. No. 09/989,762 dated Jan. 26, 2007; 13 pages.
USPTO Final Rejection for U.S. Appl. No. 09/989,762 dated Mar. 14, 2006; 19 pages.
USPTO Final Rejection for U.S. Appl. No. 09/989,767 dated Jan. 18, 2011; 24 pages.
USPTO Final Rejection for U.S. Appl. No. 09/989,767 dated Dec. 7, 2009; 22 pages.
USPTO Final Rejection for U.S. Appl. No. 09/989,771 dated Jan. 4, 2011; 12 pages.
USPTO Final Rejection for U.S. Appl. No. 09/989,771 dated Nov. 25, 2009; 12 pages.
USPTO Final Rejection for U.S. Appl. No. 09/989,782 dated May 15, 2009; 10 pages.
USPTO Final Rejection for U.S. Appl. No. 09/994,601 dated Jan. 5, 2010; 13 pages.
USPTO Final Rejection for U.S. Appl. No. 09/998,848 dated Dec. 10, 2009; 16 pages.
USPTO Final Rejection for U.S. Appl. No. 10/001,478 dated Apr. 20, 2009; 16 pages.
USPTO Final Rejection for U.S. Appl. No. 10/001,478 dated Jun. 4, 2008; 18 pages.
USPTO Final Rejection for U.S. Appl. No. 10/001,478 dated Sep. 5, 2006; 19 pages.
USPTO Final Rejection for U.S. Appl. No. 10/001,478 dated Sep. 17, 2007; 15 pages.
USPTO Final Rejection for U.S. Appl. No. 10/001,568 dated Oct. 26, 2005; 16 pages.
USPTO Final Rejection for U.S. Appl. No. 10/002,726 dated Mar. 27, 2006; 8 pages.
USPTO Final Rejection for U.S. Appl. No. 10/002,726 dated Nov. 30, 2005; 10 pages.
USPTO Final Rejection for U.S. Appl. No. 10/004,039 dated Nov. 22, 2005; 19 pages.
USPTO Final Rejection for U.S. Appl. No. 10/004,197 dated Nov. 23, 2005; 17 pages.
USPTO Final Rejection for U.S. Appl. No. 10/011,214 dated Jan. 21, 2005; 8 pages.
USPTO Final Rejection for U.S. Appl. No. 10/113,064 dated Oct. 18, 2005; 22 pages.
USPTO Final Rejection for U.S. Appl. No. 10/113,581 dated May 11, 2009; 21 pages.
USPTO Final Rejection for U.S. Appl. No. 10/113,581 dated Jun. 11, 2008; 14 pages.
USPTO Final Rejection for U.S. Appl. No. 10/113,581 dated Jul. 13, 2007; 15 pages.
USPTO Final Rejection for U.S. Appl. No. 10/113,581 dated Aug. 10, 2006; 13 pages.
USPTO Final Rejection for U.S. Appl, No. 09/989,767 dated Mar. 6, 2006; 15 pages.
USPTO Miscellaneous Action for U.S. Appl. No. 09/943,062 dated Jan. 30, 2006; 2 pages.
USPTO Miscellaneous Action for U.S. Appl. No. 09/989,819 dated Dec. 14, 2001; 1 page.
USPTO Miscellaneous Action for U.S. Appl. No. 10/001,478 dated Feb. 23, 2010; 5 pages.
USPTO Miscellaneous Action for U.S. Appl. No. 10/113,581 dated Jun. 23, 2010; 6 pages.
USPTO Miscellaneous Action for U.S. Appl. No. 10/327,207 dated May 13, 2003; 1 page.
USPTO Miscellaneous Action for U.S. Appl. No. 10/327,217 dated Feb. 10, 2004; 1 page.
USPTO Miscellaneous Action for U.S. Appl. No. 11/201,922 dated Oct. 1, 2009; 2 pages.
USPTO Miscellaneous Action with SSP for U.S. Appl. No. 09/930,021 dated Oct. 1, 2001; 1 page.
USPTO Non-Final Rejection for U.S. Appl. No. 10/001,477 dated May 11, 2005; 10 pages.
USPTO Non-Final Office Rejection for U.S. Appl. No. 10/002,217 dated Oct. 2, 2006; 21 pages.
USPTO Non-Final Office Rejection for U.S. Appl. No. 10/002,217 dated May 19, 2005; 15 pages.
USPTO Non-Final Rejection for U.S. Appl. No. 09/975,105 dated Jan. 19, 2006; 5 pages.
USPTO Non-Final Rejection for U.S. Appl. No. 09/975,105 dated Apr. 19, 2005; 9 pages.
USPTO Non-Final Rejection for U.S. Appl. No. 09/975,115 dated Jan. 7, 2008; 30 pages.
USPTO Non-Final Rejection for U.S. Appl. No. 09/975,115 dated Jan. 11, 2006; 15 pages.
USPTO Non-Final Rejection for U.S. Appl. No. 09/975,115 dated Feb. 11, 2005; 86 pages.
USPTO Non-Final Rejection for U.S. Appl. No. 09/975,115 dated Jul. 27, 2005; 11 pages.
USPTO Non-Final Rejection for U.S. Appl. No. 09/975,115 dated Jul. 31, 2007; 28 pages.

USPTO Non-Final Rejection for U.S. Appl. No. 09/975,115 dated Oct. 9, 2008; 34 pages.
USPTO Non-Final Rejection for U.S. Appl. No. 09/975,115 dated Oct. 31, 2006; 19 pages.
USPTO Non-Final Rejection for U.S. Appl. No. 09/989,765 dated Sep. 19, 2007; 14 pages.
USPTO Non-Final Rejection for U.S. Appl. No. 09/989,765 dated Sep. 26, 2006; 17 pages.
USPTO Non-Final Rejection for U.S. Appl. No. 09/989,765 dated Oct. 2, 2006; 13 pages.
USPTO Non-Final Rejection for U.S. Appl. No. 09/989,765 dated Oct. 5, 2005; 9 pages.
USPTO Non-Final Rejection for U.S. Appl. No. 09/989,767 dated Jul. 2, 2007; 22 pages.
USPTO Non-Final Rejection for U.S. Appl. No. 09/989,767 dated Jul. 17, 2006, 12 pages.
USPTO Non-Final Rejection for U.S. Appl. No. 09/989,771 dated May 28, 2008; 14 pages.
USPTO Non-Final Rejection for U.S. Appl. No. 09/989,767 dated Jul. 24, 2008; 21 pages.
USPTO Non-Final Rejection for U.S. Appl. No. 09/989,771 dated Jul. 16, 2007; 14 pages.
USPTO Non-Final Rejection for U.S. Appl. No. 09/989,771 dated Aug. 23, 2006; 7 pages.
USPTO Non-Final Rejection for U.S. Appl. No. 09/989;771 dated Sep. 12, 2005; 7 pages.
USPTO Non-Finai Rejection for U.S. Appl. No. 09/989,771 dated Sep. 22, 2004; 7 pages.
USPTO Non-Final Rejection for U.S. Appl. No. 09/989,777 dated Apr. 11, 2006; 21 pages.
USPTO Non-Final Rejection for U.S. Appl. No. 09/989,777 dated Jul. 5, 2005; 36 pages.
USPTO Non-Final Rejection for U.S. Appl. No. 09/989,777 dated Sep. 11, 2007; 18 pages.
USPTO Non-Final Rejection for U.S. Appl. No. 09/989,777 dated Sep. 13, 2006; 18 pages.
USPTO Non-Final Rejection for U.S. Appl. No. 09/989,778 dated Mar. 29, 2005, 14 pages.
USPTO Non-Final Rejection for U.S. Appl. No. 09/989,778 dated Jul. 14, 2008; 24 pages.
USPTO Non-Final Rejection for U.S. Appl. No. 09/989,778 dated Jul. 19, 2007; 18 pages.
USPTO Non-Final Rejection for U.S. Appl. No. 09/989,778 dated Sep. 1, 2005; 10 pages.
USPTO Non-Final Rejection for U.S. Appl. No. 09/989,778 dated Sep. 18, 2006; 11 pages.
USPTO Non-Final Rejection for U.S. Appl. No. 09/989,782 dated Jan. 29, 2007; 9 pages.
USPTO Non-Final Rejection for U.S. Appl. No. 09/989,782 dated Mar. 28, 2006; 8 pages.
USPTO Non-Final Rejection for U.S. Appl. No. 09/989,782 dated Apr. 29, 2005; 11 pages.
USPTO Non-Final Rejection for U.S. Appl. No. 09/989,782 dated Oct. 6, 2004; 11 pages.
USPTO Non-Final Rejection for U.S. Appl. No. 09/989,782 dated Nov. 26, 2008; 10 pages.
USPTO Non-Final Rejection for U.S. Appl. No. 09/989,782 dated Dec. 14, 2007; 8 pages.
USPTO Non-Final Rejection for U.S. Appl. No. 09/992,076 dated Jun. 1, 2005; 20 pages.
USPTO Non-Final Rejection for U.S. Appl. No. 09/992,076 dated Aug. 10, 2006; 19 pages.
USPTO Non-Final Rejection for U.S. Appl. No. 09/989,767 dated Jul. 9, 2010; 22 pages.
USPTO Non-Final Rejection for U.S. Appl. No. 09/989,767 dated Oct. 6, 2004; 15 pages.
USPTO Non-Final Rejection for U.S. Appl. No. 09/989,771 dated Apr. 30, 2009; 11 pages.
USPTO Non-Final Rejection for U.S. Appl. No. 09/989,771 dated Jul. 20, 2010; 12 pages.
USPTO Non-Final Rejection for U.S. Appl. No. 09/989,782 dated Oct. 27, 2009; 9 pages.
USPTO Non-Final Rejection for U.S. Appl. No. 09/989,808 dated Apr. 14, 2005; 8 pages.
USPTO Non-Final Rejection for U.S. Appl. No. 09/989,808 dated Oct. 19, 2005; 8 pages.
USPTO Non-Final Rejection for U.S. Appl. No. 09/989,817 dated Jan. 12, 2005; 5 pages.
USPTO Non-Final Rejection for U.S. Appl. No. 09/989,817 dated Jun. 8, 2004; 7 pages.
USPTO Non-Final Rejection for U.S. Appl. No. 09/989,819 dated Jul. 13, 2004; 4 pages.
USPTO Non-Final Rejection for U.S. Appl. No. 09/994,601 dated Jul. 9, 2009; 11 pages.
USPTO Non-Final Rejection for U.S. Appl. No. 09/998,848 dated Jun. 21, 2010; 15 pages.
USPTO Non-Final Rejection for U.S. Appl. No. 09/998,848 dated May 12, 2009; 16 pages.
USPTO Non-Final Rejection for U.S. Appl. No. 10/001,478 dated Jan. 30, 2008; 19 pages.
USPTO Non-Final Rejection for Appl. No. 10/001,478 dated Mar. 15, 2008 19 pages.
USPTO Non-Final Rejection for U.S. Appl. No. 10/001,478 dated Apr. 2, 2007; 17 pages.
USPTO Non-Final Rejection for U.S. Appl. No. 10/001,478 dated May 16, 2005; 13 pages.
USPTO Non-Final Rejection for U.S. Appl. No. 10/001,478 dated Aug. 4, 2009; 17 pages.
USPTO Non-Final Rejection for U.S. Appl. No. 10/001,478 dated Oct. 20, 2006; 18 pages.
USPTO Non-Final Rejection for U.S. Appl. No. 10/001,568 dated May 19, 2005; 16 pages.
USPTO Non-Final Rejection for U.S. Appl. No. 10/002,217 dated Aug. 3, 2007; 10 pages.
USPTO Non-Final Rejection for U.S. Appl. No. 10/002,726 dated Jun. 10, 2005; 10 pages.
USPTO Non-Final Rejection for U.S. Appl. No. 10/002,726 dated Aug. 28, 2006; 10 pages.
USPTO Non-Final Rejection for U.S. Appl. No. 10/002,726 dated Dec. 13, 2004; 7 pages.
USPTO Non-Final Rejection for U.S. Appl. No. 10/004,039 dated Apr. 11, 2006; 14 pages.
USPTO Non-Final Rejection for U.S. Appl. No. 10/004,039 dated Jun. 6, 2005; 17 pages.
USPTO Non-Final Rejection for U.S. Appl. No. 10/004,197 dated Apr. 3, 2006; 13 pages.
USPTO Non-Final Rejection for U.S. Appl. No. 10/004,197 dated Jun. 6, 2005; 21 pages.
USPTO Non-Final Rejection for U.S. Appl. No. 10/011,214 dated Aug. 13, 2004; 10 pages.
USPTO Non-Final Rejection for U.S. Appl. No. 10/109,979 dated Jun. 30, 2005; 6 pages.
USPTO Non-Final Rejection for U.S. Appl. No. 10/113,064 dated Apr. 6, 2006; 19 pages.
USPTO Non-Final Rejection for U.S. Appl. No. 10/113,064 dated Apr. 25, 2005; 15 pages.
USPTO Non-Final Rejection for U.S. Appl. No. 10/113,581 dated Jan. 10, 2007; 14 pages.
USPTO Non-Final Rejection for U.S. Appl. No. 10/113,581 dated Feb. 24, 2006; 11 pages.
USPTO Non-Final Rejection for U.S. Appl. No. 10/113,581 dated Aug. 12, 2005; 12 pages.
USPTO Non-Final Rejection for U.S. Appl. No. 10/113,581 dated Sep. 1, 2009; 18 pages.
USPTO Non-Final Rejection for U.S. Appl. No. 10/113,581 dated Nov. 26, 2008; 20 pages.
USPTO Non-Final Rejection for U.S. Appl. No. 10/113,581 dated Nov. 27, 2007; 15 pages.
USPTO Non-Final Rejection for U.S. Appl. No. 10/118,682 dated Jan. 12, 2005; 11 pages.
USPTO Non-Final Rejection for U.S. Appl. No. 10/118,682 dated Feb. 25, 2004; 9 pages.
USPTO Non-Final Rejection for U.S. Appl. No. 10/118,682 dated Jun. 16, 2005; 12 pages.

USPTO Non-Final Rejection for U.S. Appl. No. 10/118,682 dated Sep. 24, 2004, 8 pages.
USPTO Non-Final Rejection for U.S. Appl. No. 10/118,682 dated Nov. 3, 2003; 8 pages.
USPTO Non-Final Rejection for U.S. Appl. No. 10/137,497 dated Aug. 2, 2006: 21 pages.
USPTO Non-Final Rejection for U.S. Appl. No. 10/137,497 dated Sep. 22, 2005; 21 pages.
USPTO Non-Final Rejection for U.S. Appl. No. 10/137,497 dated Nov. 5, 2004; 17 pages.
USPTO Non-Final Rejection for U.S. Appl. No. 10/226,911 dated Mar. 19, 2004; 6 pages.
USPTO Non-Final Rejection for U.S. Appl. No. 10/256,829 dated Jan. 7, 2009; 7 pages.
USPTO Non-Final Rejection for U.S. Appl. No. 10/256,829 dated May 3, 2006; 16 pages.
USPTO Non-Final Rejection for U.S. Appl. No. 10/256,829 dated Jun. 26, 2008; 11 pages.
USPTO Non-Final Rejection for U.S. Appl. No. 10/256,829 dated Jul. 28, 2005; 14 pages.
USPTO Non-Final Rejection for U.S. Appl. No. 10/256,829 dated Oct. 26, 2009; 8 pages.
USPTO Non-Final Rejection for U.S. Appl. No. 10/256,829 dated Nov. 2, 2006; 13 pages.
USPTO Non-Final Rejection for U.S. Appl. No. 10/272,231 dated Jul. 14, 2003; 6 pages.
USPTO Non-Final Rejection for U.S. Appl. No. 10/293,392 dated Oct. 16, 2003; 6 pages.
USPTO Non-Final Rejection for U.S. Appl. No. 10/305,589 dated Oct. 7, 2003; 6 pages.
USPTO Non-Final Rejection for U.S. Appl. No. 10/324,455 dated Aug. 21, 2003; 4 pages.
USPTO Non-Final Rejection for U.S. Appl. No. 10/324,455 dated Nov. 6, 2003; 4 pages.
USPTO Non-Final Rejection for U.S. Appl. No. 10/327,207 dated Jul. 21, 2006, 12 pages.
USPTO Non-Final Rejection for U.S. Appl. No. 10/327,207 dated Sep. 20, 2005; 11 pages.
USPTO Non-Final Rejection for U.S. Appl. No. 10/327,217 dated Apr. 30, 2004; 5 pages.
USPTO Non-Final Rejection for U.S. Appl. No. 10/329,162 dated Jan. 29, 2007; 10 pages.
USPTO Non-Final Rejection for U.S. Appl. No. 10/329,162 dated Mar. 10, 2006; 9 pages.
USPTO Non-Final Rejection for U.S. Appl. No. 10/329,162 dated Apr. 21, 2005; 10 pages.
USPTO Non-Final Rejection for U.S. Appl. No. 10/329,162 dated Aug. 2, 2004; 8 pages.
USPTO Non-Final Rejection for U.S. Appl. No. 10/653,050 dated Apr. 6, 2004; 7 pages.
USPTO Non-Final Rejection for U.S. Appl. No. 10/803,030 dated Jun. 8, 2005; 4 pages.
USPTO Non-Final Rejection for U.S. Appl. No. 10/871,582 dated Sep. 7, 2005; 7 pages.
USPTO Non-Final Rejection for U.S. Appl. No. 11/088,028 dated Jun. 16, 2006; 8 pages.
USPTO Non-Final Rejection for U.S. Appl. No. 11/125,554 dated Dec. 11, 2006; 9 pages.
USPTO Non-Final Rejection for U.S. Appl. No. 11/132,894 dated Dec. 19, 2006; 12 pages.
USPTO Non-Final Rejection for U.S. Appl. No. 11/166,622 dated Jun. 22, 2010; 11 pages.
USPTO Non-Final Rejection for U.S. Appl. No. 11/166,622 dated Sep. 29, 2009; 11 pages.
USPTO Non-Final Rejection for U.S. Appl. No. 11/200,619 dated Jan. 31, 2011; 14 pages.
USPTO Non-Final Rejection for U.S. Appl. No. 11/200,619 dated Jun. 17, 2009; 12 pages.
USPTO Non-Final Rejection for U.S. Appl. No. 11/200,619 dated Aug. 27, 2008; 13 pages.
USPTO Non-Final Rejection for U.S. Appl. No. 11/201,627 dated Sep. 30, 2010; 6 pages.
USPTO Non-Final Rejection for U.S. Appl. No. 11/201,627 dated Nov. 16, 2007; 16 pages.
USPTO Non-Final Rejection for U.S. Appl. No. 11/201,627 dated Dec. 12, 2008; 17 pages.
USPTO Non-Final Rejection for U.S. Appl. No. 11/201,627 dated Dec. 24, 2009; 22 pages.
USPTO Non-Final Rejection for U.S. Appl. No. 11/201,922 dated Jun. 11, 2010, 12 pages.
USPTO Non-Final Rejection for U.S. Appl. No. 11/201,922 dated Oct. 15, 2007; 10 pages.
USPTO Non-Final Rejection for U.S. Appl. No. 11/201,922 dated Oct. 21, 2008; 12 pages.
USPTO Non-Final Rejection for U.S. Appl. No. 11/201,922 dated Dec. 28, 2010; 14 pages.
USPTO Non-Final Rejection for U.S. Appl. No. 11/273,708 dated Mar. 19, 2007; 16 pages.
USPTO Non-Final Rejection for U.S. Appl. No. 11/322,044 dated Apr. 11, 2008; 11 pages.
USPTO Non-Final Rejection for U.S. Appl. No. 11/322,044 dated Apr. 24, 2007; 13 pages.
USPTO Non-Final Rejection for U.S. Appl. No. 11/322,044 dated May 4, 2009; 18 pages.
USPTO Non-Final Rejection for U.S. Appl. No. 11/322,044 dated Nov. 25, 2008; 15 pages.
USPTO Non-Final Rejection for U.S. Appl. No. 11/337,272 dated May 17, 2007; 11 pages.
USPTO Non-Final Rejection for U.S. Appl. No. 11/337,272 dated Oct. 24, 2006; 9 pages.
USPTO Non-Final Rejection for U.S. Appl. No. 11/347,189 dated Jun. 8, 2007; 6 pages.
USPTO Non-Final Rejection for U.S. Appl. No. 11/415,588 dated Jun. 13, 2007; 8 pages.
USPTO Non-Final Rejection for U.S. Appl. No. 11/644,100 dated Mar. 9, 2009; 11 pages.
USPTO Non-Final Rejection for U.S. Appl. No. 11/644,100 dated Apr. 14, 2008; 10 pages.
USPTO Non-Final Rejection for U.S. Appl. No. 11/644,100 dated Sep. 15, 2010; 10 pages.
USPTO Non-Final Rejection for U.S. Appl. No. 11/644,100 dated Dec. 16, 2009; 13 pages.
USPTO Non-Final Rejection for U.S. Appl. No. 11/698,660 dated May 21, 2010; 15 pages.
USPTO Non-Final Rejection for U.S. Appl. No. 11/698,660 dated Oct. 7, 2009; 12 pages.
USPTO Notice of Allowance for U.S. Appl. No. 10/288,003 dated Jan. 14, 2005; 6 pages.
USPTO Notice of Allowance for U.S. Appl. No. 10/293,392 dated Mar. 10, 2004; 6 pages.
USPTO Notice of Allowance for U.S. Appl. No. 10/305,589 dated Feb. 4, 2005; 5 pages.
USPTO Notice of Allowance for U.S. Appl. No. 10/324,455 dated Feb. 12, 2004; 4 pages.
USPTO Notice of Allowance for U.S. Appl. No. 10/327,207 dated Jun. 11, 2007; 4 pages.
USPTO Notice of Allowance for U.S. Appl. No. 10/327,207 dated Dec. 26, 2006; 5 pages.
USPTO Notice of Allowance for U.S. Appl. No. 10/327,217 dated Aug. 12, 2004; 6 pages.
USPTO Notice of Allowance for U.S. Appl. No. 10/329,162 dated Jul. 5, 2007; 7 pages.
USPTO Notice of Allowance for U.S. Appl. No. 10/653,050 dated Jul. 29, 2004; 3 pages.
USPTO Notice of Allowance for U.S. Appl. No. 10/803,030 dated Jan. 8, 2007; 6 pages.
USPTO Notice of Allowance for U.S. Appl. No. 10/871,582 dated Mar. 30, 2006; 6 pages.
USPTO Notice of Allowance for U.S Appl. No. 11/088,028 dated Jan. 26, 2007; 6 pages.
USPTO Notice of Allowance for U.S. Appl. No. 11/088,028 dated Jul. 2, 2007; 6 pages.
USPTO Notice of Allowance for U.S. Appl. No. 11/125,554 dated Feb. 7, 2008; 4 pages.

USPTO Notice of Allowance for U.S. Appl. No. 11/125,554 dated Apr. 24, 2007; 7 pages.
USPTO Notice of Allowance for U.S. Appl. No. 11/132,894 dated Apr. 26, 2007; 4 pages.
USPTO Notice of Allowance for U.S. Appl. No. 11/201,627 dated Jan. 20, 2011; 8 pages.
USPTO Notice of Allowance for U.S. Appl. No. 11/201,922 dated Apr. 9, 2009; 4 pages.
USPTO Notice of Allowance for U.S. Appl. No. 11/273,708 dated Aug. 9, 2007; 4 pages.
USPTO Notice of Allowance for U.S. Appl. No. 11/337,272 dated Aug. 15, 2007; 9 pages.
USPTO Notice of Allowance for U.S. Appl. No. 11/347,189 dated Sep. 27, 2007; 4 pages.
USPTO Notice of Allowance for U.S. Appl. No. 11/415,588 dated Mar. 11, 2008; 6 pages.
USPTO Notice of Allowance for U.S. Appl. No. 11/644,100 dated Jan. 6, 2011; 6 pages.
USPTO Notice of Allowance for U.S. Appl. No. 11/709,866 dated Feb. 16, 2010; 7 pages.
USPTO Notice of Allowance for U.S. Appl. No. 11/709,866 dated Apr. 7, 2009; 8 pages.
USPTO Notice of Allowance for U.S. Appl. No. 11/709,866 dated Aug. 4, 2009; 7 pages.
USPTO Notice of Allowance for U.S. Appl. No. 11/799,439 dated Feb. 5, 2010; 4 pages.
USPTO Notice of Allowance for U.S. Appl. No. 11/799,439 dated Jun. 25, 2009; 6 pages.
USPTO Notice of Allowance for U.S. Appl. No. 11/850,260 dated Jul. 2, 2010; 8 pages.
USPTO Notice of allowance for U.S. Appl. No. 11/965,291 dated Jan. 13, 2010; 4 pages.
USPTO Notice of Allowance for U.S. Appl. No. 11/965,291 dated May 5, 2009; 7 pages.
USPTO Notice of Allowance for U.S. Appl. No. 11/965,677 dated Feb. 12, 2010; 4 pages.
USPTO Notice of Allowance for U.S. Appl. No. 11/965,877 dated Sep. 10, 2009; 6 pages.
USPTO Notice of Allowance for U.S. Appl. No. 11/983,291 dated Oct. 22, 2009; 7 pages.
USPTO Notice of Allowance for U.S. Appl. No. 11/985,340 dated Feb. 19, 2010, 8 pages.
USPTO Notice of Allowance for U.S. Appl. No. 11/985,340 dated Jun. 2, 2009; 7 pages.
USPTO Notice of Allowance for U.S. Appl. No. 11/985,340 dated Jun. 9, 2010; 8 pages.
USPTO Notice of Allowance for U.S. Appl. No. 11/985,340 dated Nov. 9, 2009; 7 pages.
USPTO Notice of Allowance for U.S. Appl. No. 11/986,338 dated Feb. 16, 2010; 4 pages.
USPTO Notice of Allowance for U.S. Appl. NO. 11/986,338 dated Oct. 19, 2009; 4 pages.
USPTO Notice of Allowance for U.S. Appl. No. 11/986,338 dated May 7, 2009; 1 page.
USPTO Notice of Allowance for U.S. Appl. No. 12/004,833 dated Mar. 1, 2012; 7 pages.
USPTO Notice of Allowance for U.S. Appl. No. 12/004,833 dated May 24, 2012; 5 pages.
USPTO Notice of Allowance for U.S. Appl. No. 12/004,833 dated Jun. 21, 2012; 5 pages.
USPTO Notice of Allowance for U.S. Appl. No. 12/004,833 dated Jul. 19, 2012; 5 pages.
USPTO Notice of Allowance for U.S. Appl. No. 12/057,149 dated Mar. 17, 2011; 8 pages.
USPTO Notice of Allowance for U.S. Appl. No. 12/057,149 dated Jul. 8, 2011; 8 pages.
USPTO Notice of Allowance for U.S. Appl. No. 12/057,149 dated Nov. 30, 2010; 7 pages.
USPTO Notice of Allowance for U.S. Appl. No. 12/058,569 dated Apr. 11, 2011; 7 pages.
USPTO Non-Final Rejection for U.S. Appl. No. 09/992,076 dated Nov. 21, 2005; 29 pages.
USPTO Non-Final Rejection for U.S. Appl. No. 09/994,600 dated May 15, 2007; 14 pages.
USPTO Non-Final Rejection for U.S. Appl. No. 09/994,600 dated Jul. 17, 2006; 14 pages.
USPTO Non-Final Rejection for U.S. Appl. No. 09/994,600 dated Aug. 23, 2005; 13 pages.
USPTO Non-Final Rejection for U.S. Appl. No. 09/994,600 dated Oct. 21, 2004; 37 pages.
USPTO Non-Final Rejection for U.S. Appl. No. 09/994,601 dated Oct. 4, 2007; 20 pages.
USPTO Non-Final Rejection for U.S. Appl. No. 09/994,601 dated Sep. 21, 2005; 12 pages.
USPTO Non-Final Rejection for U.S. Appl. No. 09/994,601 dated Nov. 14, 2006; 15 pages.
USPTO Non-Final Rejection for U.S. Appl. No. 09/994,601 dated Jul. 29, 2004; 10 pages.
USPTO Non-Final Rejection for U.S. Appl. No. 09/998,834 dated Sep. 20, 2004; 11 pages.
USPTO Non-Final Rejection for U.S. Appl. No. 09/998,848 dated Jan. 26, 2006; 17 pages.
USPTO Non-Final Rejection for U.S. Appl. No. 09/998,848 dated Jan. 29, 2007; 13 pages.
USPTO Non-Final Rejection for U.S. Appl. No. 09/998,848 dated Feb. 22, 2008; 15 pages.
USPTO Non-Final Rejection for U.S. Appl. No. 09/998,848 dated Dec. 21, 2004; 14 pages.
USPTO Non-Final Rejection for U.S. Appl. No. 09/998,859 dated May 15, 2003; 6 pages.
USPTO Non-Final Rejection for U.S. Appl. No. 09/998,859 dated May 28, 2003; 6 pages.
USPTO Non-Final Rejection for U.S. Appl. No. 09/998,859 dated Nov. 4, 2004; 6 pages.
USPTO Non-Final Rejection for U.S. Appl. No. 10/001,477 dated Jan. 22, 2007; 15 pages.
USPTO Non-Final Rejection for U.S. Appl. No. 10/001,477 dated Mar. 2, 2006; 14 pages.
USPTO Non-Final Rejection for U.S. Appl. No. 10/001,477 dated Dec. 6, 2007; 13 pages.
USPTO Non-Final Rejection for U.S. Appl. No. 10/002,217 dated Apr. 3, 2006; 12 pages.
USPTO Non-Final Rejection for U.S. Appl. No. 10/008,096 dated Mar. 7, 2007; 19 pages.
USPTO Non-Final Rejection for U.S. Appl. No. 10/008,096 dated Apr. 17, 2006; 18 pages.
USPTO Non-Final Rejection for U.S. Appl. No. 10/008,096 dated Jun. 14, 2004; 24 pages.
USPTO Non-Final Rejection for U.S. Appl. No. 10/008,096 dated Jun. 24, 2005; 15 pages.
USPTO Non-Final Rejection for U.S. Appl. No. 10/008,096 dated Dec. 12, 2007; 14 pages.
USPTO Non-Final Rejection for U.S. Appl. No. 10/033,027 dated Apr. 20, 2005; 20 pages.
USPTO Non-Final Rejection for U.S. Appl. No. 10/033,027 dated Apr. 26, 2006; 26 pages.
USPTO Non-Final Rejection for U.S. Appl. No. 10/033,027 dated Oct. 18, 2004; 17 pages.
USPTO Non-Final Rejection for U.S. Appl. No. 10/033,027 dated Dec. 18, 2008; 5 pages.
USPTO Non-Final Rejection for U.S. Appl. No. 10/033,027 dated Dec. 21, 2006; 31 pages.
USPTO Non-Final Rejection for U.S. Appl. No. 10/113,065 dated May 20, 2005; 14 pages.
USPTO Non-Final Rejection for U.S. Appl. No. 10/238,966 date Apr. 6, 2006; 8 pages.
USPTO Non-Final Rejection for U.S. Appl. No. 10/238,966 dated Apr. 19, 2007; 7 pages.
USPTO Non-Final Rejection for U.S. Appl. No. 10/238,966 dated Jun. 30, 2008; 12 pages.
USPTO Non-Final Rejection for U.S. Appl. No. 10/238,966 dated Oct. 20, 2006; 8 pages.
USPTO Non-Final Rejection for U.S. Appl. No. 10/238,966 dated Dec. 26, 2007; 12 pages.

USPTO Non-Final Rejection for U.S. Appl. No. 09/404,891 dated Jan. 5, 2004; 5 pages.
USPTO Non-Final Rejection for U.S. Appl. No. 09/404,891 dated Mar. 5, 2003; 6 pages.
USPTO Non-Final Rejection for U.S. Appl. No. 09/404,891 dated Jun. 25, 2004; 6 pages.
USPTO Non-Final Rejection for U.S. Appl. No. 09/404,891 dated Jul. 10, 2003; 6 pages.
USPTO Non-Final Rejection for U.S. Appl. No. 09/404,891 dated Oct. 11, 2002, 5 pages.
USPTO Non-Final Rejection for U.S. Appl. No. 09/475,808 dated Jun. 6, 2001; 6 pages.
USPTO Non-Final Rejection for U.S. Appl. No. 09/475,879 dated Mar. 8, 2001; 6 pages.
USPTO Non-Final Rejection for U.S. Appl. No. 09/826,397 dated Apr. 21, 2004; 6 pages.
USPTO Non-Final Rejection for U.S. Appl. No. 09/855,868 dated Aug. 26, 2004; 7 pages.
USPTO Non-Final Rejection for U.S. Appl. No. 09/875,599 dated May 31, 2006; 18 pages.
USPTO Non-Final Rejection for U.S. Appl. No. 09/875,599 dated Oct. 27, 2003; 13 pages.
USPTO Non-Final Rejection for U.S. Appl. No. 09/875,599 dated Dec. 3, 2004; 16 pages.
USPTO Non-Final Rejection for U.S. Appl. No. 09/887,923 dated May 25, 2004; 7 pages.
USPTO Non-Final Rejection for U.S. Appl. No. 09/887,955 dated May 26, 2004; 5 pages.
USPTO Non-Final Rejection for U.S. Appl. No. 09/893,048 dated Jan. 12, 2006; 6 pages.
USPTO Non-Final Rejection for U.S. Appl. No. 09/893,048 dated Jul. 27, 2005; 6 pages.
USPTO Non-Final Rejection for U.S. Appl. No. 09/893,048 dated Oct. 6, 2004; 5 pages.
USPTO Non-Final Rejection for U.S. Appl. No. 09/893,050 dated Jan. 5, 2005; 13 pages.
USPTO Non-Final Rejection for U.S. Appl. No. 09/893,050 dated Jan. 15, 2004; 9 pages.
USPTO Non-Final Rejection for U.S. Appl. No. 09/909,047 dated Jul. 6, 2004; 9 pages.
USPTO Non-Final Rejection for U.S. Appl. No. 09/912,768 dated Apr. 11, 2005; 14 pages.
USPTO Non-Final Rejection for U.S. Appl. No. 09/912,768 dated Jun. 22, 2004; 11 pages.
USPTO Non-Final Rejection for U.S. Appl. No. 09/922,579 dated Aug. 18, 2004; 6 pages.
USPTO Non-Final Rejection for U.S. Appl. No. 09/923,461 dated Jul. 16, 2004; 6 pages.
USPTO Non-Final Rejection for U.S. Appl. No. 09/929,891 dated Sep. 13, 2004; 6 pages.
USPTO Non-Final Rejection for U.S. Appl. No. 09/930,021 dated Apr. 26, 2004; 6 pages.
USPTO Non-Final Rejection for U.S. Appl. No. 09/943,062 dated Jan. 27, 2003; 7 pages.
USPTO Non-Final Rejection for U.S. Appl. No. 09/943,062 dated Jun. 22, 2007; 12 pages.
USPTO Non-Final Rejection for U.S. Appl. No. 09/943,062 dated Sep. 11, 2002; 9 pages.
USPTO Non-Final Rejection for U.S. Appl. No. 09/943,062 dated Dec. 8, 2003; 9 pages.
USPTO Non-Final Rejection for U.S. Appl. No. 09/943,149 dated Aug. 28, 2003; 9 pages.
USPTO Non-Final Rejection for U.S. Appl. No. 09/943,149 dated Nov. 20, 2002; 7 pages.
USPTO Non-Final Rejection for U.S. Appl. No. 09/953,423 dated Feb. 6, 2004; 5 pages.
USPTO Non-Final Rejection for U.S. Appl. No. 09/957,084 dated Aug. 23, 2002, 6 pages.
USPTO Non-Final Rejection for U.S. Appl. No. 09/957,084 dated Aug. 27, 2003; 8 pages.
USPTO Non-Final Rejection for U.S. Appl. No. 09/969,311 dated Sep. 21, 2004; 4 pages.
USPTO Non-Final Rejection for U.S. Appl. No. 09/969,311 dated Nov. 6, 2002; 8 pages.
USPTO Non-Final Rejection for U.S. Appl. No. 09/969,313 dated May 6, 2005; 9 pages.
USPTO Non-Final Rejection for U.S. Appl. No. 09/972,003 dated Feb. 2, 2004; 10 pages.
USPTO Non-Final Rejection for U.S. Appl. No. 09/972,003 dated Aug. 19, 2003; 11 pages.
USPTO Non-Final Rejection for U.S. Appl. No. 09/972,133 dated Mar. 8, 2005; 9 pages.
USPTO Non-Final Rejection for U.S. Appl. No. 09/972,133 dated Nov. 25, 2005; 9 pages.
USPTO Non-Final Rejection for U.S. Appl. No. 09/972,319 dated Sep. 16, 2004; 9 pages.
USPTO Non-Final Rejection for U.S. Appl. No. 09/975,030 dated Mar. 29, 2005, 13 pages.
USPTO Non-Final Rejection for U.S. Appl. No. 09/975,030 dated Oct. 20, 2005; 7 pages.
USPTO Non-Final Rejection for U.S. Appl. No. 09/975,104 dated Mar. 21, 2005; 7 pages.
USPTO Non-Final Rejection for U.S. Appl. No. 09/975,104 dated Jun. 16, 2006; 8 pages.
USPTO Non-Final Rejection for U.S. Appl. No. 09/975,104 dated Aug. 16, 2005; 6 pages.
USPTO Non-Final Rejection for U.S. Appl. No. 09/975,338 dated Apr. 30, 2010; 2 pages.
USPTO Non-Final Rejection for U.S. Appl. No. 09/975,338 dated Aug. 14, 2007; 19 pages.
USPTO Non-Final Rejection for U.S. Appl. No. 09/975,338 dated Sep. 6, 2006; 11 pages.
USPTO Non-Final Rejection for U.S. Appl. No. 09/989,570 dated Jan. 2, 2003; 7 pages.
USPTO Non-Final Rejection for U.S. Appl. No. 09/989,570 dated Jan. 26, 2005; 9 pages.
USPTO Non-Final Rejection for U.S. Appl. No. 09/989,570 dated Mar. 25, 2004; 8 pages.
USPTO Non-Final Rejection for U.S. Appl. No. 09/989,570 dated Oct. 7, 2003; 6 pages.
USPTO Non-Final Rejection for U.S. Appl. No. 09/989,571 dated May 23, 2005, 8 pages.
USPTO Non-Final Rejection for U.S. Appl. No. 09/989,571 dated Jul. 12, 2004; 9 pages.
USPTO Non-Final Rejection for U.S. Appl. No. 09/989,761 dated Mar. 10, 2004; 6 pages.
USPTO Non-Final Rejection for U.S. Appl. No. 09/989,761 dated Apr. 18, 2003; 5 pages.
USPTO Non-Final Rejection for U.S. Appl. No. 09/989,762 dated Jul. 23, 2007; 15 pages.
USPTO Non-Final Rejection for U.S. Appl. No. 09/989,762 dated Jul. 27, 2005; 15 pages.
USPTO Non-Final Rejection for U.S. Appl. No. 09/989,762 dated Aug. 10, 2006; 18 pages.
USPTO Non-Final Rejection for U.S. Appl. No. 09/989,767 dated May 12, 2009; 21 pages.
USPTO Final Rejection for U.S. Appl. No. 09/989,771 dated Apr. 6, 2005; 7 pages.
USPTO Final Rejection for U.S. Appl. No. 09/989,771 dated Dec. 10, 2008; 12 pages.
USPTO Final Rejection for U.S. Appl. No. 09/989,771 dated Dec. 27, 2007; 15 pages.
USPTO Final Rejection for U.S. Appl. No. 09/989,777 dated Jan. 30, 2008; 14 pages.
USPTO Final Rejection for U.S. Appl. No. 09/989,777 dated Mar. 13, 2007; 24 pages.
USPTO Final Rejection for U.S. Appl. No. 09/989,777 dated Dec. 21, 2005, 29 pages.
USPTO Final Rejection for U.S. Appl. No. 09/989,778 dated Mar. 16, 2009; 26 pages.
USPTO Final Rejection for U.S. Appl. No. 09/989,778 dated Jan. 8, 2009; 25 pages.
USPTO Final Rejection for U.S. Appl. No. 09/989,778 dated Feb. 5, 2007; 17 pages.

USPTO Final Rejection for U.S. Appl. No. 09/989,778 dated Feb. 15, 2006; 9 pages.
USPTO Final Rejection for U.S. Appl. No. 09/989,778 dated Dec. 20, 2007; 14 pages.
USPTO Final Rejection for U.S. Appl. No. 09/989,782 dated Jul. 9, 2008; 10 pages.
USPTO Final Rejection for U.S. Appl. No. 09/989,782 dated Jul. 24, 2007; 9 pages.
USPTO Final Rejection for U.S. Appl. No. 09/989,782 dated Sep. 21, 2006; 10 pages.
USPTO Final Rejection for U.S. Appl. No. 09/989,782 dated Nov. 3, 2005; 11 pages.
USPTO Final Rejection for U.S. Appl. No. 09/992,076 dated Jan. 30, 2007; 32 pages.
USPTO Final Rejection for U.S. Appl. No. 09/992,076 dated Mar. 17, 2006; 16 pages.
USPTO Final Rejection for U.S. Appl. No. 09/994,600 dated Feb. 13, 2006; 13 pages.
USPTO Final Rejection for U.S. Appl. No. 09/994,600 dated May 4, 2005; 16 pages.
USPTO Final Rejection for U.S. Appl. No. 09/994,600 dated Oct. 17, 2007; 13 pages.
USPTO Final Rejection for U.S. Appl. No. 09/994,600 dated Dec. 8, 2006; 14 pages.
USPTO Final Rejection for U.S. Appl. No. 09/994,601 dated Apr. 17, 2008; 24 pages
USPTO Final Rejection for U.S. Appl. No. 09/994,601 dated May 18, 2007; 17 pages.
USPTO Final Rejection for U.S. Appl. No. 09/994,601 dated Mar. 8, 2006; 11 pages.
USPTO Final Rejection for U.S. Appl. No. 09/994,601 dated Mar. 24, 2005; 10 pages.
USPTO Final Rejection for U.S. Appl. No. 09/998,848 dated Jun. 14, 2005; 17 pages.
USPTO Final Rejection for U.S. Appl. No. 09/998,848 dated Jul. 25, 2006; 16 pages.
USPTO Final Rejection for U.S. Appl. No. 09/998,848 dated Aug. 10, 2007; 14 pages.
USPTO Final Rejection for U.S. Appl. No. 09/998,848 dated Nov. 24, 2008; 15 pages.
USPTO Final Rejection for U.S. Appl. No. 09/998,859 dated Nov. 19, 2003; 5 pages.
USPTO Final Rejection for U.S. Appl. No. 10/001,477 dated Jun. 30, 2008; 15 pages.
USPTO Final Rejection for U.S. Appl. No. 10/001,477 dated Jul. 23, 2007; 16 pages.
USPTO Final Rejection for U.S. Appl. No. 10/001,477 dated Aug. 24, 2006; 13 pages.
USPTO Final Rejection for U.S. Appl. No. 10/001,477 dated Oct. 24, 2005; 13 pages.
USPTO Final Rejection for U.S. Appl. No. 10/002,217 dated Feb. 6, 2008; 10 pages.
USPTO Final Rejection for U.S. Appl. No. 10/002,217 dated Mar. 7, 2007; 12 pages.
USPTO Final Rejection for U.S. Appl. No. 10/002,217 dated Nov. 17, 2005, 17 pages.
USPTO Final Rejection for U.S. Appl. No. 10/008,096 dated Feb. 10, 2005; 15 pages.
USPTO Final Rejection for U.S. Appl. No. 10/008,096 dated Jun. 16, 2008; 23 pages.
USPTO Final Rejection for U.S. Appl. No. 10/008,096 dated Sep. 4, 2007; 19 pages.
USPTO Final Rejection for U.S. Appl. No. 10/008,096 dated Oct. 13, 2006; 17 pages.
USPTO Final Rejection for U.S. Appl. No. 10/008,09 dated Nov. 25, 2005; 17 pages.
USPTO Final Rejection for U.S. Appl. No. 10/033,027 dated Jun. 8, 2007; 8 pages.
USPTO Final Rejection for U.S. Appl. No. 10/033,027 dated Aug. 9, 2006; 6 pages.
USPTO Final Rejection for U.S. Appl. No. 10/033,027 dated Oct. 31, 2005; 24 pages.
USPTO Final Rejection for U.S. Appl. No. 10/113,065 dated Oct. 26, 2005; 17 pages.
USPTO Final Rejection for U.S. Appl. No. 10/238,966 dated Sep. 27, 2007; 9 pages.
USPTO Final Rejection for U.S. Appl. No. 11/968,145 dated Aug. 2, 2010; 6 pages.
USPTO Final Rejection for U.S. Appl. No. 12/058,534 dated Apr. 25, 2012; 12 pages.
USPTO Final Rejection for U.S. Appl. No. 09/404,891 dated Dec. 8, 2004; 7 pages.
"An Analog PPL-Based Clock and Data Recovery Circuit with High Input Jitter Tolerance;" Sun, Reprinted from IEEE Journal of Solid-State Circuits, 1989;4 pages.
"Electronic Circuit Protector-Circuit Breaker;" IBM Technical Disclosure Bulletin; vol. 36, Issue 8, Aug. 1, 1993; 1 page.
"In-Circuit Emulators—descriptions of the major ICEs around," retrieved on Nov. 14, 2005 from http://www.algonet.se/~staffann/developer/emulator.htm; 6 pages.
"Microsoft Files Summary Judgement Motions"; Feb. 1999; Microsoft PressPass. retrieved on May 20, 2005 from http://www.microsoft.com/presspass/press/1999/feb99/Feb99/Calderapr.asp; 3 pages.
"New Object Domain R3 Beta Now Available (Build 134)!" Mar. 13, 2001; http://web.archive.org/web/200100331202605/www.objectdomain.com/domain30/index.html; 2 pages.
"OMG XML Metadata Interchange (XMI) Specifications" 2000; 17 pages.
"POD—Piece of Data, Plain Old Documentation, Plain Old Dos . . . "; retrieved on Nov. 14, 2005 from http://www.auditmypc.com/acronym/POD.asp; 2 pages.
"PSoC Designer: Integrated Development Environment User Guide"; Jul. 17, 2001; Cypress MicroSystems, Revision 1.11; all pages.
"PSoC designer: Integrated development environment, getting started 25-minute tutorial, version 1.0," Cypress Microsystems., Cypress Microsystems, Inc. CMS10006A, Jul. 3, 2001; 25 pages.
"PSoC technology complete changes 8-bit MCU system design", Cypress Microsystems, Inc, retrieved from <http>://www.archive.org/web/20010219005250/http://cypressmicro.com-/t. .>, Feb. 19, 2001; 21 pages.
"The Gemini Netlist Comparison Project;" <http://www.cs.washington.edu/research/projects/lis/www/gemini/gemini.html> larry@cs.washington.edu; Mar. 19, 2002; 2 pages.
"VHDL Samples" retrieved on Jan. 29, 2007 from http://www.csee.umbc.edu/help/VHDL/samples/samples.shtml; 10 pages.
"Webster's Third New International Dictionary," 1996, G. & C. Merriam Company; 3 pages (including pp. 1328-1329).
A.F. Harvey "DMA Fundamentals on Various PC Platforms," 2001, 2004, National Instruments Corporation; pp. 1-19; 19 pages.
Adham et al., "Preliminary Outline of the IEEE P1500 Scalable Architecture for Testing Embedded Cores," 1999, IEEE; 6 pages.
Andrew S. Tanenbaum with contributions from James R. Goodman, "Structured Computer Organization," 1999, Prentice Hall, Fourth Edition; 32 pages.
Andrews, "Roadmap for Extending IEEE 1149.1 for Hierarchical Control of Locally-Stored, Standardized command Set, Test Programs," IEEE; 1994; 7 pages.
Anonymous. "F/Port:Fast Paraliel Port for the PC" Installation Manual Release 7.1, circa 1997, available for download from http://www.fapo.com/fport.htm; 25 pages.
Anonymous, "JEEN JTAG Embedded Ice Ethernet Interface," Aug. 1999, Embedded Performance, Inc.; 3 pages.
Anonymous, "Lotus Notes FAQ—How do you generate unique document numbers?" Sep. 19, 1999; retrieved from www.keysolutions.com on Jul. 9, 2008; 1 page.
Anonymous, "Warp Mile Engineering—The IEEE 1284 Experts—F/Pod Product Sheet," undated web page found at http://www.fapo.com/fport.htm; printed on Feb. 12, 2005; 2 pages.
Anonymous; "Using Debug"; 1999; Prentice-Hall Publishing; 20 pages.
U.S. Appl. No. 09/207,912: "Circuit(s), Architecture and Method(s) for Operating and/or Tuning a Ring Oscillator," Monte Mar, filed Dec. 9, 1998; 23 pages.

U.S. Appl. No. 09/747,281: "Linearized Digital Phase-Locked Loop Method," Williams et al.; filed Dec. 21, 2000; 29 pages.

U.S. Appl. No. 09/842,966: "Precision Crystal Oscillator Circuit Used in Microcontroller," Monte Mar, filed Apr. 25, 2001; 28 pages.

U.S. Appl. No. 09/943,062: "Apparatus and Method for Programmable Power Management in a Programmable Analog Circuit Block," Monte Mar, filed Aug. 29, 2001; 46 pages.

U.S. Appl. No. 09/964,991: "A Novel Band-Gap Circuit for Providing an Accurate Reference Voltage Compensated for Process State, Process Variations and Temperature," Kutz et al., filed Sep. 26, 2001; 26 pages.

U.S. Appl. No. 09/989,775: "User defined names for registers in memory banks derived from configurations," Ogami et al., filed Nov. 19, 2001; 29 pages.

U.S. Appl. No. 10/002,726: "Method and Appartus for Generating Microcontroller Configuration Information," Ogami et al., filed Oct. 24, 2001; 54 pages.

U.S. Appl. No. 10/024,093: "Configurable Memory for Programmable Logic Circuits," Lacey et al., filed Dec. 18, 2001; 25 pages.

U.S. Appl. No. 10/137,497: "Reconfigurable Testing System and Method," Pleis et al.: filed May 1, 2002, 40 pages.

U.S. Appl. No. 10/172,670: "Method and System for Programming a Memory Device," Snyder et al.; filed Jun. 13, 2002; 66 pages.

U.S. Appl. No. 10/238,986: "Method for Parameterizing a User Module," Perrin et al., filed Sep. 9, 2002; 41 pages.

U.S. Appl. No. 10/653,050: "Method and System for Programming a Memory Device," Snyder et al.; filed Aug. 29, 2003; 69 pages.

U.S. Appl. No. 11/088,028: "Method and Circuit for Rapid Alignment of Signals," Mayal et al., filed Nov. 13, 2007; 34 pages.

U.S. Appl. No. 11/166,622: "Touch Wake for Electronic Devices," Beard et al., filed Jun. 23, 2005; 22 pages.

U.S. Appl. No. 11/200,619: "Providing hardware independence to automat code generation of processing device firmware," Snyder et al.; filed Aug. 10, 2005; 41 pages.

U.S. Appl. No. 11/201,627: "Method and an apparatus to design a processing system using a graphical user interface," Ogami et al.; filed Aug. 10, 2005; 37 pages.

U.S. Appl. No. 11/818,005: "Techniques for Generating Microcontroller Configuration Information," Ogami et al., filed on Jun. 12, 2007; 61 pages.

U.S. Appl. No. 11/965,291: "Universal Digital Block Interconnection and Channel Routing," Snyder et al., filed Dec. 27, 2007; 31 pages.

U.S. Appl. No. 11/985,340: "Method and Circuit for Rapid Alignment of Signals," Moyal et al., filed Nov. 13, 2007; 34 pages.

U.S. Appl. No. 11/986,338: Reconfigurable Testing System and Method, Pleis et al., filed Nov. 20, 2007: 41 pages.

U.S. Appl. No. 12/004,833: "Systems and Methods for Dynamically Reconfiguring a Programmable System on a Chip," Memula, Suresh et al., filed Dec. 21, 2007; 50 pages.

U.S. Appl. No. 12/057,149 "Power Management Architecture, Method and Configuration System," Kenneth Y. Ogami et al., filed Mar. 27, 2008; 41 pages.

U.S. Appl. No. 12/058,534: "System and Method for Controlling a Target Device," Kenneth Ogami et al., filed Mar. 28, 2008; 55 pages.

U.S. Appl. No. 12/058,569: "Configuration of Programmable IC Design Elements," Best et al., filed Mar. 28, 2008; 19 pages.

U.S. Appl. No. 12/058 586: "System and Method for Monitoring a Target Device," Kenneth Ogami et al., filed Mar. 28, 2008; 56 pages.

U.S. Appl. No. 12/356,468: "System and Method for Dynamically Generating a Configuration Datasheet," Anderson et al.; filed Jan. 20, 2009; 27 pages.

U.S. Appl. No. 12/765,400: "Autonomous Control in a Programmable System," Sullam et al., filed Apr. 22, 2010; 30 pages.

USPTO Non-Final Rejection for U.S. Appl. No. 12/058,586 dated Jan. 28, 2013; 16 pages.

USPTO Non Final Rejection for U.S. Appl. No. 13/178,504 dated Mar. 29, 2013; 8 pages.

* cited by examiner

CONFIGURATION OF PROGRAMMABLE IC DESIGN ELEMENTS

CROSS-REFERENCE TO RELATED APPLICATIONS

This application is a continuation of U.S. application Ser. No. 12/058,569, filed Mar. 28, 2008, now U.S. Pat. No. 8,065,653, issued Nov. 22, 2011, which is a continuation-in-part of U.S. patent application Ser. No. 12/004,833, filed Dec. 21, 2007, now U.S. Pat. No. 8,266,675, issued Sep. 11, 2012, which claims the benefit of priority under 35 U.S.C. 119(e) to U.S. Provisional Patent Application Ser. No. 60/926,096 filed Apr. 25, 2007, all of which are incorporated by reference herein.

BACKGROUND OF THE INVENTION

Electronic systems and circuits have made a significant contribution towards the advancement of modern society and are utilized in a number of applications to achieve advantageous results. Electronic systems and circuits often include integrated circuits (ICs) fabricated on a single substrate that provide a variety of advantages over discrete component circuits. However, traditional design and manufacturing approaches for integrated circuits are often complex and consume significant resources.

In the past each given IC design was static. More recently, the semiconductor industry has developed a wide range of programmable integrated circuits. The programmable integrated circuits can be customized by system designers to perform a wide variety of tasks. Such configurable integrated circuits include field programmable gate arrays (FPGAs), complex programmable logic devices (CPLDs), field programmable analog arrays (FPAAs), and the like.

The configurable design elements of ICs may require configuration of operating parameters prior to run-time operation. Specifying operating parameters generally requires a time consuming and error prone process. For example, the configuration of programmable ICs typically involves complex interactions with complicated command structures and syntaxes that are not readily comprehensible or user friendly. Accordingly, there is a continued need for improved design techniques for use with programmable ICs and systems that include such ICs.

SUMMARY OF THE INVENTION

Embodiments of the present technology are directed toward techniques for configuring design elements of programmable integrated circuits (ICs). In one embodiment, a host computing device coupled to a programmable IC is adapted for configuring design elements utilizing a graphical interface. The graphical interface enables a user to specify configuration parameters for design elements that need to be configured prior to operation of the IC.

In another embodiment, a method of configuring a target system includes determining a design element of a programmable IC to be configured. A graphical user interface for configuring one or more parameters of the design element is generated. The target system may then be configured based on the one or more parameter values specified through the graphical user interface.

BRIEF DESCRIPTION OF THE DRAWINGS

Embodiments of the present invention are illustrated by way of example and not by way of limitation, in the figures of the accompanying drawings and in which like reference numerals refer to similar elements and in which.

DETAILED DESCRIPTION OF THE INVENTION

Reference will now be made in detail to the embodiments of the present technology, examples of which are illustrated in the accompanying drawings. While the present technology will be described in conjunction with these embodiments, it will be understood that they are not intended to limit the invention to these embodiments. On the contrary, the invention is intended to cover alternatives, modifications and equivalents, which may be included within the scope of the invention as defined by the appended claims. Furthermore, in the following detailed description of the present technology, numerous specific details are set forth in order to provide a thorough understanding of the present technology. However, it is understood that the present technology may be practiced without these specific details. In other instances, well-known methods, procedures, components, and circuits have not been described in detail as not to unnecessarily obscure aspects of the present technology.

Embodiments of the present technology generally relate to the field of integrated circuits (ICs). More specifically, embodiments pertain to systems and method for configuring design elements in a programmable IC. The techniques include a graphical user interface (GUI) based tool that allows a developer to configure design elements of the programmable integrated circuit.

Figure 1:
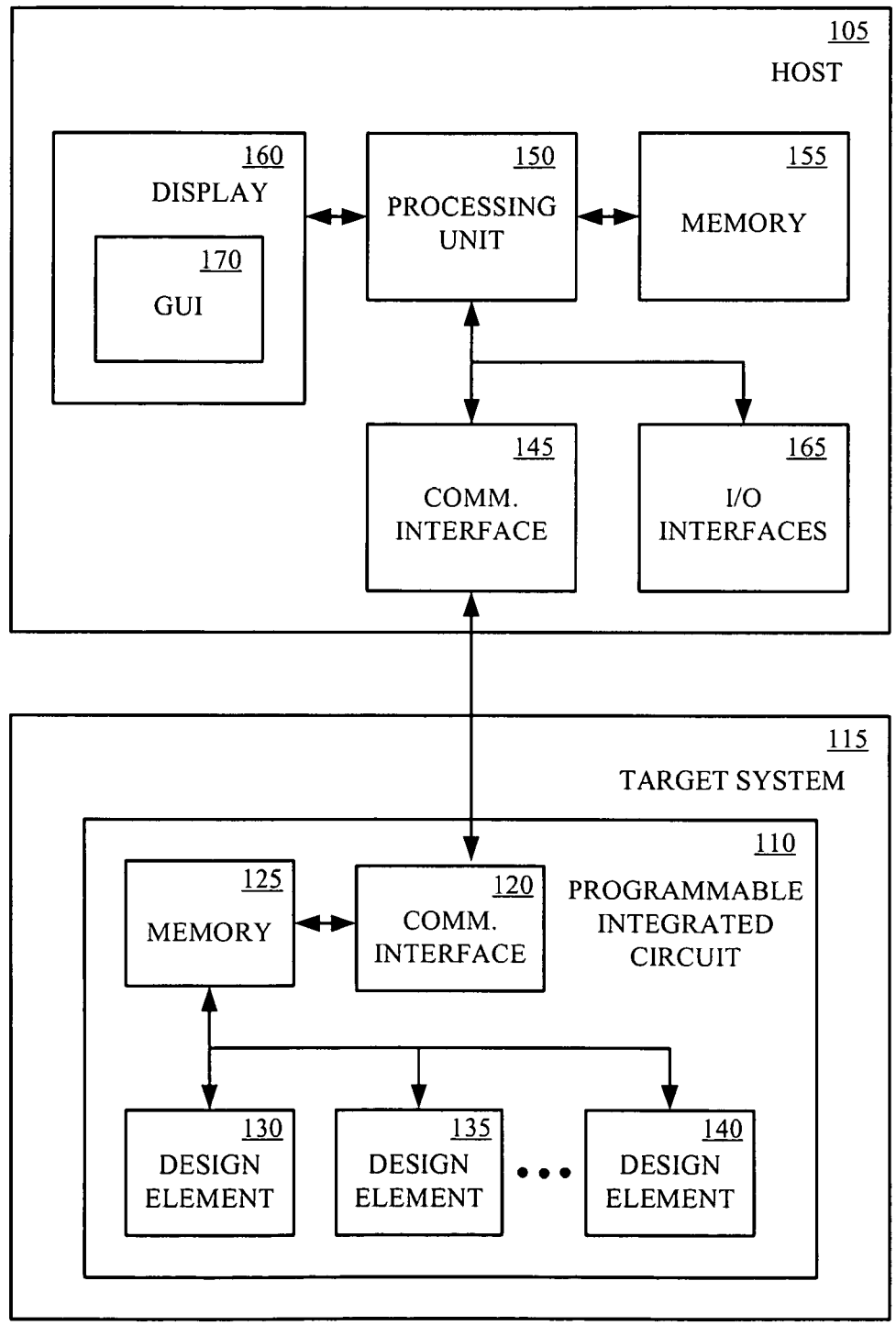
FIG. 1 shows a block diagram of an exemplary system for configuring a programmable integrated circuit (IC), in accordance with one embodiment of the present technology.

FIG. 1 shows an exemplary system for configuring a programmable IC, in accordance with one embodiment of the present technology. The system includes a host computing device 105 coupled to a programmable IC 110, or a target system 115 that includes a programmable IC 110. The programmable IC 110 includes one or more communication interfaces 120, memory 125, and a plurality of design elements 130-140. The design elements may be input devices, environmental measuring devices, transfer functions, output devices and/or the like. For example, the design elements may be buttons, sliders, light emitting diodes, device temperature sensors, capacitive sensors, alarms, fans, transfer function, microcontroller and the like, or diver circuits for such elements in the target system 115. The capacitive sensor elements may include capacitive sensors for buttons, linear and radial sliders, touchpads, touchscreens and the like. The light emitting elements may include light emitting diodes (LEDs), seven segmented LEDs, triads of high brightness colored LEDs (e.g., red, blue and green LEDs to produce a spectrum of colors), LCD displays and the like. The above described design elements are exemplary and it is appreciated that the design elements 130-140 may include any number of other similar elements that may be configured.

An exemplary family of programmable integrated circuits is the PSoC® programmable system on a chip, commercially available from Cypress Semiconductor of San Jose, Calif. One set of products, PSoC mixed signal arrays, are programmable systems-on-chips (SOCs) that integrate a microcontroller and the analog and digital components that typically surround it in an embedded system. A single PSoC device can integrate 100 or more peripheral functions with a microcontroller, saving customers design time, board space, power consumption and bill of materials costs.

The design elements 130-140 are high level functionality of lower level user modules configured in a particular manner. The lower level modules may include one or more analog function blocks and/or one or more digital function blocks. The analog and digital function blocks may be combined in a variety of configurations to accomplish a variety of functions (e.g., design elements). Different combinations of blocks, producing different functions, may exist at different times within the same IC and/or target system. For example, a set of function blocks configured to perform the functions of analog-to-digital conversion may sample an input signal. After processing the input signal in the digital domain, some or all of those same blocks, and perhaps in conjunction with other blocks, may be recombined in a different configuration to perform the function of digital-to-analog conversion to produce an output signal.

The host computing device 105 may be implemented on a variety of computing platforms, such as a personal computer (PC), workstation, server, distributed computing system, or the like. The host computing device 105 includes one or more communication interfaces 145, a processing unit 150, memory 155, a display 160, and one or more other input/output (I/O) interfaces 165. The I/O interfaces 165 may include a keyboard, a pointing device (e.g., mouse), speaker, printer and/or the like. The memory 155 may include one or more computing device readable media, such as non-volatile read-only memory (ROM), flash memory, volatile random access memory (RAM), optical storage (e.g., CD/DVD disk and drive), magnetic storage (e.g., hard disk drive (HDD)), and/or the like. The memory stores computing device executable commands and data (e.g., one or more software applications). The processing unit 150 implements one or more functions of the host 105 by executing one or more software applications stored in the memory. A portion of the computing device readable data and commands stored in the memory 144, when executed by the processor 150, implement a design tool for configuring the integrated circuit 110 and/or target system 115. The tool may also include simulation and monitoring tools. The tool generates a graphical user interface (GUI) 170 that is presented on the display 160 of the host 105. A user may select and configure various design element of the IC 110 through the GUI using the host keyboard, mouse and/or the like.

At least one communication interface 145 of the host computing device 105 and at least one communication interface 120 of the programmable integrated circuit 110 provides for communication between the host 105 and the integrated circuit 110. The communication interfaces 145, 120 may be any type of serial or parallel communication interfaces, such as Inter-Integrated Circuit (I2C) ports, Universal Serial Bus ports, Serial Peripheral Interface Bus (SPI) ports, Universal Asynchronous Receiver/Transmitter (UART) ports, Ethernet ports, and/or the like. If the communication ports of the host 105 and integrated circuit 110 are not the same, one or the other of the communication interfaces may also implement a bridging function to convert from one communication interface to another.

The memory 125 in the programmable IC 110 is computing device readable media for storing computing device readable commands and data. The memory includes non-volatile computing device readable media such as programmable read-only memory (PROM), electrically erasable PROM (EEPROM), flash memory and/or the like. The memory 125 may also include volatile computing device readable media such as random access memory (RAM) or the like. The memory 125 is used to store a configuration file that controls the functional coupling and configuration of the plurality of design elements 130-140 of the IC 110. The IC 110 may also read a portion, or all, of the configuration file from an externally coupled memory through a communication interface. The design tool on the host computing device 105 is utilized to create and modify the configuration file of the IC 110.

Figure 2:
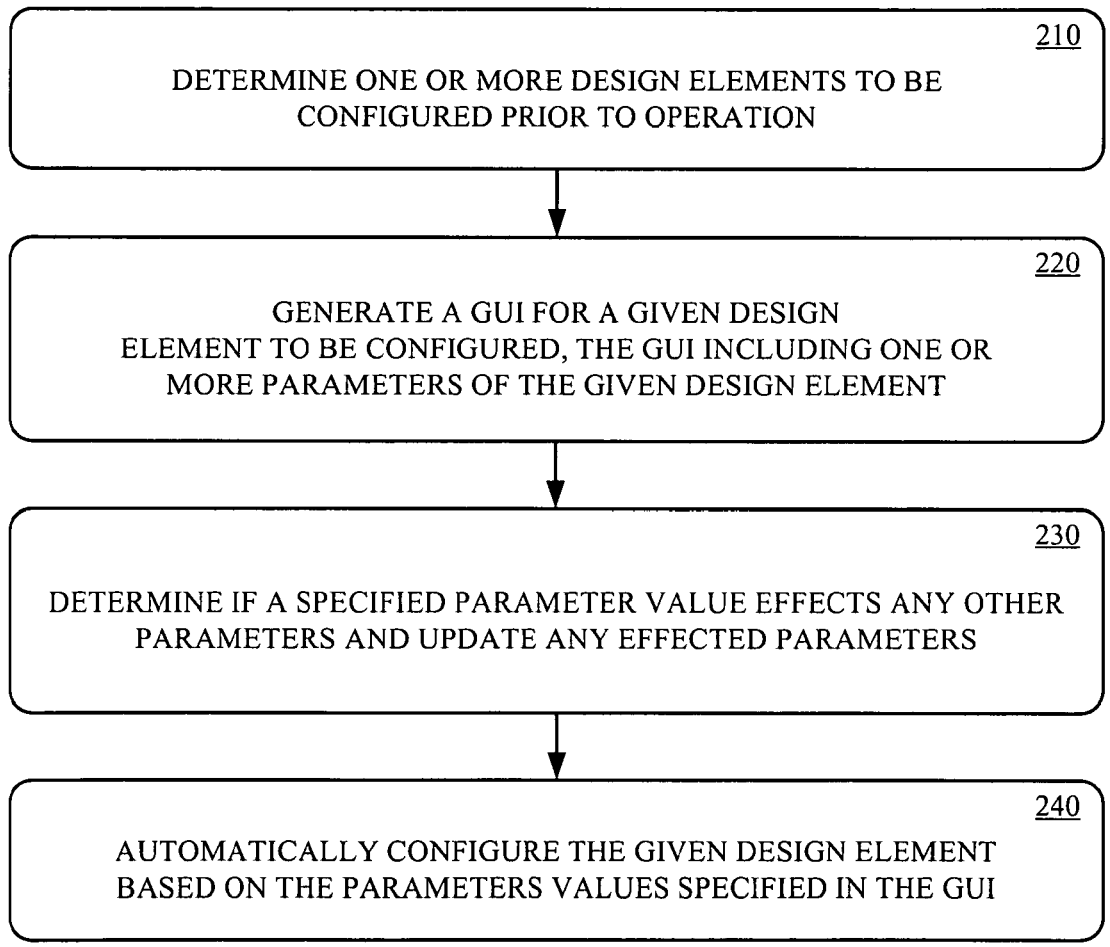
FIG. 2 shows a flow diagram of a method of configuring a programmable IC.

Operation of embodiments of the present technology will be further described with reference to FIG. 2, which shows a method of configuring a programmable IC. At 210, a design tool of the host computing device 105 determines if one or more selected design elements 130-140 need to be configured prior to operation of the programmable IC 110.

At 220, if a given design element needs to be configured, a design element specific GUI 170 is generated by the design tool. The GUI 170 helps the user select the proper parameter values for design elements. This may include taking the user through a set of questions, the responses to which then indicate which follow-on questions are asked based on the requirements of the design elements. The design element specific GUI 170 includes one or more editable input mechanisms for specifying parameters of the given design element. The user may specify values for the one or more parameters from the GUI. The tool may also determine if a specified value of a given parameter impacts another parameter of a design element, at 230. If one or more design element parameters change as a result of a change to a given parameter, the GUI displays the new value of the given parameter that changed along with changes to the other parameters.

At 240, the tool automatically configures each given design element based on the property values specified in the corresponding design element specific GUI of the design tool. The automatic configuration may include generating a configuration file that controls the functional coupling and configuration of the given design elements and loading of the configuration file into the memory 125 of the configurable IC 110 and/or target system 115.

Figure 3:
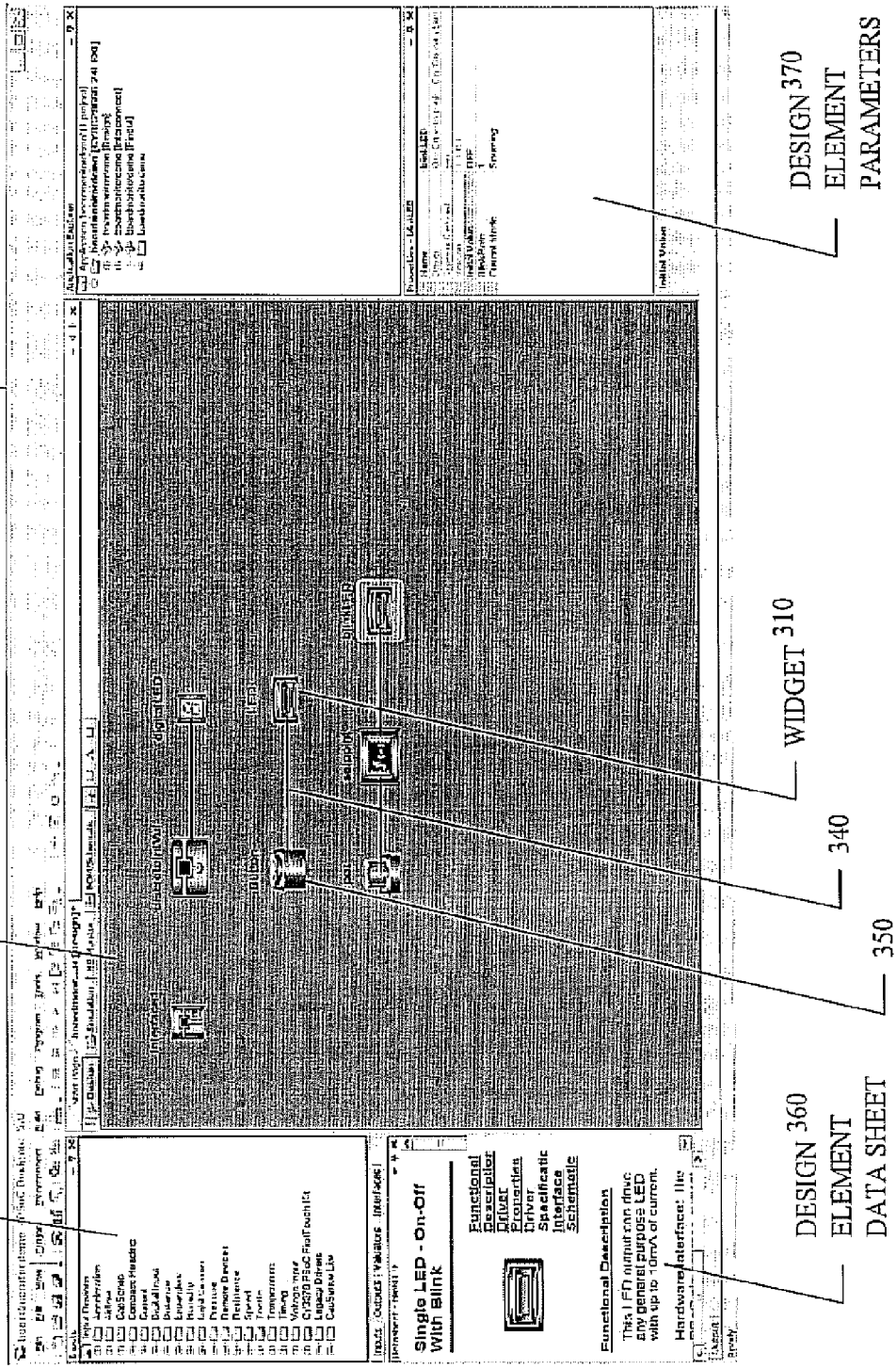
FIG. 3 shows an exemplary graphical user interface (GUI), in accordance with one embodiment of the present technology.

Embodiments of the present technology will be further illustrated with reference to FIGS. 3-4, which show an exemplary GUI, in accordance with one embodiment of the present technology. The GUI is adapted to facilitate customization of programmable ICs using symbolic indications of corresponding design elements. In particular, users are able to create a circuit design by dragging and dropping high level "widget" icons 310 representing design elements within a design window 300. In one implementation, the user may select a design element from a design element catalog portion 320 of the design window. In selecting a design element, the user drags a widget icon 310 from the design element catalog 320 to a design element selection and interconnection portion 330 of the design window. The user may also connect the design elements by linking 340 corresponding widget icons 310, 350 in the design element selection and interconnection portion 330 of the design window 300.

The widget icons 310, 350 may include a graphical representation of the corresponding design element and an information group. The information group of a given widget may display status, value indicators, function transfer indicators, present value indicators, setpoint indicators and/or the like.

In addition, items in the GUI may be displayed with different visual attributes. For example, color, highlighting or the like may be used to organize, associate or differentiate one or more items from one or more other items in the GUI.

The design window may also include a design element data sheet portion 360 for displaying technical data concerning corresponding design elements, a design element parameter portion 370 for displaying parameters and parameter values for corresponding design elements, and or the like.

Figure 4:
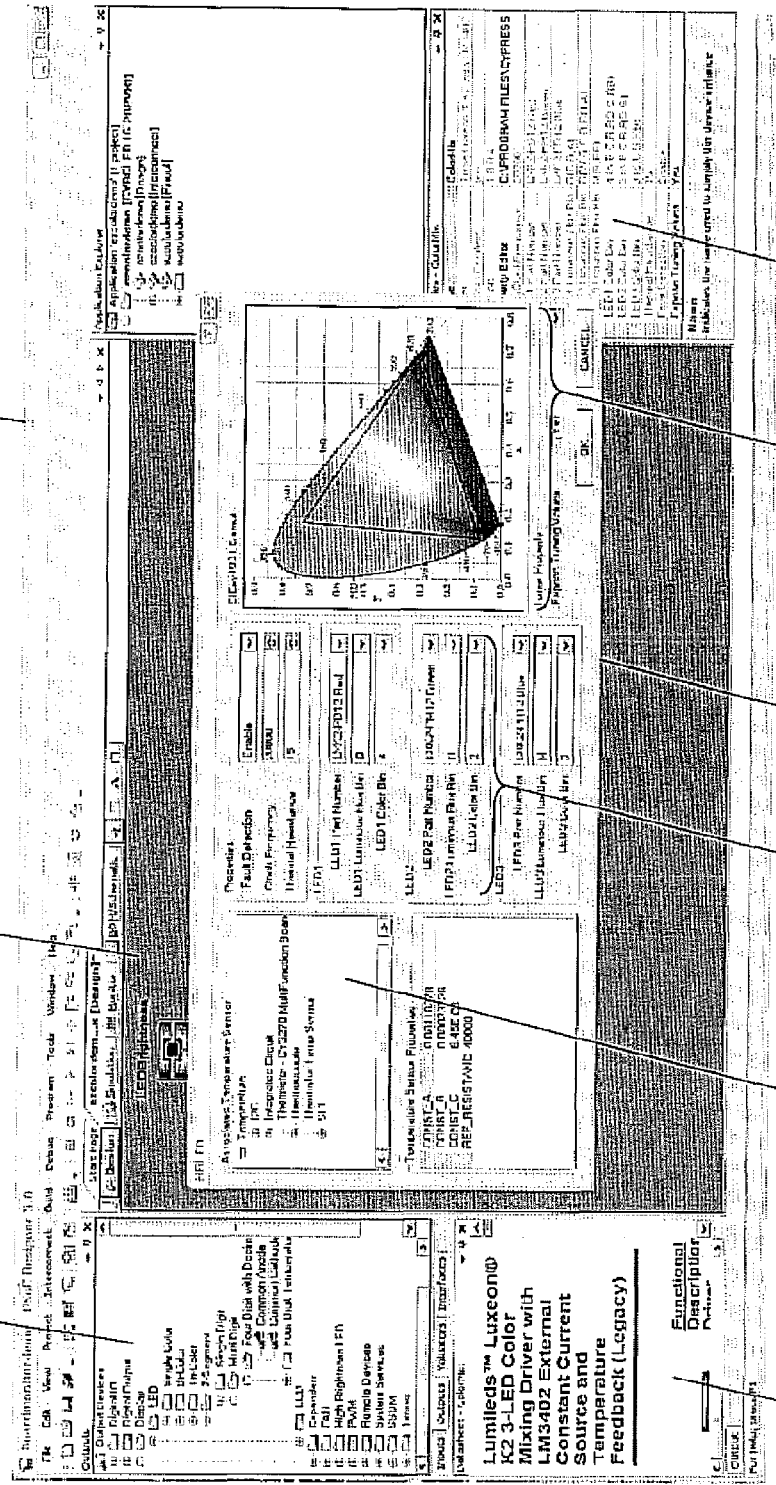
FIG. 4 shows an exemplary GUI, in accordance with one embodiment of the present technology.

If a widget 310 of a design element selected from the design element catalog 320 and placed in the design element selection and interconnect portion 330 of the design window 300 needs to be configured, the design tool presents a design element specific configuration window, as illustrated in FIG. 4. The design element specific configuration window 400 displays one or more parameters of a given design element that needs to be configured prior to run-time operation of the IC and/or target system. The configuration window 400 helps the user select the proper parameter values for design elements. This may include taking the user through a set of questions, the responses to which then indicate which follow-on questions are asked based on the configuration requirements of the design elements. In particular, the design configuration window 400 includes selectable and/or editable alphanumeric fields 410, 420 and/or selectable and/or editable graphical fields 430 for inputting one or more configuration parameter values. Parameter values may be specified by user actions, such as typing a value in an editable alphanumeric field 410, dragging an object in an editable graphical display field 420, and/or the like.

The tool may also determine if the value of a given design element parameter is affected by a change in another parameter of the design element. If the given design element parameter changes as a result of the change to the other parameter, the GUI displays the new value of the given parameters that changed.

As illustrated, the GUI includes a configuration window 400 for a triad high brightness LED specific driver. Such a design element requires custom configuration before it can be utilized. For instance, a circuit driver for the triad high brightness LED needs to be configured based on: 1) the color temperature of the LEDs used according to each manufacturer; 2) the temperature sensor used in the IC; and 3) the brightness of the LEDs selected. The configuration window 400 enables a user to specify a variety of parameters for configuring a driver circuit for operating the triad high brightness LED. A user may type a value of a BIN parameter in an appropriate editable alphanumeric field 410 of the configuration window 400. The user may also select a temperature sensor for operation of the high brightness LED by highlighting a given sensor in an editable alphanumeric field 420. In addition, the user may drag a vertex in a graphical representation of a color spectrum to specify a desired color output (e.g., set the chomaticity of the device). Furthermore, it is appreciated that the temperature and chromaticity for LEDs are related. Therefore, the design element specific configuration window 410 may show the effect of a specified temperature parameter 420 on the chromaticity of the device 430. Typically, the designer of the design element would provide the design element specific GUI for its custom configuration.

The specified parameter values for design elements associated with the high level design elements are then automatically translated and utilized to create lower level user module information which is converted to a configuration file. In particular, the parameter values for design elements are mapped to registers of the programmable IC and/or target device that control the execution of the programmable IC during run-time operation. Parameter values can also be used in generated source code to adjust the behavior of algorithms related to control of the design element by the target device.

Accordingly, users are able to design systems using programmable ICs without manually entering traditional code or reading data sheets. Embodiments generate a GUI that allows a developer to configure design elements of the programmable IC. The GUI advantageously presents design element specific parameters for each design element that needs to be configured prior to run-time. In addition, the GUI advantageously illustrates the effect of changes to one parameter on other related parameters. Thus, the GUI provides a user friendly, intuitive and friendly technique for configuring the design elements of programmable ICs and systems including such ICs.

The foregoing descriptions of specific embodiments of the present technology have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the present technology and its practical application, to thereby enable others skilled in the art to best utilize the present technology and various embodiments with various modifications as are suited to the particular use contemplated. It is intended that the scope of the invention be defined by the Claims appended hereto and their equivalents.

What is claimed is:

1. A system comprising:
    a programmable integrated circuit including a number of function blocks; and
    a host computing device to configure the number of function blocks to perform a number of functions, the host computing device utilizing a graphical user interface to provide specification of configuration parameters of the function blocks, wherein the graphical user interface updates a given configuration parameter if a value of the given configuration parameter is affected by a value specified for another configuration parameter.

2. The system of claim 1 wherein the number of function blocks comprise one or more analog function blocks, one or more digital function blocks, or one or more digital and one or more analog function blocks.

3. The system of claim 1 wherein the graphical user interface comprises a function specific graphical user interface based on a function the host computing device to configure the number of function blocks to perform.

4. The system of claim 1 wherein the number of functions the host computing device configures the number of function blocks to perform comprises a driver circuit for a light emitting element.

5. The system of claim 4 wherein the light emitting element comprises light emitting diodes (LEDs), seven segmented LEDs, triads of high brightness colored LEDs or a liquid crystal display (LCD).

6. The system of claim 4 wherein the configuration parameters comprise one or more of a color temperature of the light emitting element, a brightness of the light emitting element, and a chromaticity of the light emitting element.

7. The system of claim 1 wherein the graphical user interface presents a selectable or editable graphical field for specification of at least one of the configuration parameters.

8. The system of claim 1 wherein the graphical user interface presents a selectable or editable alphanumeric field for specification of at least one of the configuration parameters.

9. A method comprising:
    determining a function to be performed by a number of function blocks in a programmable integrated circuit;

generating a graphical user interface for specifying one or more configuration parameters of the number of function blocks to perform the determined function; and using a processor of a computing device, configuring at least one of the number of function blocks to perform the determined function based on a value of at least one of the one or more configuration parameters specified through the graphical user interface, and updating a given configuration parameter if a value of the given configuration parameter is affected by a value specified for another configuration parameter.

10. The method of claim 9 wherein the number of function blocks comprise one or more analog function blocks, one or more digital function blocks, or one or more digital and one or more analog function blocks.

11. The method of claim 9 wherein the generating a graphical user interface comprises generating a function specific graphical user interface based on a function the processor of the computing device configures the number of function blocks to perform.

12. The method of claim 9 wherein the configuring at least one of the number of function blocks to perform the determined function comprises configuring the number of function blocks to perform as a driver circuit for a light emitting element.

13. The method of claim 12 wherein the light emitting element comprises light emitting diodes (LEDs), seven segmented LEDs, triads of high brightness colored LEDs or a liquid crystal display (LCD).

14. The method of claim 12 wherein the configuration parameters comprise one or more of a color temperature of the light emitting element, a brightness of the light emitting element, and a chromaticity of the light emitting element.

15. The method of claim 9 wherein generating the graphical user interface comprises presenting a display window including a selectable or editable graphical field for specification of at least one of the configuration parameters.

16. The method of claim 9 wherein generating the graphical user interface comprises presenting a display window including a selectable or editable alphanumeric field for specification of at least one of the configuration parameters.

17. A method of configuring a target system comprising:
determining a function to be performed by a number of function blocks of a programmable integrated circuit in the target system to be configured;
generating a graphical user interface for specifying one or more configuration parameters of the number of function blocks to perform the determined function; and
configuring the target system to perform the determined function based on a value of at least one of the one or more configuration parameters specified through the graphical user interface,
wherein the generating a graphical user interface comprises presenting a design window including a representation of the determined function, and presenting a configuration window including the one or more configuration parameters of the number of function blocks in an editable format.

18. The method of claim 17 wherein the number of function blocks comprise one or more analog function blocks, one or more digital function blocks, or one or more digital and one or more analog function blocks.

19. The method of claim 17 wherein the configuring the target system to perform the determined function comprises configuring the number of function blocks to perform as a driver circuit for a light emitting element.

20. The method of claim 19 wherein the light emitting element comprises light emitting diodes (LEDs), seven segmented LEDs, triads of high brightness colored LEDs or a liquid crystal display (LCD).

* * * * *